(12) United States Patent
Lee et al.

(10) Patent No.: US 9,496,381 B2
(45) Date of Patent: Nov. 15, 2016

(54) SEMICONDUCTOR DEVICE AND METHOD OF FABRICATING THE SAME

(71) Applicant: Samsung Electronics Co., Ltd., Suwon-Si, Gyeonggi-Do (KR)

(72) Inventors: Mongsup Lee, Seoul (KR); Yoonho Son, Yongin-si (KR); Woogwan Shim, Yongin-si (KR); Chan Min Lee, Hwaseong-si (KR); Inseak Hwang, Suwon-si (KR)

(73) Assignee: SAMSUNG ELECTTONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/716,402

(22) Filed: Dec. 17, 2012

(65) Prior Publication Data
US 2013/0240959 A1  Sep. 19, 2013

(30) Foreign Application Priority Data
Mar. 15, 2012  (KR) ......................... 10-2012-0026751

(51) Int. Cl.
*H01L 29/78* (2006.01)
*H01L 27/108* (2006.01)

(52) U.S. Cl.
CPC ......... *H01L 29/78* (2013.01); *H01L 27/10876* (2013.01); *H01L 27/10885* (2013.01); *H01L 27/10888* (2013.01)

(58) Field of Classification Search
CPC ............. H01L 29/78; H01L 27/10876; H01L 27/10885; H01L 27/10888
USPC ................. 257/E21.659, E27.084, E27.091, 257/E21.646, 296, 330, 288, 302, E29.262, 257/E21.657; 438/270
See application file for complete search history.

(56) References Cited

U.S. PATENT DOCUMENTS

| | | | |
|---|---|---|---|
| 6,258,678 B1 | 7/2001 | Liaw | |
| 6,479,853 B2 * | 11/2002 | Chishiki | 257/306 |
| 6,548,362 B1 | 4/2003 | Wu | |
| 6,852,581 B2 | 2/2005 | Chun et al. | |
| 6,911,740 B2 | 6/2005 | Chun et al. | |
| 7,139,184 B2 * | 11/2006 | Schloesser | 365/53 |
| 7,319,062 B2 | 1/2008 | Hong | |
| 7,745,296 B2 | 6/2010 | van Meer et al. | |
| 7,902,082 B2 | 3/2011 | Park et al. | |
| 7,928,504 B2 * | 4/2011 | Choi | 257/326 |
| 8,048,737 B2 * | 11/2011 | Kim et al. | 438/253 |
| 8,093,125 B2 | 1/2012 | Kim | |
| 8,119,485 B2 | 2/2012 | Kim | |

(Continued)

FOREIGN PATENT DOCUMENTS

| JP | 11-238795 A | 8/1999 |
|---|---|---|
| JP | 2008-078439 A | 4/2008 |

(Continued)

*Primary Examiner* — Latanya N Crawford
(74) *Attorney, Agent, or Firm* — Harness, Dickey & Pierce, P.L.C.

(57) ABSTRACT

A semiconductor device may include a substrate including an active pattern delimited by a device isolation pattern, a gate electrode crossing the active pattern, a first impurity region and a second impurity region in the active pattern on both sides of the gate electrode, a bit line crossing the gate electrode, a first contact electrically connecting the first impurity region with the bit line, and a first nitride pattern on a lower side surface of the first contact. A width of the first contact measured perpendicular to an extending direction of the bit line may be substantially equal to that of the bit line.

26 Claims, 52 Drawing Sheets

(56) References Cited

U.S. PATENT DOCUMENTS

| | | | |
|---|---|---|---|
| 8,309,449 B2* | 11/2012 | Jeong et al. | 438/589 |
| 8,378,497 B2* | 2/2013 | Kim et al. | 257/774 |
| 8,659,111 B2* | 2/2014 | Kim et al. | 257/499 |
| 2001/0015046 A1 | 8/2001 | Hong | |
| 2002/0125522 A1* | 9/2002 | Chishiki | 257/306 |
| 2003/0075734 A1 | 4/2003 | Chun et al. | |
| 2004/0207099 A1 | 10/2004 | Chun et al. | |
| 2006/0281270 A1 | 12/2006 | Meer et al. | |
| 2007/0267676 A1* | 11/2007 | Kim et al. | 257/311 |
| 2008/0102578 A1* | 5/2008 | Schlosser | 438/243 |
| 2008/0206947 A1 | 8/2008 | Suzuki | |
| 2009/0020808 A1* | 1/2009 | Yu | 257/330 |
| 2009/0081840 A1 | 3/2009 | Park et al. | |
| 2010/0085800 A1 | 4/2010 | Yeom | |
| 2010/0193901 A1 | 8/2010 | Jang et al. | |
| 2010/0200948 A1* | 8/2010 | Kim | 257/520 |
| 2010/0221875 A1 | 9/2010 | Kim et al. | |
| 2010/0240180 A1* | 9/2010 | Jeon et al. | 438/239 |
| 2010/0270602 A1* | 10/2010 | Choi | 257/296 |
| 2010/0327346 A1* | 12/2010 | Jeong et al. | 257/332 |
| 2011/0003459 A1 | 1/2011 | Shin et al. | |
| 2011/0024811 A1* | 2/2011 | Kim | 257/296 |
| 2011/0037111 A1* | 2/2011 | Kim et al. | 257/302 |
| 2011/0070716 A1 | 3/2011 | Kim | |
| 2011/0086503 A1 | 4/2011 | Lim et al. | |
| 2011/0092060 A1* | 4/2011 | Lee et al. | 438/586 |
| 2011/0101450 A1 | 5/2011 | Kim | |
| 2011/0169066 A1* | 7/2011 | Moon et al. | 257/306 |
| 2011/0256678 A1* | 10/2011 | Kim | 438/239 |
| 2011/0260238 A1* | 10/2011 | Kim | H01L 27/10888 257/330 |
| 2012/0012912 A1* | 1/2012 | Kwon | 257/302 |
| 2012/0132970 A1 | 5/2012 | Park et al. | 257/296 |
| 2012/0153456 A1* | 6/2012 | Kim et al. | 257/734 |
| 2012/0153481 A1* | 6/2012 | Ahn | H01L 23/485 257/751 |
| 2012/0211830 A1* | 8/2012 | Yoo | 257/334 |
| 2012/0217576 A1* | 8/2012 | Yeo | 257/330 |
| 2012/0228702 A1* | 9/2012 | Wu | 257/330 |
| 2012/0267712 A1* | 10/2012 | Yu | 257/331 |
| 2013/0049091 A1* | 2/2013 | Saino | 257/310 |

FOREIGN PATENT DOCUMENTS

| | | |
|---|---|---|
| JP | 2008-544487 A | 12/2008 |
| JP | 2009-076857 A | 4/2009 |
| JP | 2009-158677 A | 7/2009 |
| KR | 2002-0011473 A | 2/2002 |
| KR | 10-0416607 B1 | 4/2003 |
| KR | 10-0511002 B1 | 8/2005 |
| KR | 2008-0025128 A | 3/2008 |
| KR | 2009-0031216 A | 3/2009 |
| KR | 2011-0016214 A | 2/2011 |
| KR | 10-1090371 B1 | 12/2011 |

* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0026751, filed on Mar. 15, 2012, in the Korean Intellectual Property Office, the entire contents of which are hereby incorporated by reference.

BACKGROUND

1. Field

Some example embodiments of the inventive concepts relate to a semiconductor device and/or a method of fabricating the same, and in particular, to a dynamic random access memory and/or a method of fabricating the same.

2. Description of the Related Art

Due to their small-size, multifunctionality, and/or low-cost characteristics, semiconductor devices are considered important elements in the electronic industry. The semiconductor devices can be generally classified into a memory device for storing data, a logic device for processing data, and a hybrid device capable of performing various memory storage and data processing functions simultaneously.

Higher integration of semiconductor devices is required to satisfy consumer demands for electronic devices with a faster speed. However, owing to a decreasing process margin in a photolithography process, it is becoming harder to realize highly-integrated semiconductor devices. To overcome such a limitation, there have been recently a variety of studies on new technology for increasing an integration density of the semiconductor device.

SUMMARY

Some example embodiments of the inventive concepts provide a semiconductor device with increased integration density. Other example embodiments of the inventive concepts provide a method of fabricating the semiconductor device.

According to an example embodiment of the inventive concepts, a semiconductor device includes a substrate including an active pattern delimited by a device isolation pattern, a gate electrode crossing the active pattern, a first impurity region and a second impurity region in the active pattern on both sides of the gate electrode, a bit line crossing the gate electrode, a first contact electrically connecting the first impurity region with the bit line, and a first nitride pattern on a lower side surface of the first contact. The first contact measured perpendicular to an extending direction of the bit line has a substantially equal width to that of the bit line.

In an example embodiment, a portion of the first impurity region and a portion of the device isolation pattern adjacent thereto may be recessed to define a recess region, and the recess region may have a bottom surface lower than a top surface of the substrate. In an example embodiment, the first contact may include a portion partially filling the recess region, and the first nitride pattern may fill a remaining space of the recess region that is not occupied by the first contact.

In an example embodiment, at least one second contact may be electrically connected to the second impurity region, and the at least one second contact may be electrically isolated from the first contact and the first impurity region by the first nitride pattern. In an example embodiment, the at least one second contact may be a plurality of second contacts, and the device may further include an interlayer insulating pattern on the bit line to electrically separate the plurality of second contacts from each other, and a second nitride pattern on the bit line.

In an example embodiment, an etch stop pattern may be between the bit line and the substrate. In an example embodiment, the first impurity region may include a first recess having a first depth from an upper surface of the substrate, the second impurity region may include a second recess having a second depth from an upper surface of the substrate, and the first depth may be greater than the second depth.

According to another example embodiment of the inventive concepts, a method of fabricating a semiconductor device includes forming a gate electrode extending parallel to a first direction in a substrate, the substrate including an active pattern delimited by a device isolation pattern, forming a first impurity region and a second impurity region in portions of the active pattern on both sides of the gate electrode, forming a preliminary first contact on the gate electrode and the first and second impurity regions, the preliminary first contact being connected to the first impurity region, forming a conductive layer on the preliminary first contact, forming a bit line and a first contact by etching the conductive layer and the preliminary first contact along a second direction, and forming a nitride pattern on a lower side surface of the first contact.

In another example embodiment, forming the preliminary first contact includes forming a first interlayer insulating layer on the substrate with the first and second impurity regions, etching the first interlayer insulating layer to form a first contact hole exposing portions of the first impurity region and the device isolation pattern adjacent thereto, etching the exposed portions of the first impurity region and the device isolation pattern to form a recess connected to the first contact hole, and filling the first contact hole with a conductive material.

In another example embodiment, forming the bit line and the first contact may include forming a mask on the conductive layer, etching the conductive layer using the mask to form the bit line, and etching the preliminary first contact using the mask and the bit line to form the first contact.

In another example embodiment, forming the nitride pattern may include forming a nitride layer on side surfaces of the first contact and the bit line to fill the recess, and etching the nitride layer by a wet etching process to form a nitride pattern in the recess.

In another example embodiment, etching the nitride layer may include using an etching solution including at least one of a phosphoric acid, a sulfuric acid, a hydrofluoric acid, and dilute solutions thereof at a temperature of about 100° C. to about 250° C.

In another example embodiment, forming the nitride pattern may include forming a nitride layer to fill the recess and conformally cover exposed surfaces of the first contact, the bit line, and the substrate, forming a second interlayer insulating layer on the nitride layer, etching the second interlayer insulating layer to form a second contact hole exposing the second impurity region, and etching the nitride layer on side surfaces of the first contact and the bit line to form the nitride pattern including portions localized on the bit line and in the recess.

In another example embodiment, forming the second interlayer insulating layer may include forming a preliminary layer on the nitride layer, the preliminary layer containing silazane, and oxidizing the preliminary layer in a wet annealing process.

In another example embodiment, the method may further include forming an etch stop layer on the substrate with the first and second impurity regions after forming the first impurity region and the second impurity region.

In another example embodiment, the method may further include forming a second interlayer insulating layer to cover the bit line, etching the second interlayer insulating layer to form a second contact hole exposing the second impurity region, and filling the second contact hole with a conductive material to form a second contact.

According to another example embodiment of the inventive concepts, a semiconductor device includes a first impurity region on one side of a gate electrode and a second impurity region on another side of the gate electrode, a bit line crossing the gate electrode, a first contact electrically connecting the first impurity region with the bit line, a first nitride pattern on a lower side surface of the first contact, and at least one second contact electrically connected to the second impurity region, the at least one second contact being electrically isolated from the first contact and the first impurity region by the first nitride pattern.

In another example embodiment, the at least one second contact may be a plurality of second contacts, and the device may further include an interlayer insulating pattern on the bit line to electrically separate the plurality of second contacts from each other, and a second nitride pattern on the bit line.

In another example embodiment, the device may further include a substrate including an active pattern delimited by a device isolation pattern, and the gate electrode may cross the active pattern.

In another example embodiment, the first impurity region may include a first recess having a first depth from an upper surface of the substrate, the second impurity region may include a second recess having a second depth from an upper surface of the substrate, and the first depth may be greater than the second depth.

In another example embodiment the device may further include an etch stop pattern between the bit line and the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A through 12A are plan views illustrating a method of fabricating a semiconductor device according to an example embodiment of the inventive concepts.

FIGS. 4B through 12B are sectional views taken along lines A-A' of FIGS. 4A through 12A, respectively.

FIGS. 4C through 10C are sectional views taken along lines B-B' of FIGS. 4A through 10A, respectively.

FIGS. 13A through 15A are plan views illustrating a method of fabricating a semiconductor device according to another example embodiment of the inventive concepts.

FIGS. 13B through 15B are sectional views taken along lines A-A' of FIGS. 13A through 15A, respectively.

FIGS. 16A through 20A are plan views illustrating a method of fabricating a semiconductor device according to another example embodiment of the inventive concepts.

FIGS. 16B through 20B are sectional views taken along lines A-A' of FIGS. 16A through 20A, respectively.

FIGS. 16C through 19C are sectional views taken along lines B-B' of FIGS. 16A through 19A, respectively.

Figure 1A:
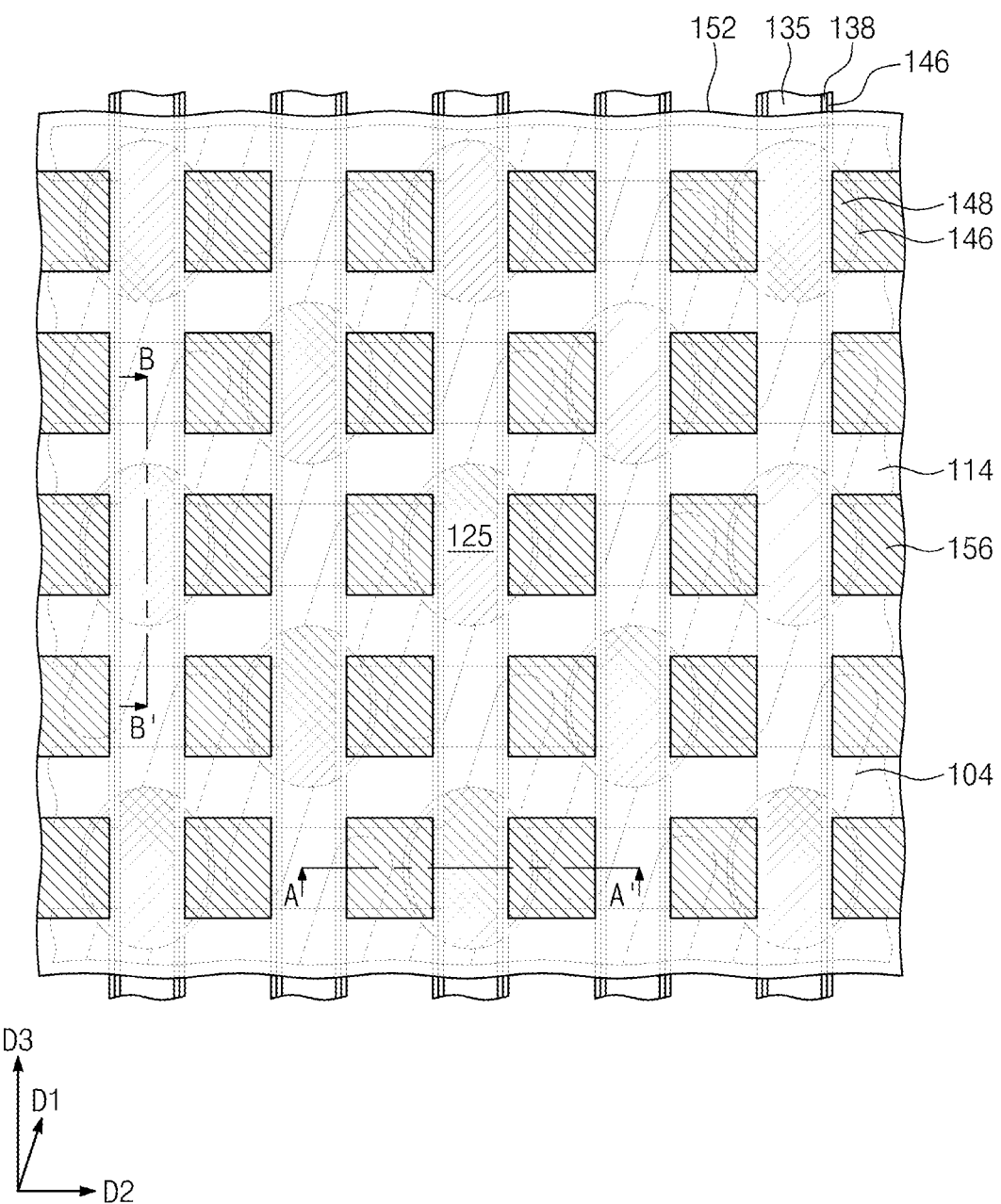
FIGS. 1A through 1D are plan and sectional views illustrating a semiconductor device according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
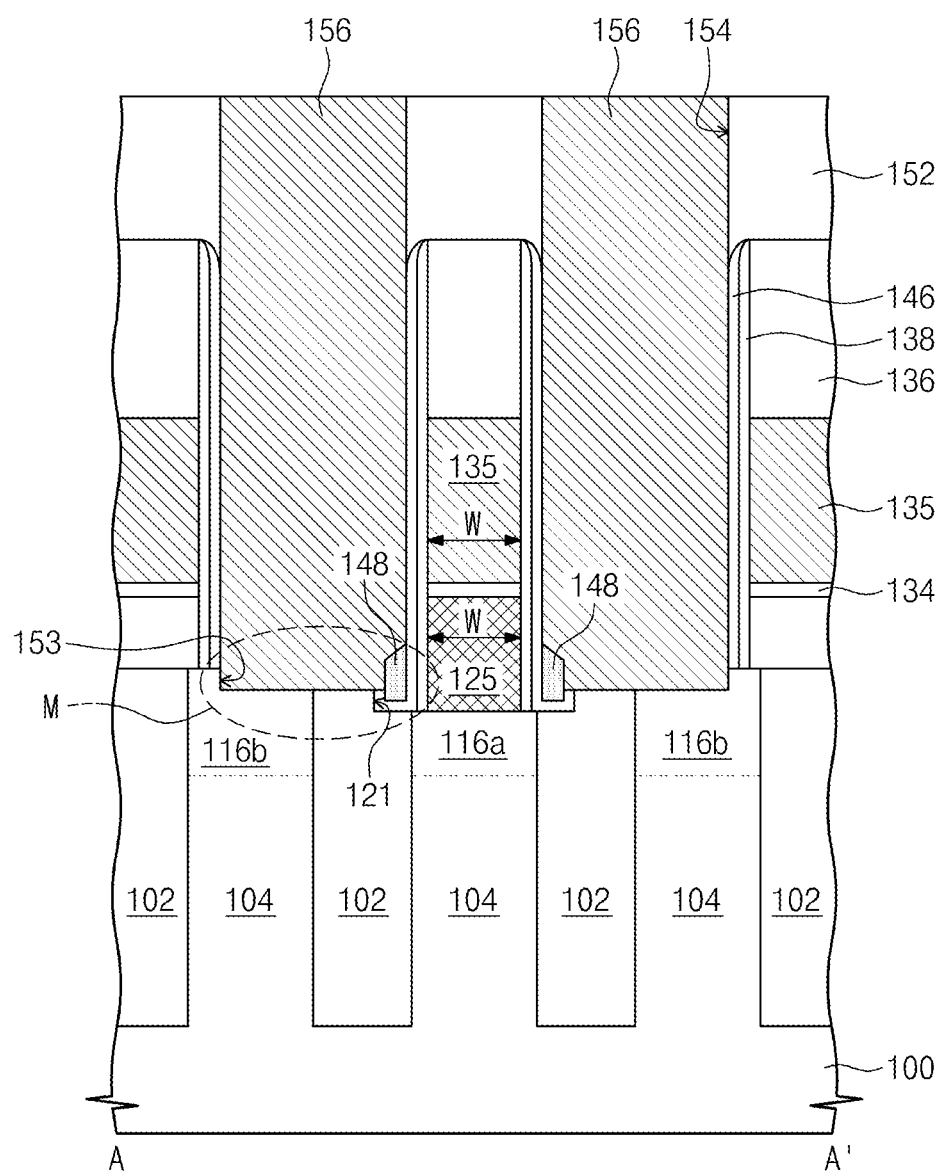
Figure 1C:
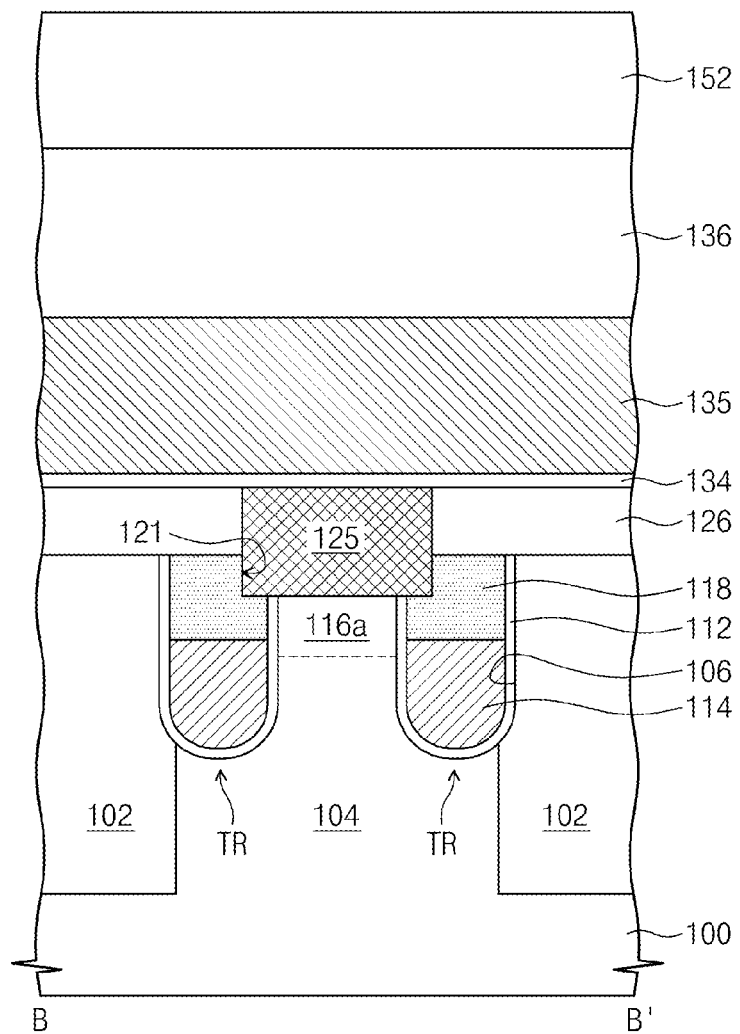
Figure 1D:
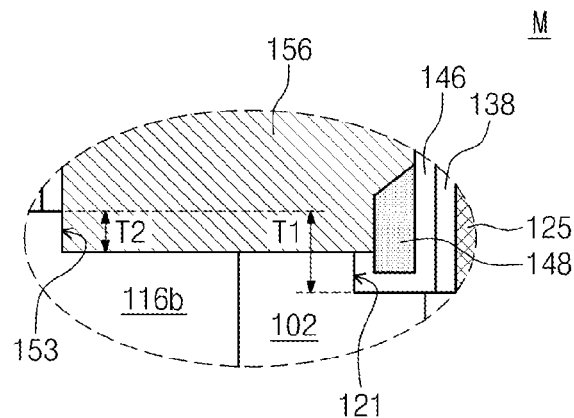
Figure 2A:
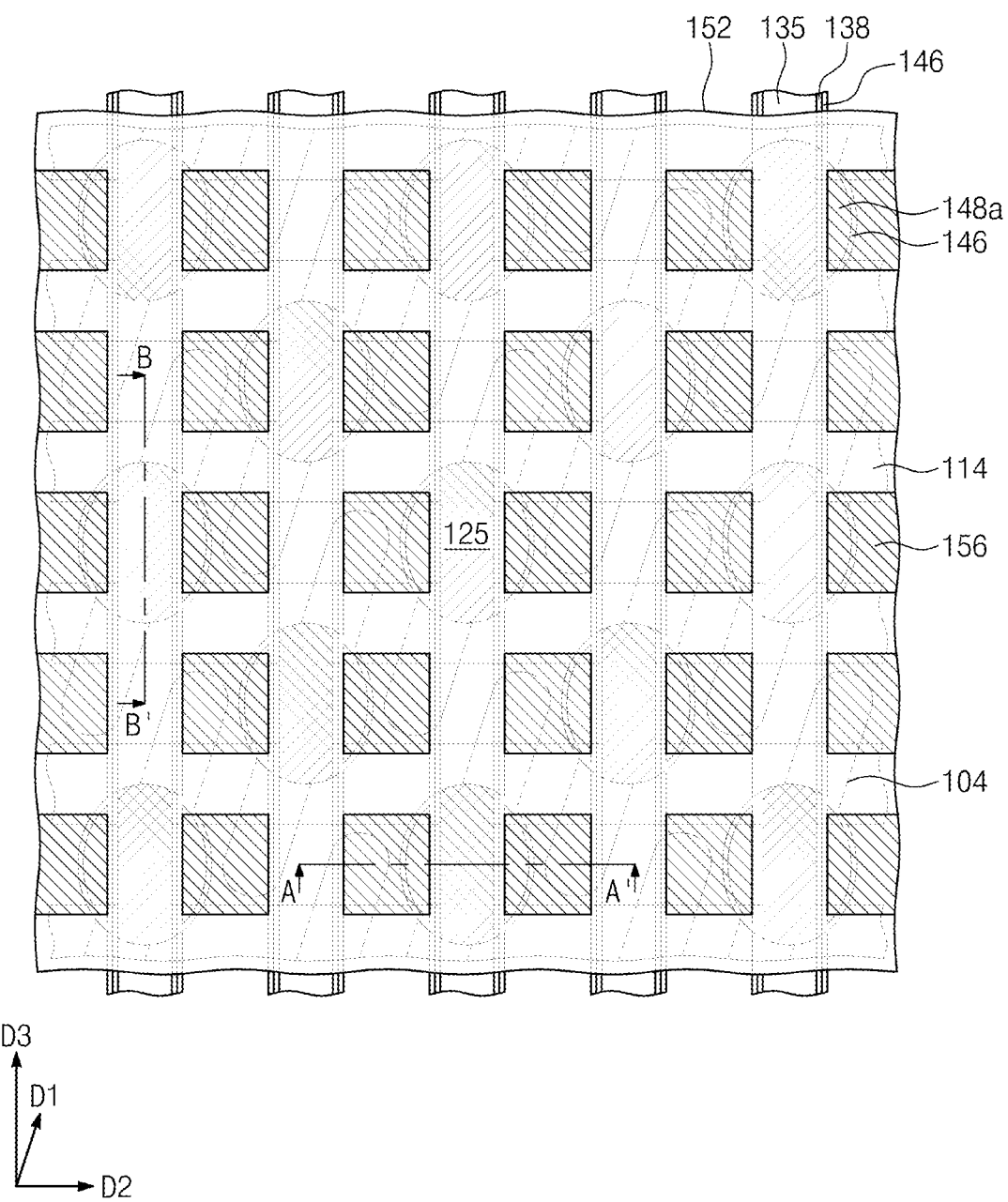
FIGS. 2A through 2D are plan and sectional views illustrating a semiconductor device according to another example embodiment of the inventive concepts.
Figure 2B:
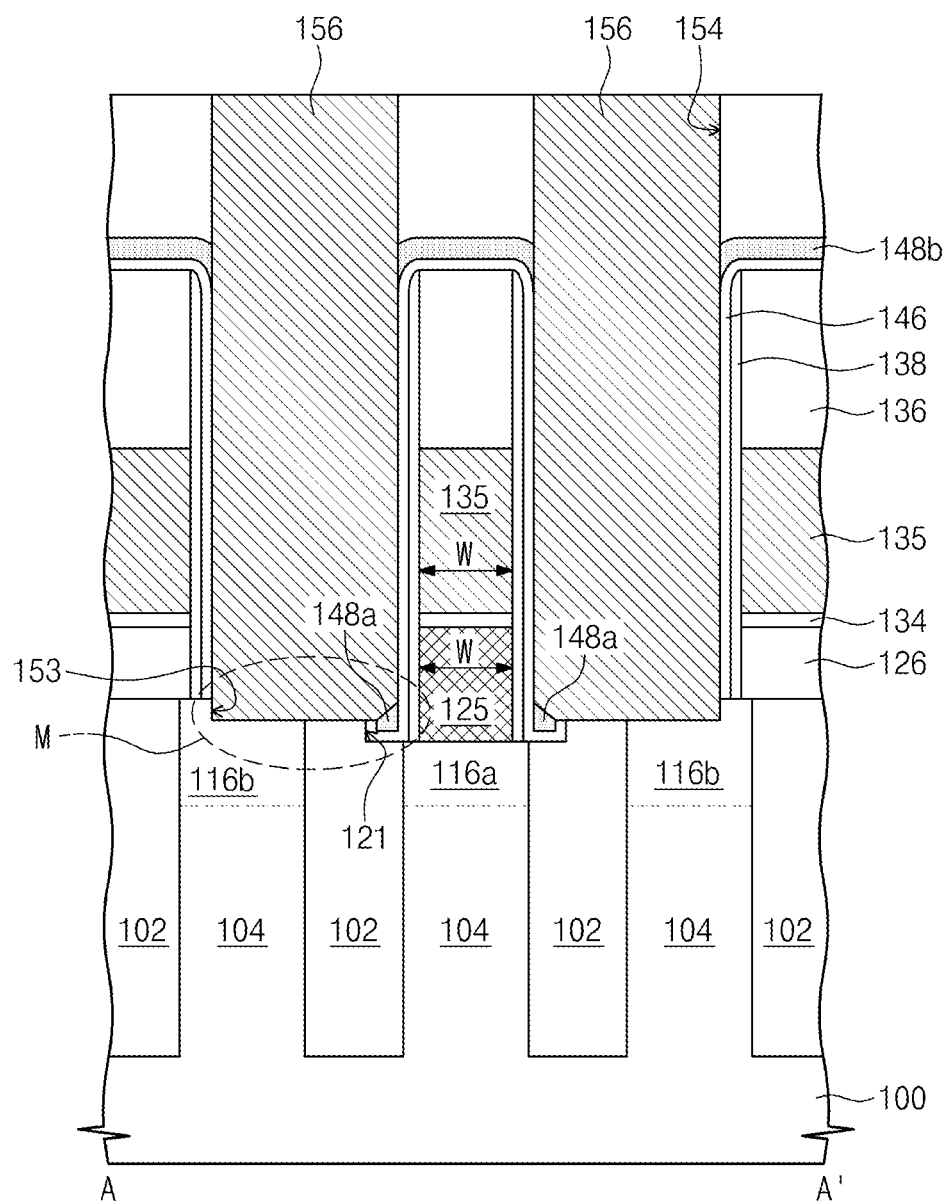
Figure 2C:
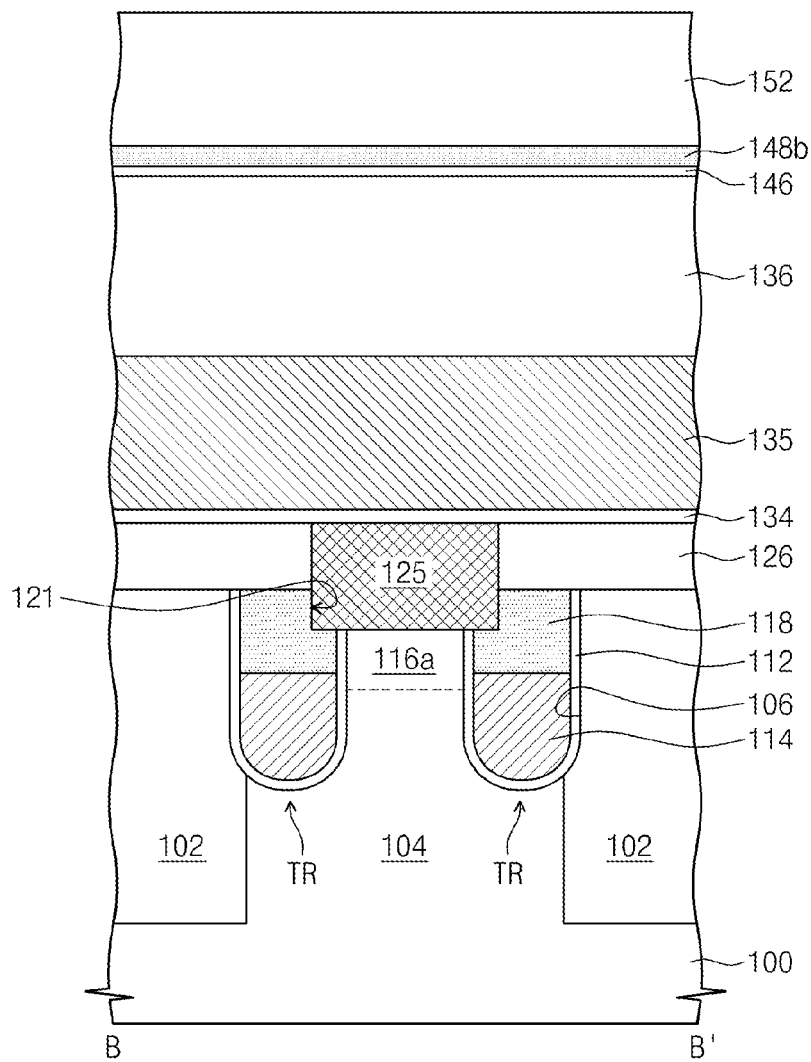
Figure 2D:
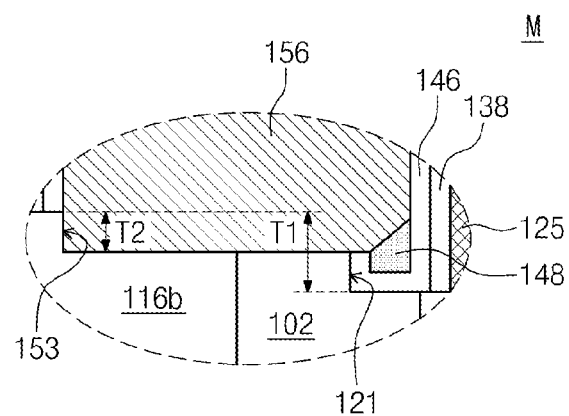
Figure 3A:
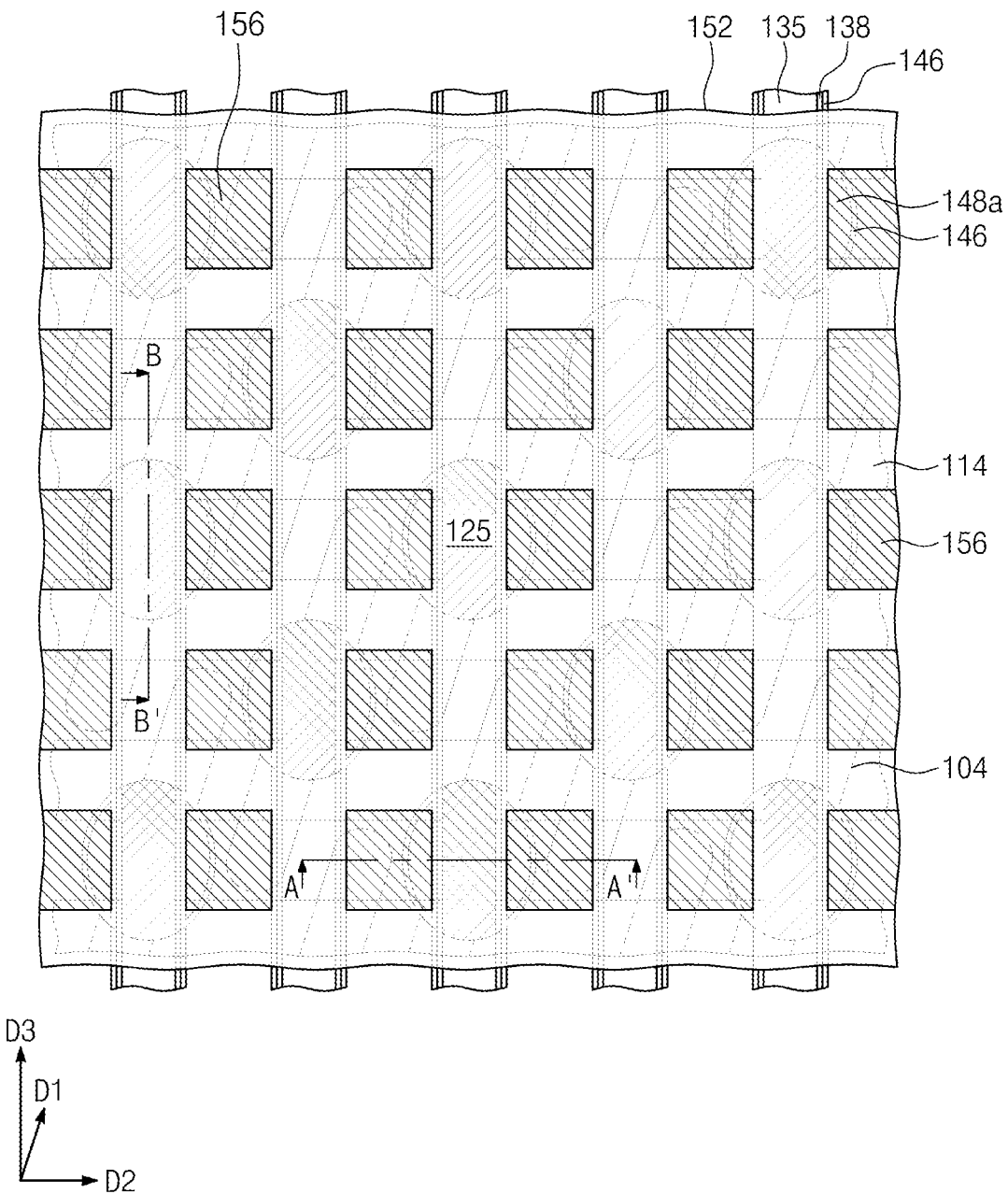
FIGS. 3A through 3D are plan and sectional views illustrating a semiconductor device according to another example embodiment of the inventive concepts.
Figure 3B:
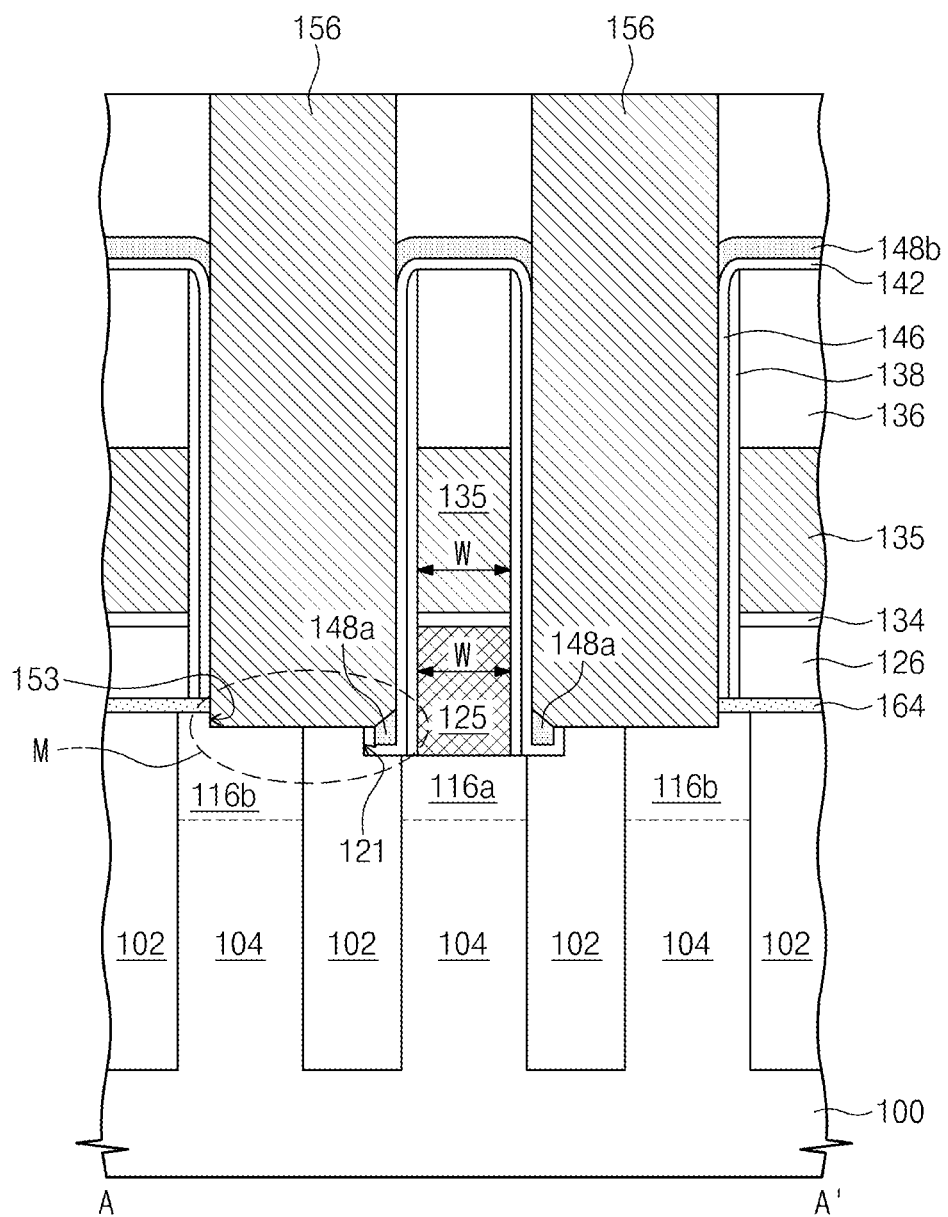
Figure 3C:
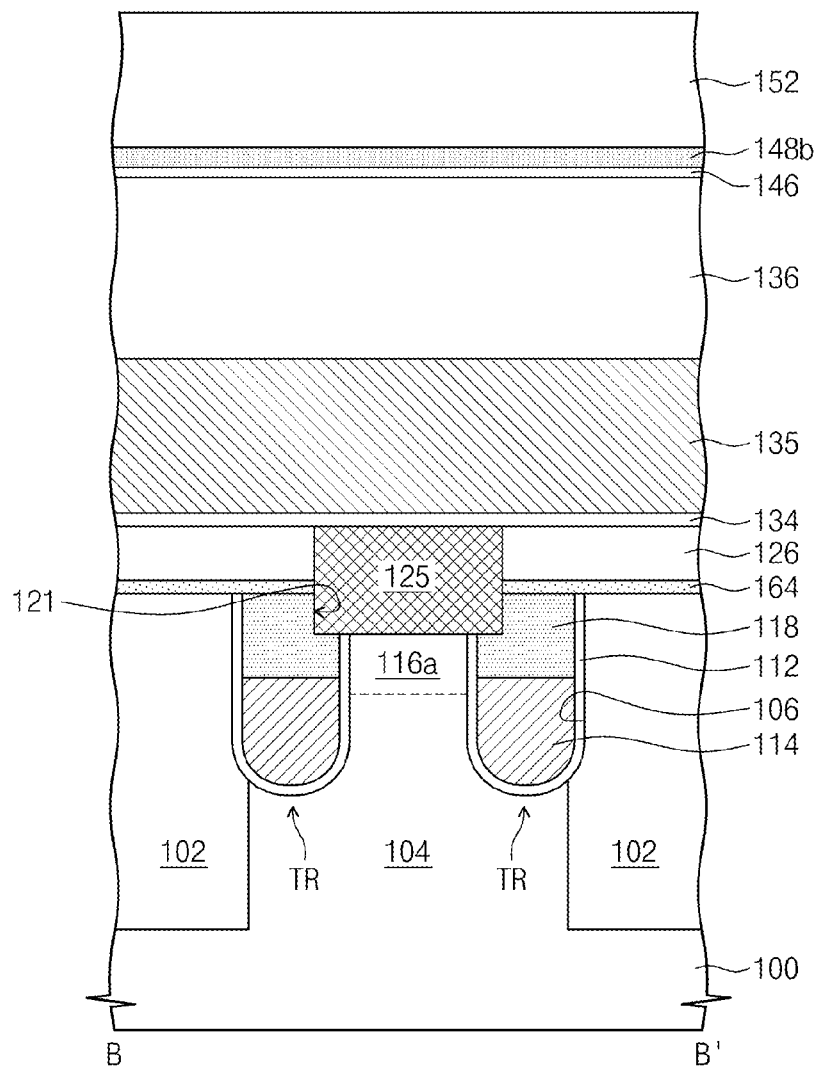
Figure 3D:
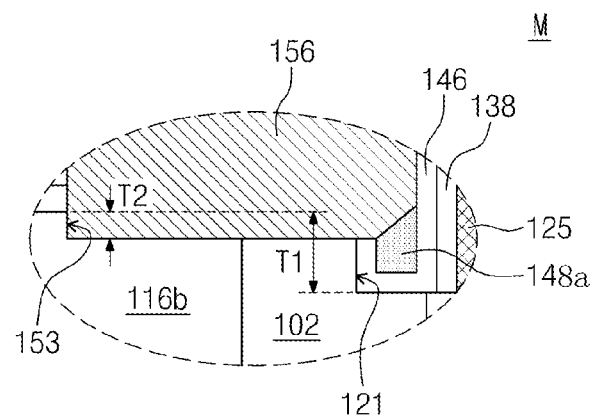

FIG. 1A is a plan view illustrating a semiconductor device according to an example embodiment of the inventive concepts, FIG. 1B is a sectional view taken along line A-A' of FIG. 1A, FIG. 1C is a sectional view taken along line B-B' of FIG. 1A, and FIG. 1D is an enlarged view of a portion M of FIG. 1B. FIG. 2A is a plan view illustrating a semiconductor device according to another example embodiment of the inventive concepts, FIG. 2B is a sectional view taken along line A-A' of FIG. 2A, FIG. 2C is a sectional view taken along line B-B' of FIG. 2A, and FIG. 2D is an enlarged view of a portion M of FIG. 2B. FIG. 3A is a plan view illustrating a semiconductor device according to another example embodiment of the inventive concepts, FIG. 3B is a sectional view taken along line A-A' of FIG. 3A, FIG. 3C is a sectional view taken along line B-B' of FIG. 3A, and FIG. 3D is an enlarged view of a portion M of FIG. 3B.

Referring to FIGS. 1A through 1D, 2A through 2D, and 3A through 3D, a semiconductor device may include a transistor TR, a first contact 125, a second contact 156, and a bit line 135, which are provided on a substrate 100.

The substrate 100 may include a device isolation pattern 102 and active patterns 104 delimited by the device isolation pattern 102. In example embodiments, the active patterns 104 may be provided to have a longitudinal axis parallel to a first direction D1. The active patterns 104 may be disposed spaced apart from each other in the first direction D1. In addition, the active patterns 104 may be disposed spaced apart from each other in a second direction D2, which may not be parallel to the first direction D1. For all that, example embodiments of the inventive concepts may not be limited to the structure and arrangement of the active patterns 104 described with reference to FIGS. 1A, 2A, and 3A.

The substrate 100 may include a first recess 121. In example embodiments, the first recess 121 may be formed at a central region of each active pattern 104 and extend laterally to be partially overlapped with the device isolation pattern 102 adjacent to the active patterns 104. As shown in FIGS. 1A, 2A, and 3A, the first recess 121 may be formed to have an elliptical shape having a longitudinal axis oriented parallel to a third direction D3, which may not be parallel to the extending direction of the active patterns 104 (or the first direction D1). For example, the third direction D3 may be perpendicular to the second direction D2. As shown in FIGS. 1D through 3D, the first recess 121 may be recessed to have a first depth T1 from a top surface of the substrate 100. In other words, there may be a height difference between the top surface of the substrate 100 and a bottom surface of the first recess 121.

According to an example embodiment of the inventive concepts, the substrate 100 may include a plurality of the first recesses 121, which may be arranged spaced apart from each other in both of the second and third directions D2 and D3. The recesses 121 may be provided to form a zigzag arrangement.

Referring to FIGS. 1B through 3B, the substrate 100 may include a second recess 153. In example embodiments, the second recess 153 may be formed at an edge region of the active pattern 104 and extend laterally to be partially overlapped with the device isolation pattern 102 adjacent to the active pattern 104. In addition, as shown in FIGS. 1D through 3D, the second recess 153 may be recessed to have a second depth T2 from a top surface of the substrate 100. The second depth T2 may be smaller than the first depth T1.

According to an example embodiment of the inventive concepts, the first recess 121 and the second recess 153 may be connected to each other, and there is a difference in height between the first and second recesses 121 and 153.

Referring to FIGS. 1C, 2C, and 3C, the transistor TR may include a gate insulating layer 112, a gate electrode 114, a first impurity region 116a, and a second impurity region 116b. The gate electrode 114 may be provided in a trench 106, which may be formed in the substrate 100 to have a vertically recessed shape. The trench 106 may extend along the second direction D2. In example embodiments, the trench 106 may be formed to have a depth greater than the first depth.

The gate insulating layer 112 may be provided to cover an inner surface of the trench 106. The gate electrode 114 may be provided to fill a lower portion of the trench 106. The gate electrode 114 may extend along the second direction D2.

The transistor TR may further include a first mask 118 provided on the gate electrode 114 to fill an upper portion of the trench 106. In example embodiments, the first recess 121 may extend toward the first mask 118. In other embodiments, the first mask 118 may be partially recessed by the first recess 121. For example, as shown in FIGS. 1C, 2C, and 3C, a portion of the first mask 118 adjacent to the first impurity region 116a may be recessed by the first recess 121.

The first and second impurity regions 116a and 116b may be provided in the active patterns 104, respectively, located at both sides of the gate electrode 114. In example embodiments, the first impurity region 116a may be provided in the central region of the active pattern 104, while the second impurity region 116b may be provided in the edge region of the active pattern 104. In example embodiments, the first impurity region 116a may have a top surface lower than the top surface of the substrate 100, due to the presence of the first recess 121.

Referring to FIGS. 1A through 3A and 1B through 3B, the first contact 125 may be provided in the first recess 121 to be in contact with the first impurity region 116a. According to an example embodiment of the inventive concepts, as shown in FIGS. 1B through 3B, a width of the first contact 125 is less than that of the first recess 121 in a vertical section taken along the second direction D2. By contrast, as shown in FIGS. 1C through 3C, a width of the first contact 125 is substantially equal to that of the first recess 121 in a vertical section taken along the third direction D3.

In example embodiments, as shown in FIGS. 1B through 3B, a nitride pattern 148 or 148a may be provided in a remaining space of the first recess 121 that is not occupied by the first contact 125. The nitride pattern 148 or 148a may be formed to fill at least partially the first recess 121. The nitride pattern 148 or 148a may have a top surface, which may be lower than that of the first contact 125 and have a curved or sloped profile. A height of the nitride pattern 148 or 148a may decrease with an increasing distance from the first contact 125.

In example embodiments, a plurality of first contacts 125 may be provided on the substrate 100. Each of the first contacts 125 may be provided on the corresponding one of the first recesses 121. In other words, the first contacts 125 may be disposed to have the same arrangement as that of the first recesses 121. For example, the plurality of the first contacts 125 may be arranged spaced apart from each other in both of the second and third directions D2 and D3. In example embodiments, the first contacts 125 may be provided to form a zigzag arrangement.

The first contact 125 may be electrically connected to the bit line 135. The bit line 135 may extend along the third direction D3. In the case where the first contact 125 includes a polysilicon layer and the bit line 135 includes a metal layer, a metal barrier pattern 134 may be further provided between the first contact 125 and the bit line 135. In addition, the semiconductor device may further include a second mask 136 provided on the bit line 135. The second mask 136 may extend substantially parallel to the bit line 135 (for example, along the third direction D3). In example embodiments, in a vertical section taken along the second direction D2, the first contact 125, the metal barrier pattern 134, the bit line 135, and the second mask 136 may have the substantially same width W.

A spacer may be provided on sidewalls of the first contact 125, the metal barrier pattern 134, the bit line 135, and the second mask 136. The spacer may have a multilayered structure. For example, the spacer may include a first spacer 138, which may be disposed adjacent to the sidewalls of the first contact 125, the metal barrier pattern 134, the bit line 135, and the second mask 136 and include a nitride layer, and a second spacer 146 disposed on the first spacer 138. According to an example embodiment of the inventive concepts, the second spacer 146 may include a portion extending toward top surfaces of the first active pattern 104 and the device isolation pattern 102 and surrounding a lower portion of the nitride pattern 148 or 148a.

The second contact 156 may be disposed in contact with the second impurity region 116b. The second contact 156 may be provided between adjacent ones of the bit lines 135 and be electrically separated from the bit line 135 by the spacers 138 and 146. In addition, the second contact 156 may be electrically separated from the first impurity region 116a by the nitride pattern 148 or 148a. Although not shown, the second contact 156 may be electrically connected to a capacitor.

As described above, the nitride pattern 148 or 148a may be disposed in a space that is delimited by the spacer 138 and 146, the device isolation pattern 102, and the second contact 156. Due to the presence of the nitride pattern 148 or 148a, the second contact 156 can be electrically isolated from the first impurity region 116a, thereby enabling improvement in the refresh characteristics of the semiconductor device. Furthermore, since the nitride pattern 148 or 148a is provided in a localized bottom region between the first and second contacts 125 and 156, it is possible to reduce a parasitic capacitance between the first and second contacts 125 and 156, which may be enhanced by the nitride pattern 148 or 148a.

According to another example embodiment of the inventive concepts depicted in FIGS. 2A through 2C, an additional nitride pattern (hereinafter, referred to a "second nitride pattern", 148b) may be further provided on the second mask 136. The second nitride pattern 148b will be explained in more detail with reference to the following description on a method of fabricating a semiconductor device.

Referring to FIGS. 3A through 3C, an etch stop pattern 164 may be further provided between the bit line 135 and the substrate 100. The etch stop pattern 164 may include a nitride layer, and a description on the etch stop pattern 164 will be provided in detail below.

FIGS. 4A through 12A are plan views illustrating a method of fabricating a semiconductor device according to an example embodiment of the inventive concepts. FIGS. 4B through 12B are sectional views taken along lines A-A' of FIGS. 4A through 12A, respectively, and FIGS. 4C through 10C are sectional views taken along lines B-B' of FIGS. 4A through 10A, respectively.

Figure 4A:
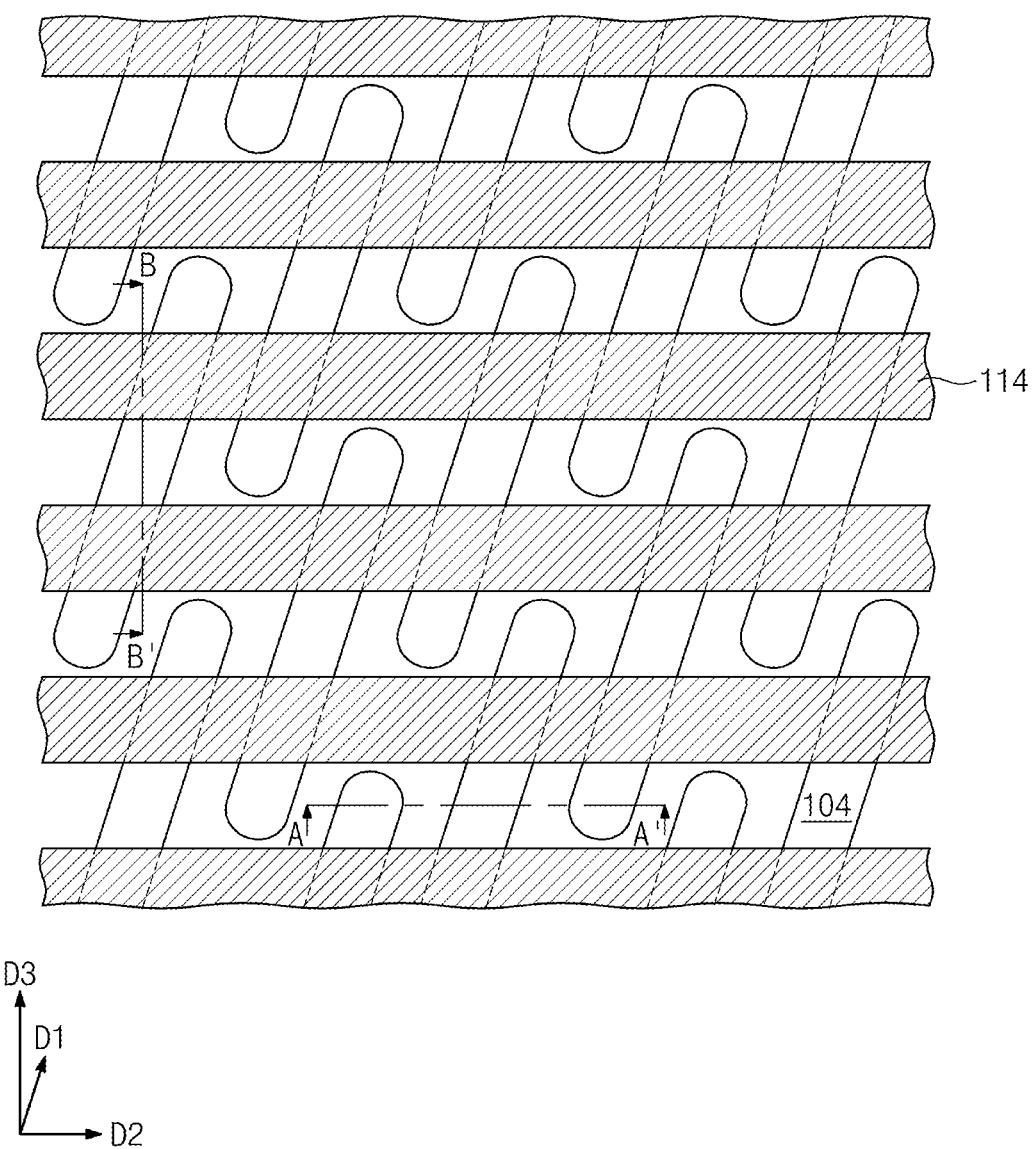
Figure 4B:
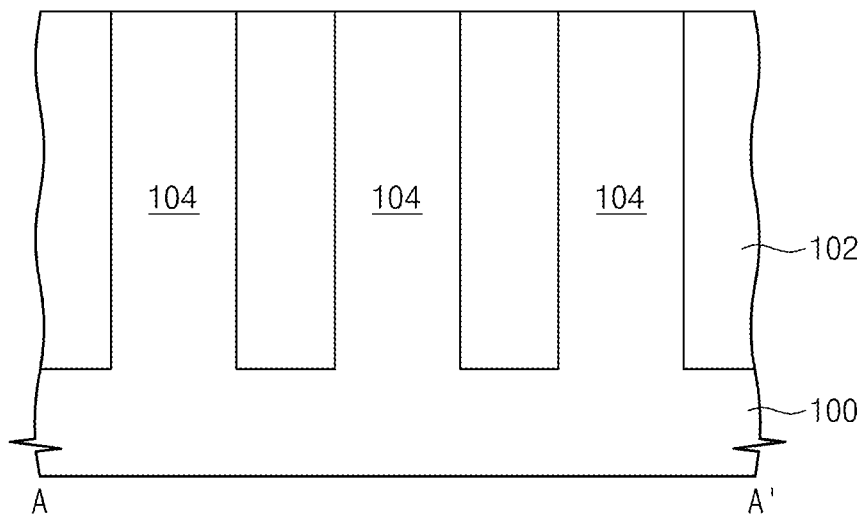
Figure 4C:
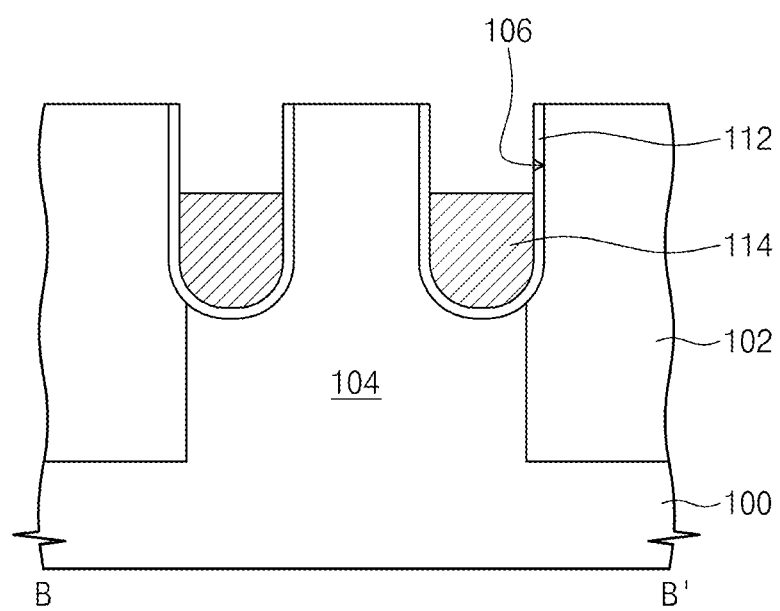

Referring to FIGS. 4A through 4C, the gate insulating layer 112 and the gate electrode 114 may be formed on the active patterns 104 of the substrate 100 delimited by the device isolation pattern 102.

The formation of the device isolation pattern 102 may include etching the substrate 100 and filling the etched portion in the substrate 100 with an insulating material. The device isolation pattern 102 may include at least one selected from the group consisting of oxide, nitride and oxynitride. The device isolation pattern 102 may be formed to have a multi-layered structure. The device isolation pattern 102 may be formed in such a way that the active patterns 104 extend along the first direction D1.

The trench 106 may be formed in the substrate 100 provided with the device isolation pattern 102 and the active patterns 104. The trench 106 may extend along the second direction D2, which may not be parallel to the first direction D1.

The gate insulating layer 112 may be formed to cover the inner surface of the trench 106. Here, the gate insulating layer 112 may be formed not to fill the trench 106 completely. The gate electrode 114 may be formed to fill a lower portion of the trench 106, which is not occupied by the gate insulating layer 112. In example embodiments, the gate electrode 114 may be formed not to fill the trench 106 completely.

Figure 5A:
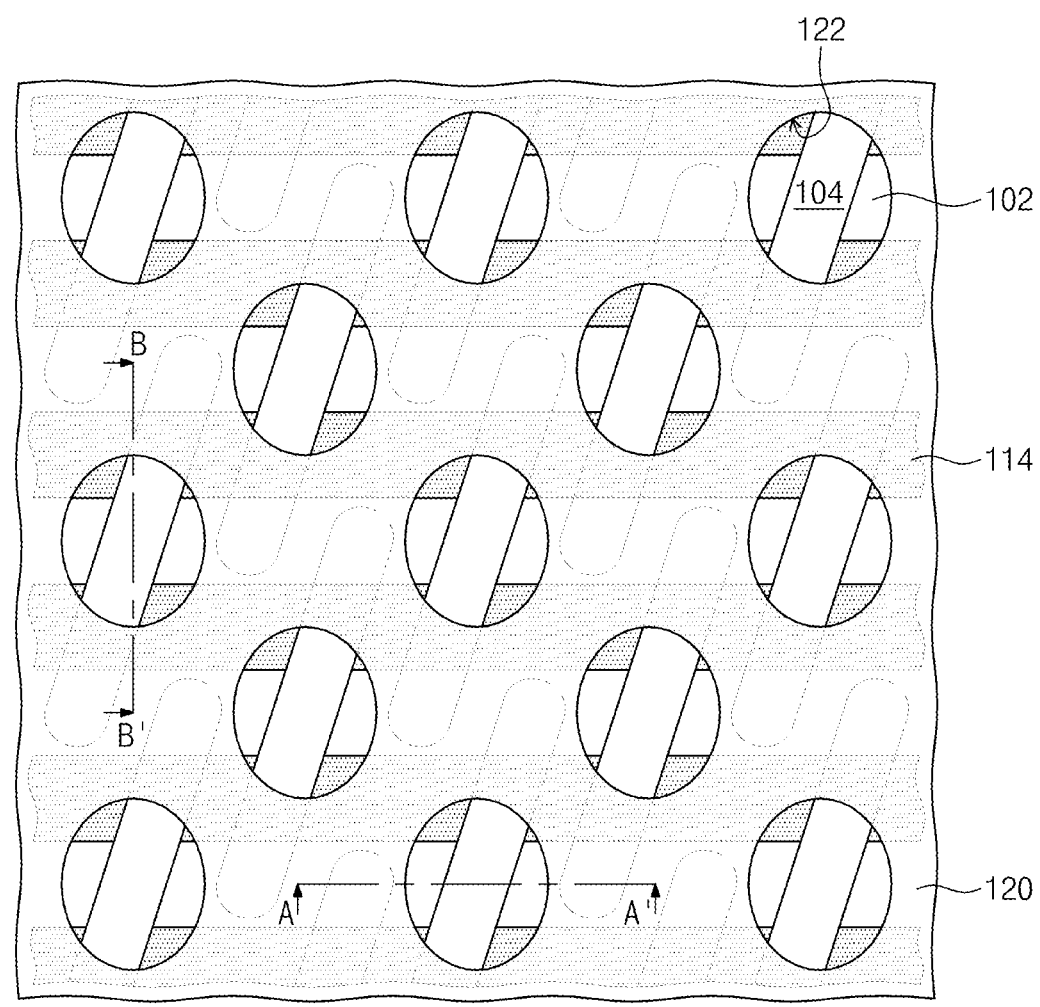
Figure 5B:
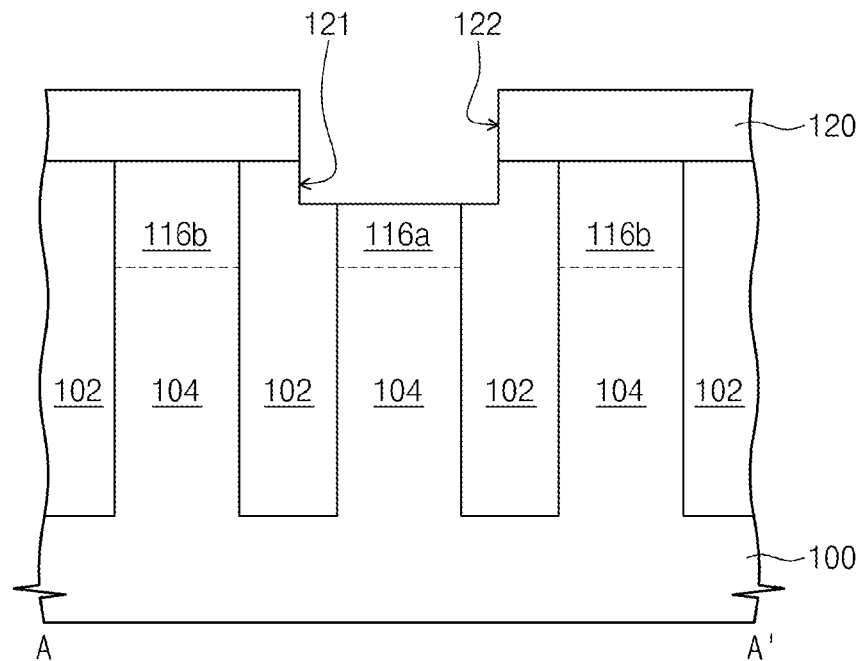
Figure 5C:
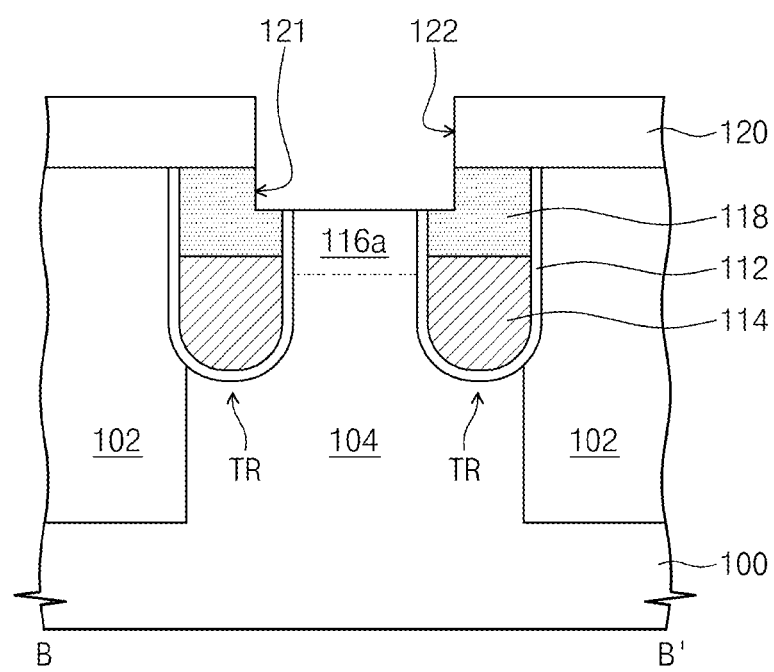

Referring to FIGS. 5A through 5C, the first mask 118 may be formed to fill the unoccupied space of the trench 106 completely. The active patterns 104 adjacent to the first mask 118 may be doped to form the first impurity region 116a and the second impurity region 116b. The first and second impurity regions 116a and 116b may be formed to have a sufficiently high depth, such that they can have bottom surfaces adjacent to a top surface of the gate electrode 114. Accordingly, the transistor TR including the gate insulating layer 112, the gate electrode 114, the first mask 118, and the first and second impurity regions 116a and 116b can be completed. The transistor TR may have a structure called a buried channel array transistor with a channel region provided in the substrate 100.

A first interlayer insulating layer 120 may be formed on the substrate 100 provided with the transistor TR. The first interlayer insulating layer 120 may be etched to form a first contact hole 122 exposing the first impurity region 116a. The first contact hole 122 may be formed to expose partially the device isolation pattern 102 and the first mask 118 adjacent to the first impurity region 116a, in addition to the first impurity region 116a.

In example embodiments, the etching of the first interlayer insulating layer 120 may be performed in such a way that top surfaces of the first impurity region 116a, the device isolation pattern 102, and the first mask 118 may be over-etched to form the first recess 121. The first recess 121 may be connected to the first contact hole 122. Top surfaces of the first impurity region 116a, the device isolation pattern 102, and the first mask 118 exposed by the first recess 121 and the first contact hole 122 may be lower than the top surface of the substrate 100. As shown in FIG. 5A, the first recess 121 may be formed to have an elliptical shape having a longitudinal axis oriented parallel to the third direction D3 or perpendicular to the second direction D2.

Figure 6A:
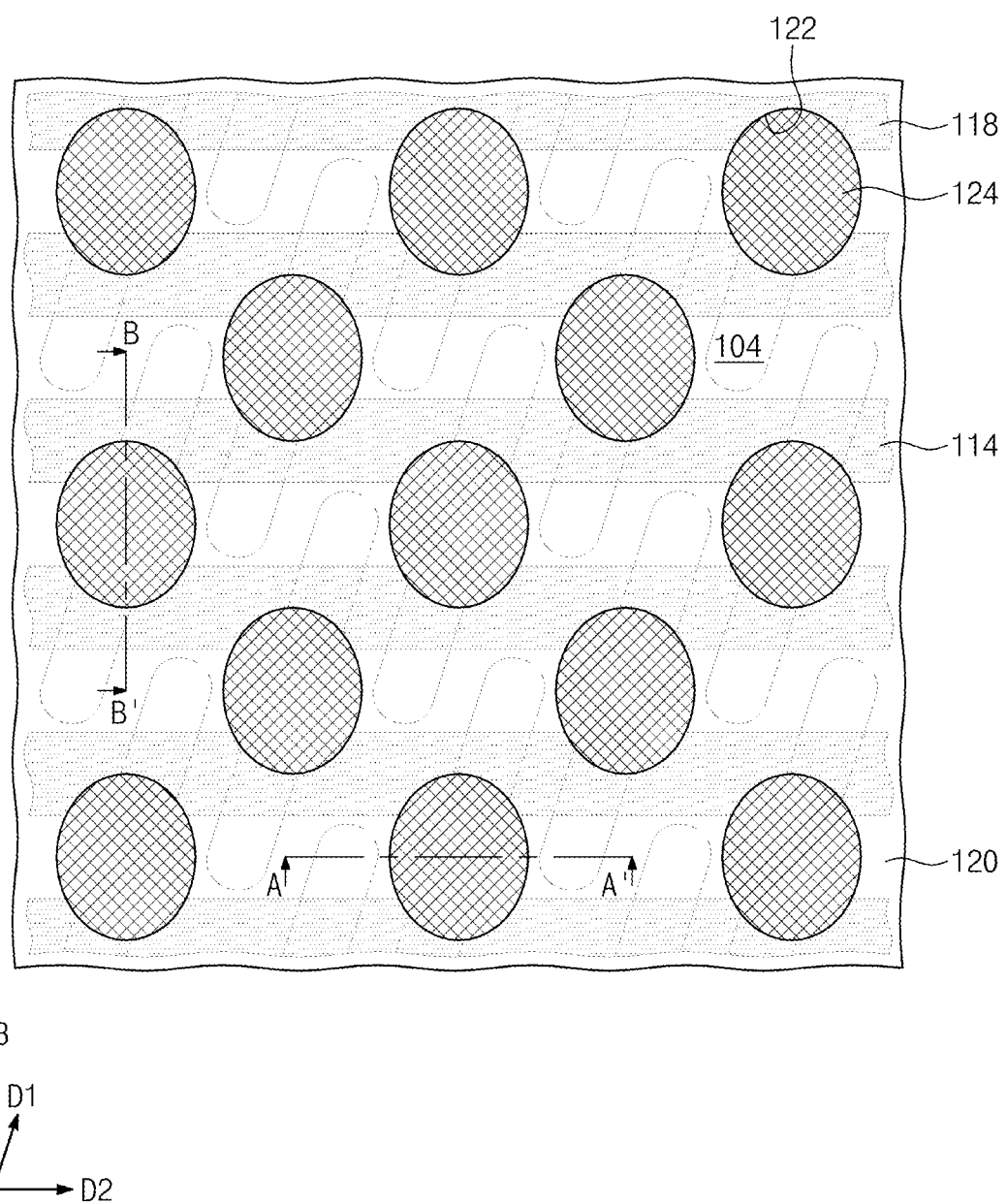
Figure 6B:
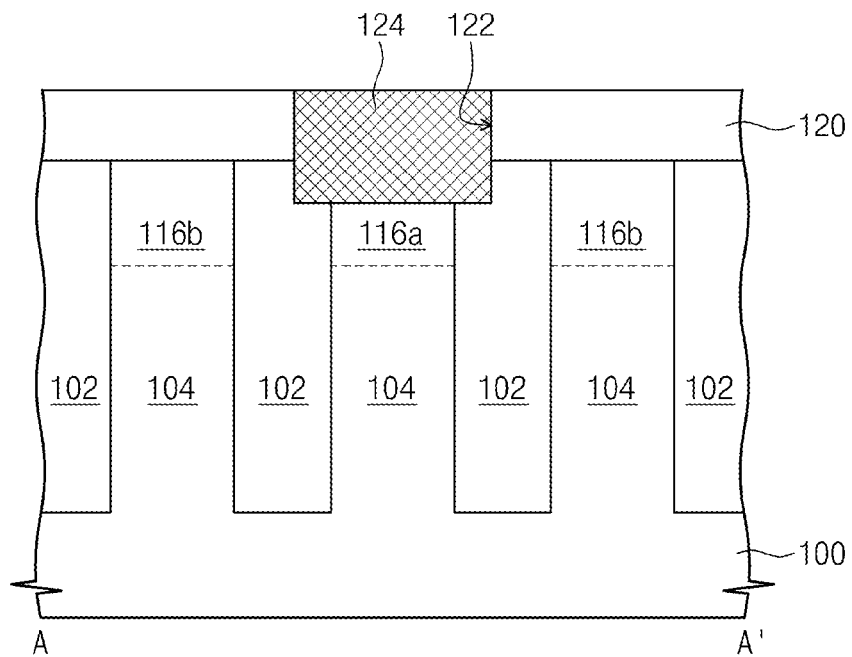
Figure 6C:
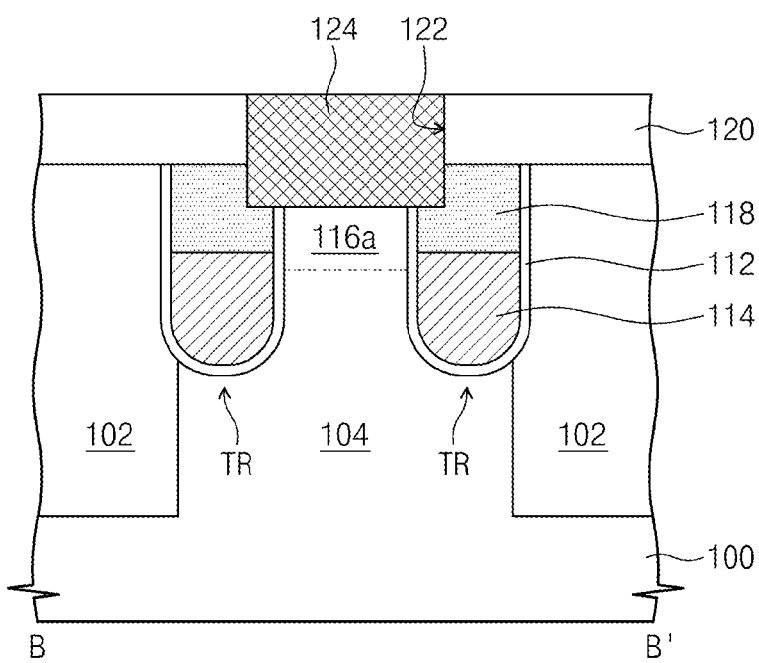

Referring to FIGS. 6A through 6C, a preliminary first contact 124 may be formed to fill the first contact hole 122 and the first recess 121. The preliminary first contact 124 may include a conductive material, for example, a polysilicon layer.

Figure 7A:
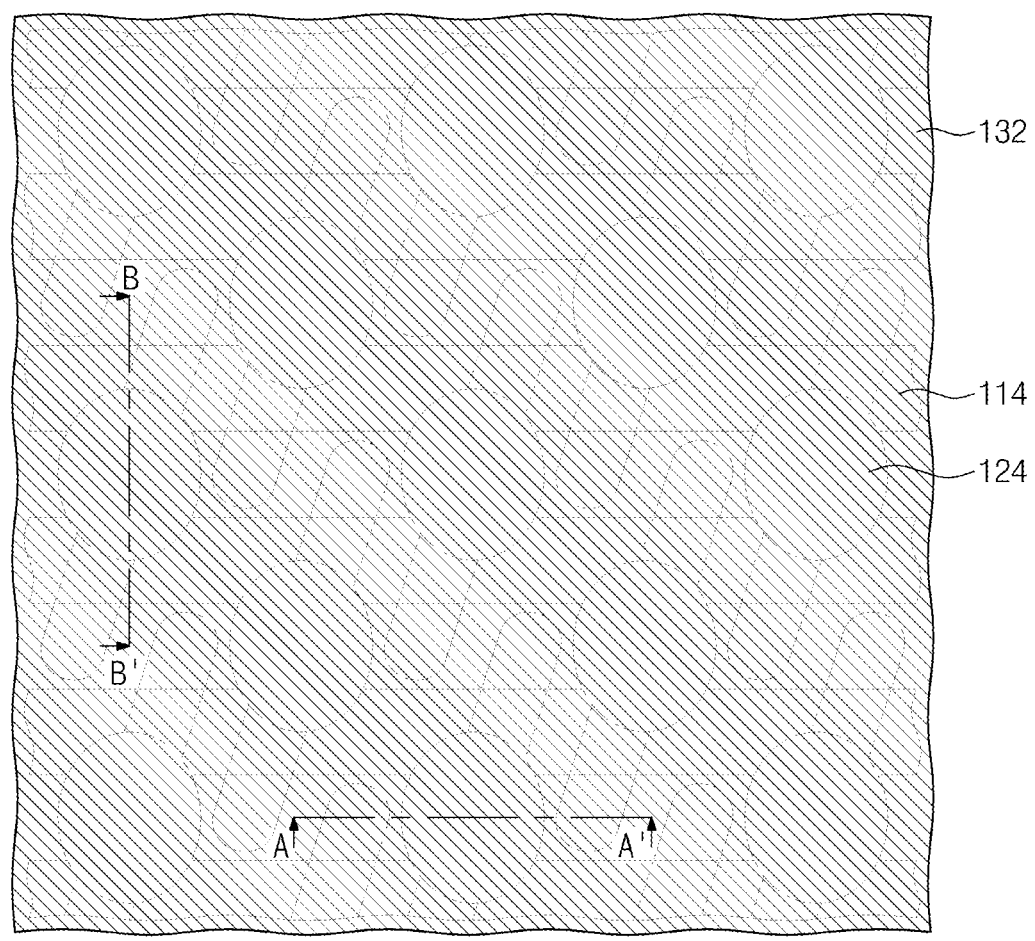
Figure 7B:
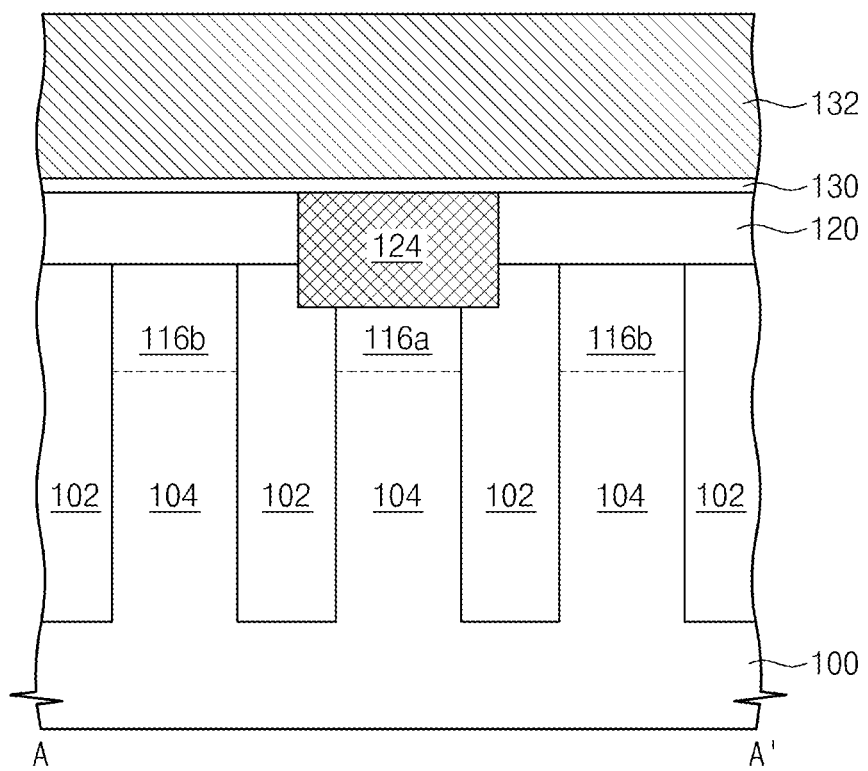
Figure 7C:
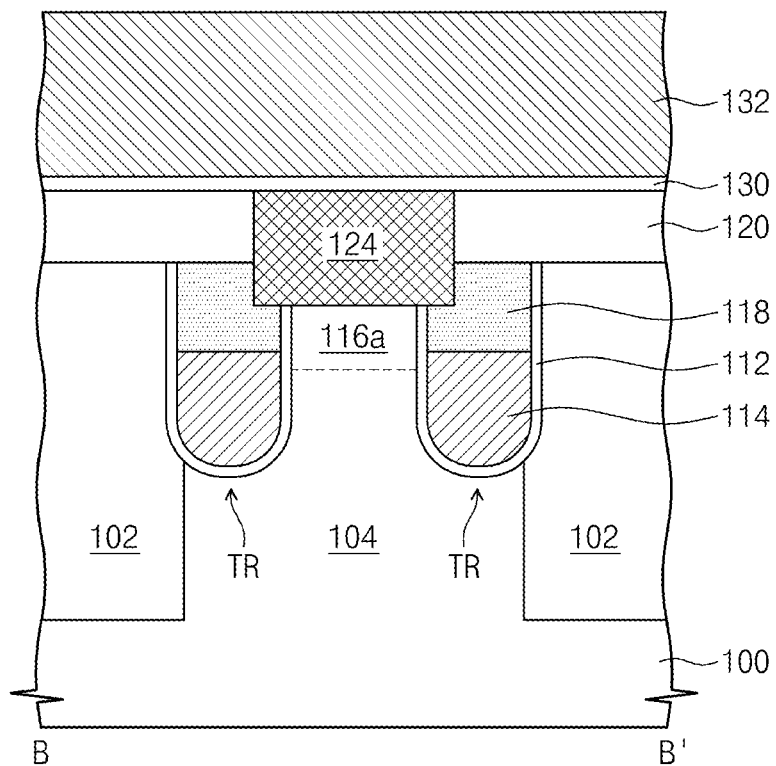

Referring to FIGS. 7A through 7C, a metal barrier layer 130 and a conductive layer 132 may be formed on the first interlayer insulating layer 120. The conductive layer 132 may include a metal layer (e.g., of tungsten) or a metal nitride layer (e.g., of tungsten nitride or titanium nitride).

The metal barrier layer 130 may prevent or reduce metal elements in the conductive layer 132 from being diffused into the preliminary first contact 124.

Figure 8A:
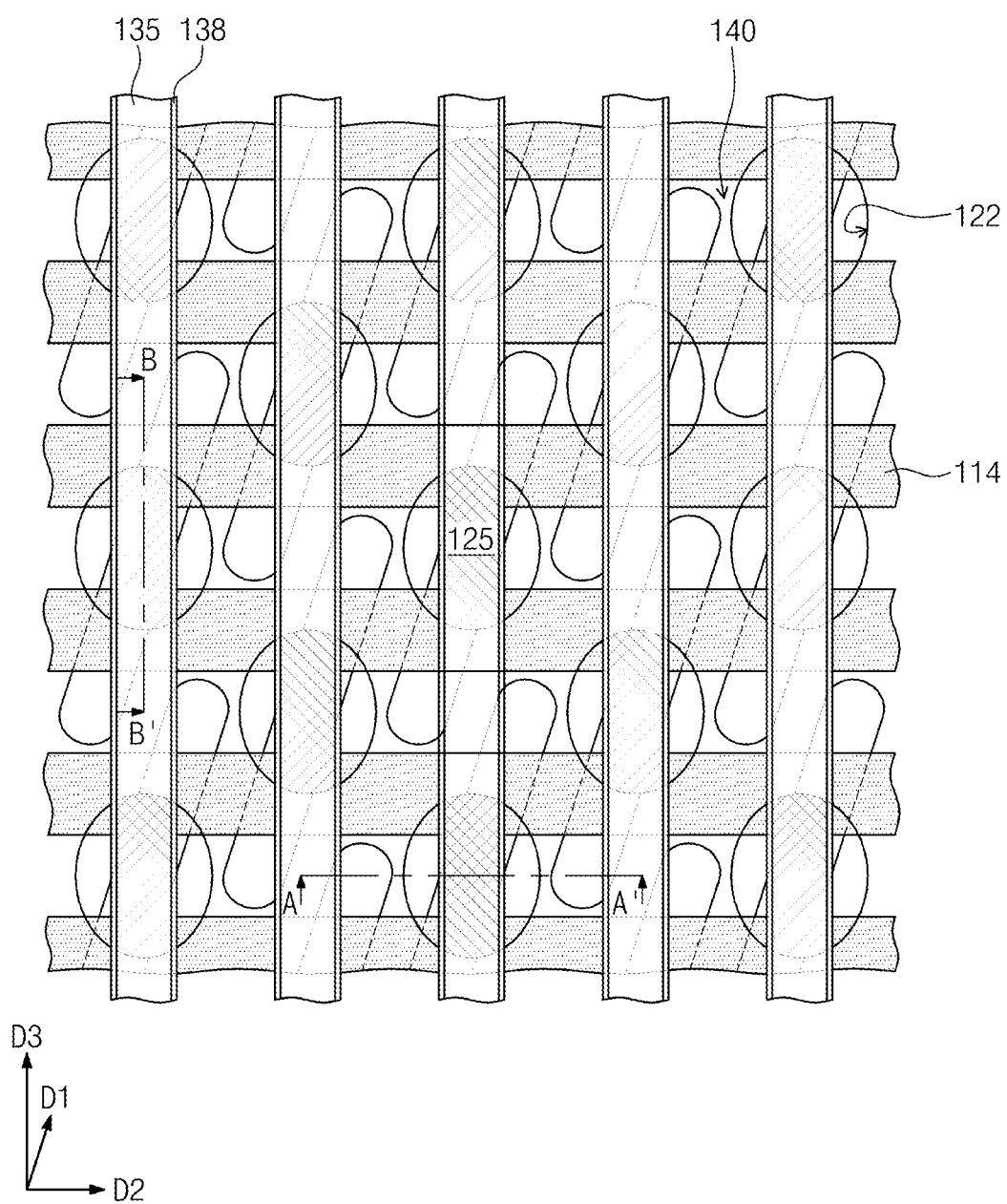
Figure 8B:
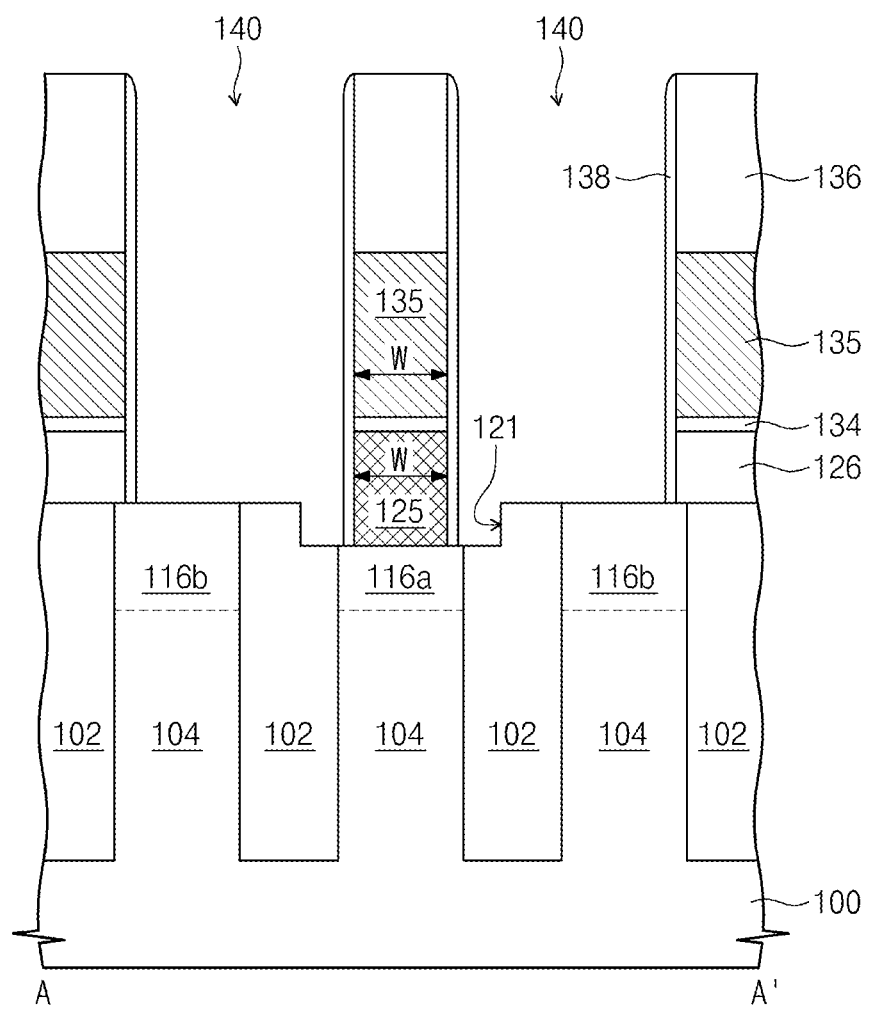
Figure 8C:
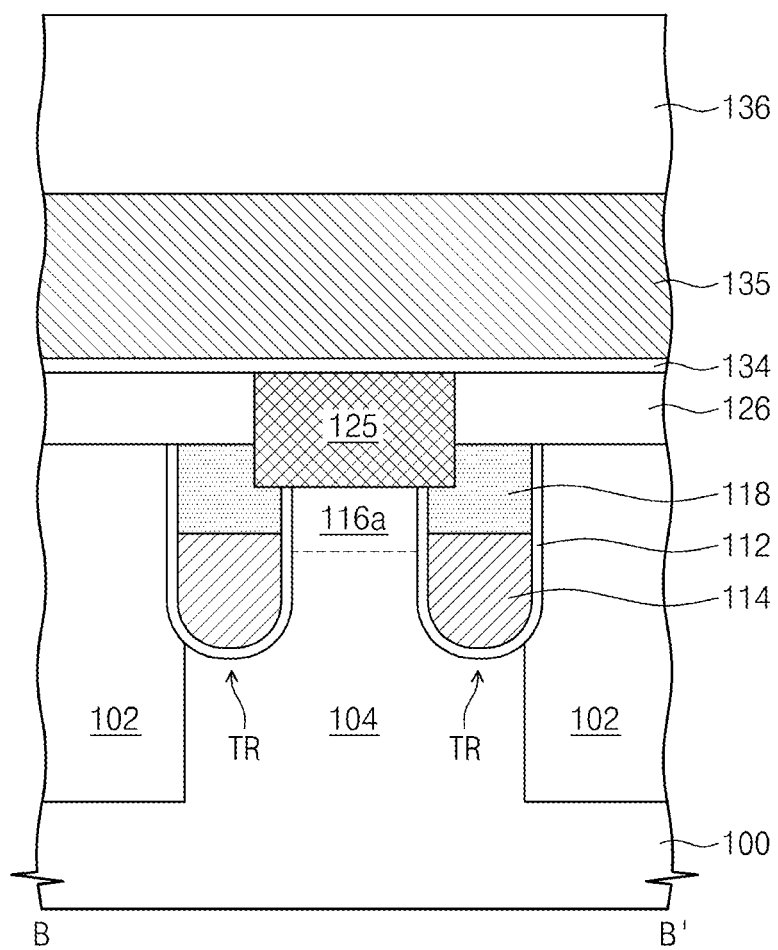

Referring to FIGS. 8A through 8C, the second mask 136 may be formed on the conductive layer 132, and then, the conductive layer 132, the metal barrier layer 130, the first interlayer insulating layer 120, and the preliminary first contact 124 may be etched using the second mask 136 as an etch mask.

The second mask 136 may extend along the third direction D3. As the result of the etching process using the second mask 136 as an etch mask, the bit line 135, the metal barrier pattern 134, the first contact 125, and a first interlayer insulating pattern 126 may be formed below the second mask 136. The bit line 135 may extend along the third direction D3. The second mask 136, the bit line 135, the metal barrier pattern 134, the first contact 125, and the first interlayer insulating pattern 126 may form patterned stacks extending along the third direction D3 and defining openings 140. In other words, the openings 140 may extend along the third direction D3.

The bit line 135 may be electrically connected to the first impurity region 116a via the first contact 125. In example embodiments, in a vertical section taken along the second direction D2, the bit line 135 and the first contact 125 may be formed to have the substantially same width W.

During the formation of the first contact 125, side portions of the preliminary first contact 124 may be removed to expose a portion of the first recess 121 again. As a result, the first impurity region 116a and the device isolation pattern 102 may be partially exposed by the first recess 121. The first recess 121 may be connected to the opening 140.

Thereafter, the first spacer 138 may be formed on sidewalls of the second mask 136, the bit line 135, the metal barrier pattern 134, and the first contact 125. The first spacer 138 may include a nitride layer.

Figure 9A:
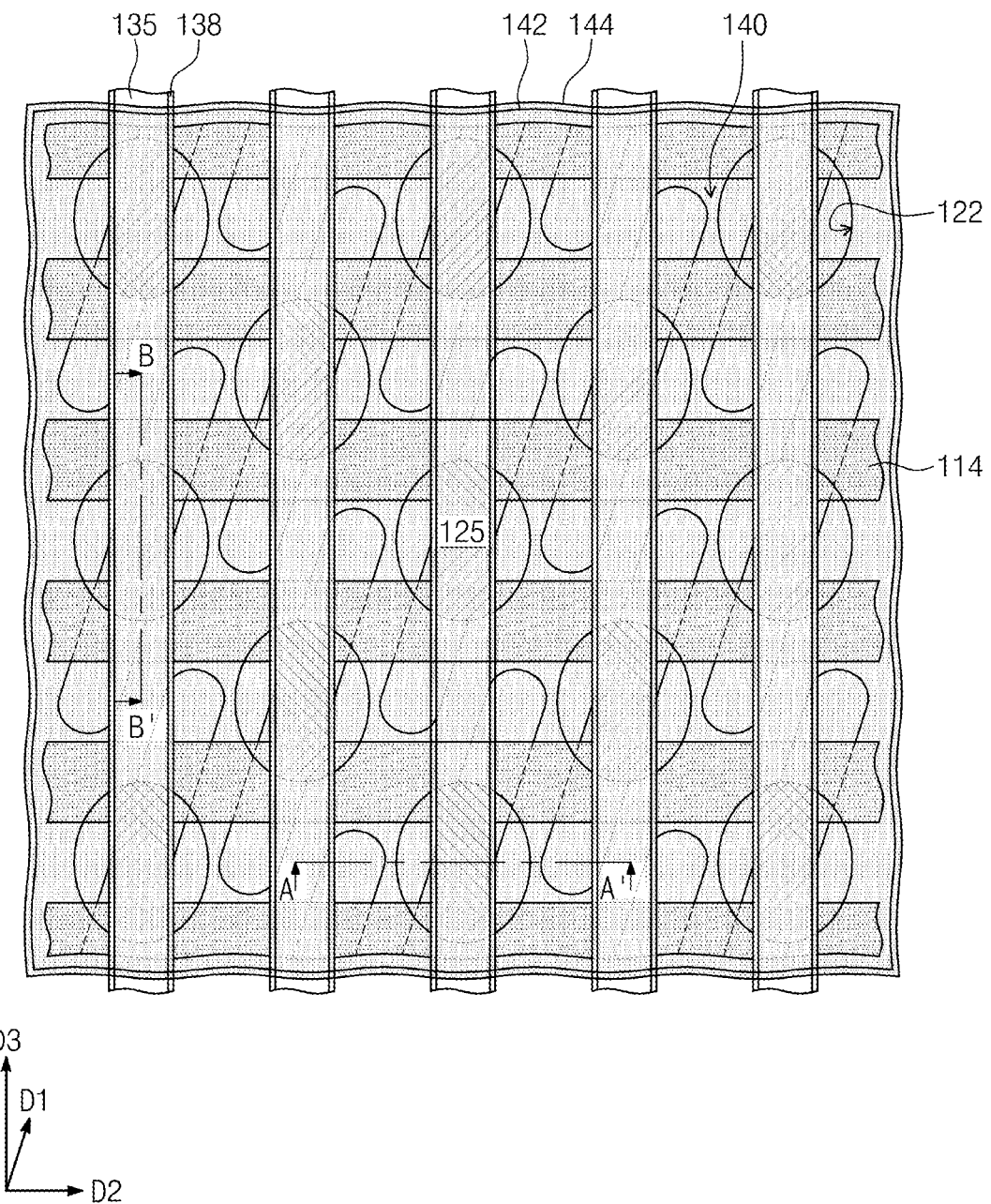
Figure 9B:
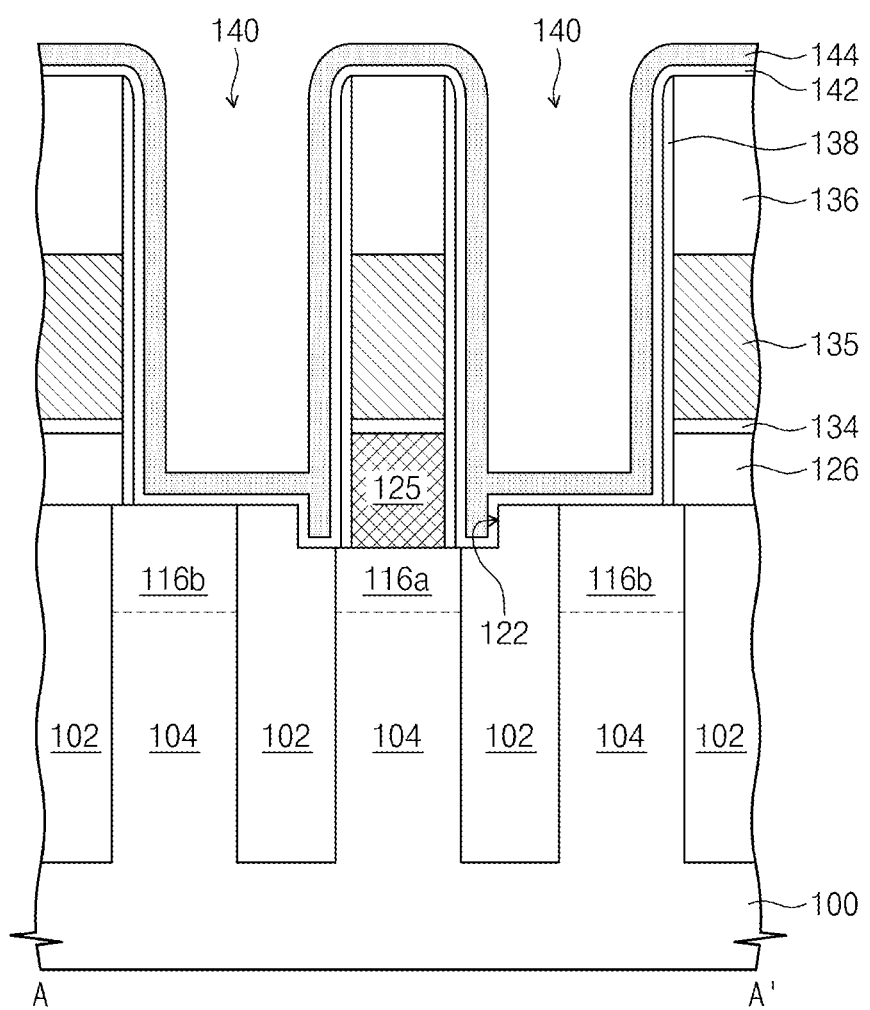
Figure 9C:
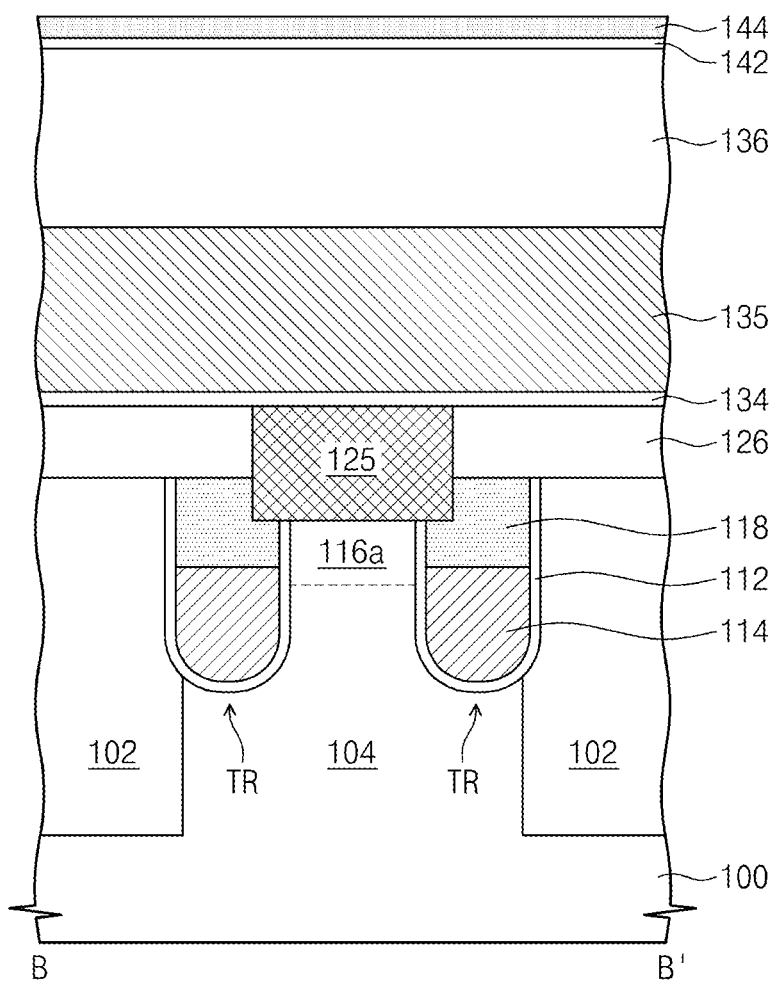

Referring to FIGS. 9A through 9C, a second spacer layer 142 and a nitride layer 144 may be sequentially and conformally formed on the second mask 136 and the first spacer 138. The second spacer layer 142 and the nitride layer 144 may be formed not to fill the opening 140 completely.

In example embodiments, the second spacer layer 142 may include an oxide layer.

In example embodiments, the nitride layer 144 may be formed to fill the first recess 121 completely.

Figure 10A:
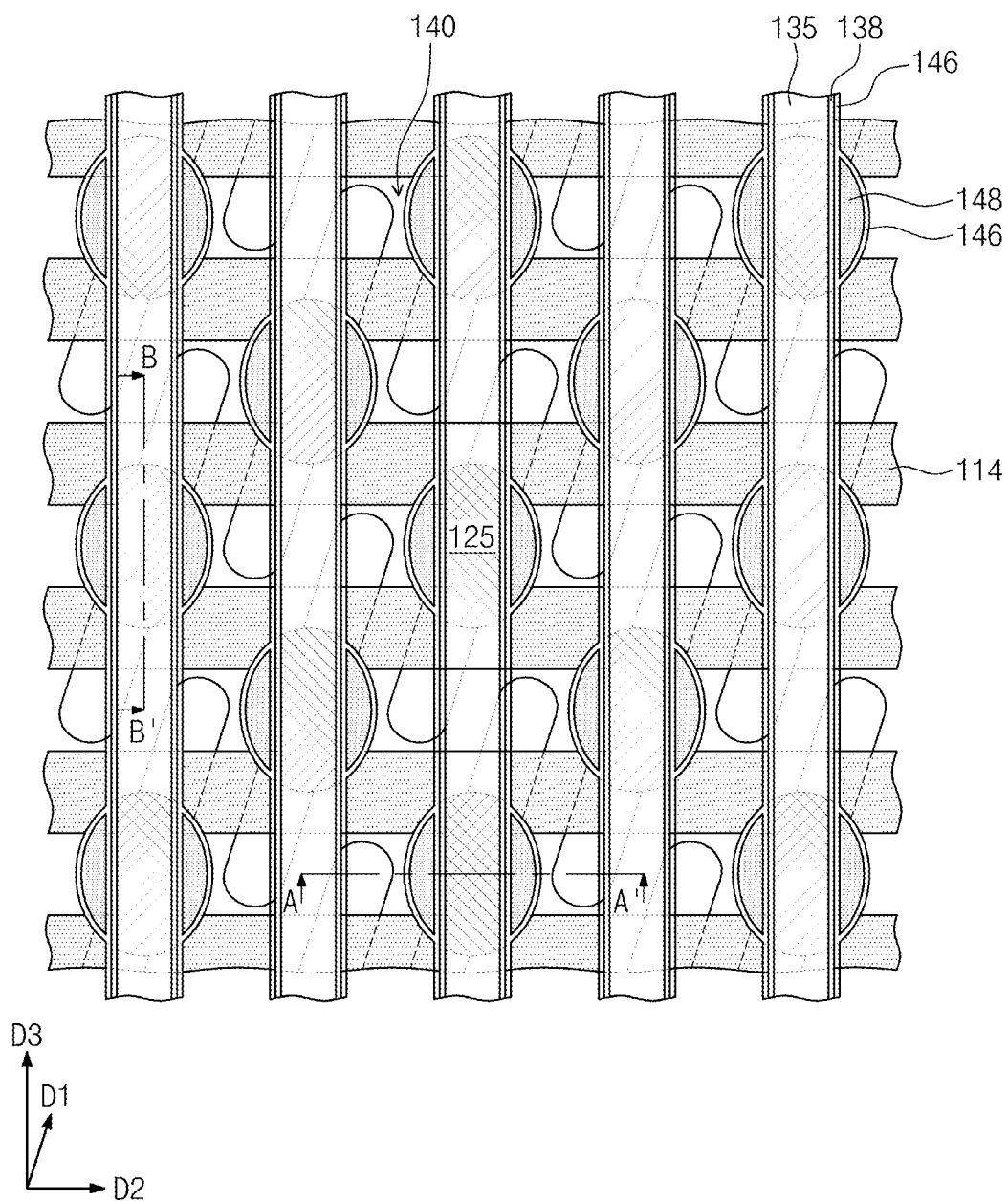
Figure 10B:
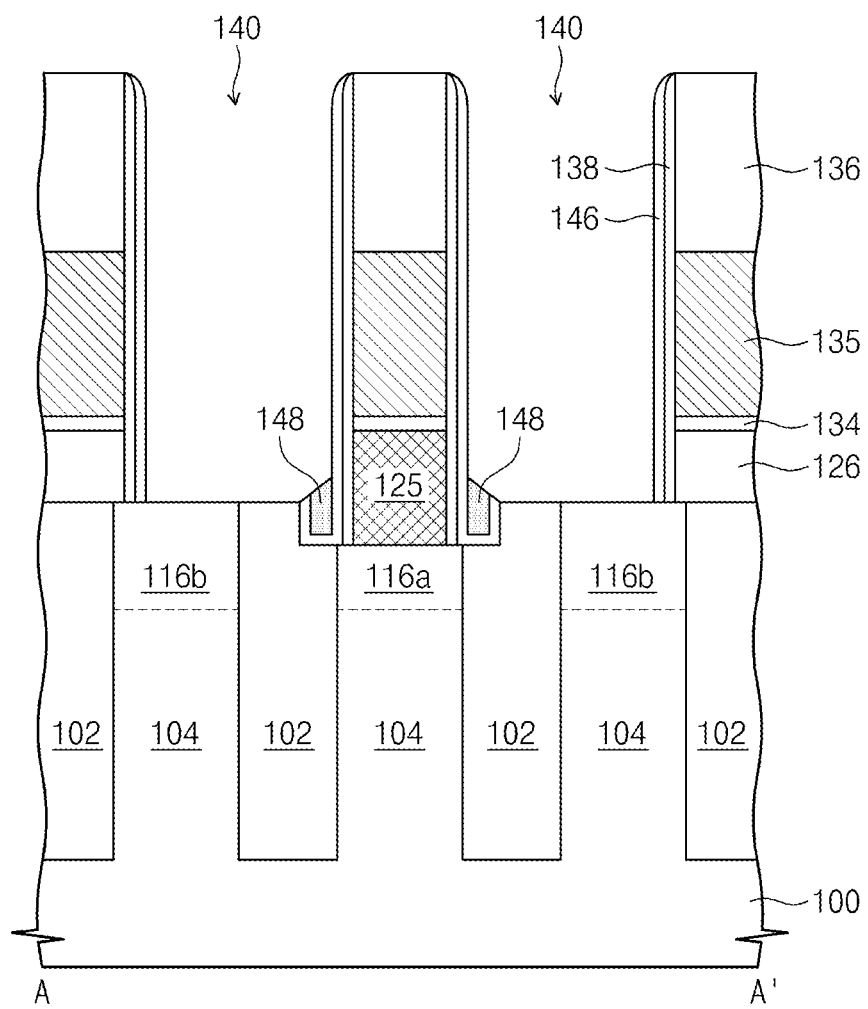
Figure 10C:
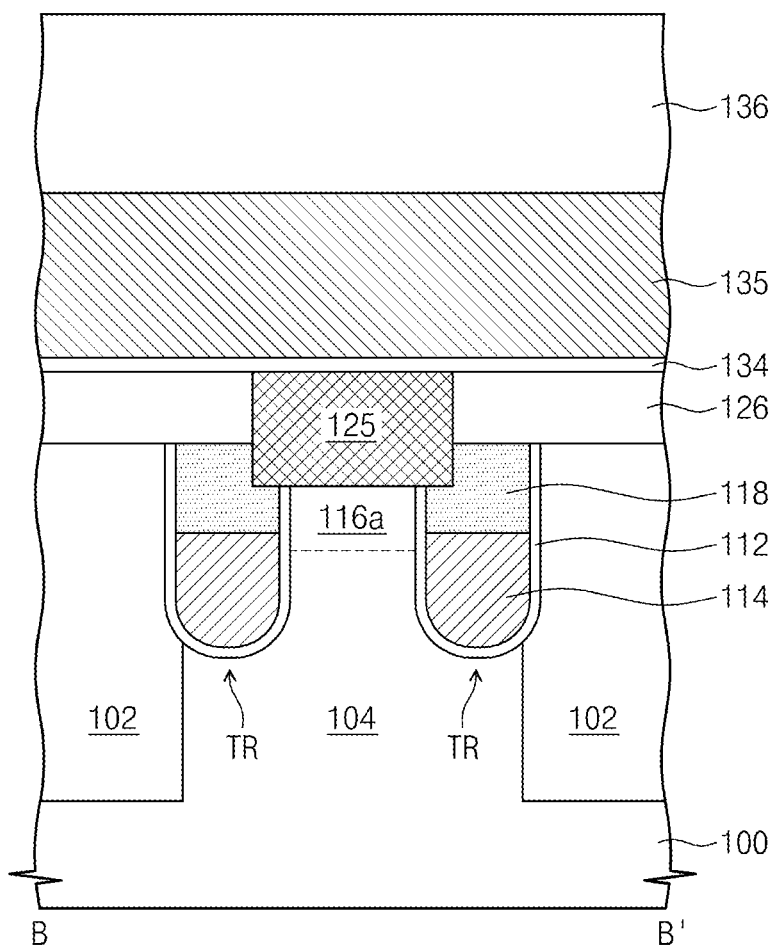

Referring to FIGS. 10A through 10C, the nitride layer 144 and the second spacer layer 142 may be etched to form the nitride pattern 148 and the second spacer 146.

In example embodiments, the nitride layer 144 may be etched in a wet etching manner using an etching solution, such that the nitride pattern 148 may remain on a lower surface of the second spacer layer 142. The etching solution may include a material having high etch selectivity with respect to the nitride layer 144. As a result, it is possible to prevent or reduce substantially the second spacer layer 142 including an oxide layer from being etched during the process of etching the nitride layer 144.

In the case where the etching process is performed in the wet etching manner, the nitride layer 144 may be isotropically etched. Here, since the nitride layer 144 is formed to cover conformally the opening 140, the nitride layer 144 may be removed from the opening 140, except for the first recess 121. Furthermore, the first recess 121 may be completely filled with the nitride layer 144, and thus, a portion of the nitride layer 144 in the first recess 121 may not be removed by the etching process to remain as the nitride pattern 148.

The etching solution may include a phosphoric acid, a sulfuric acid, a hydrofluoric acid, and dilute solutions thereof. The etching process may be performed using one or a mixture of the enumerated etching solutions. In addition, the etching process may be performed at a temperature of about 100° C. to about 250° C.

Thereafter, the second spacer layer 142 may be anisotropically etched to form the second spacer 146. The second spacer 146 may include a sidewall portion covering the sidewall of the opening 140 and a 'U'-shaped bottom portion covering side and bottom surfaces of the nitride pattern 148.

Figure 11A:
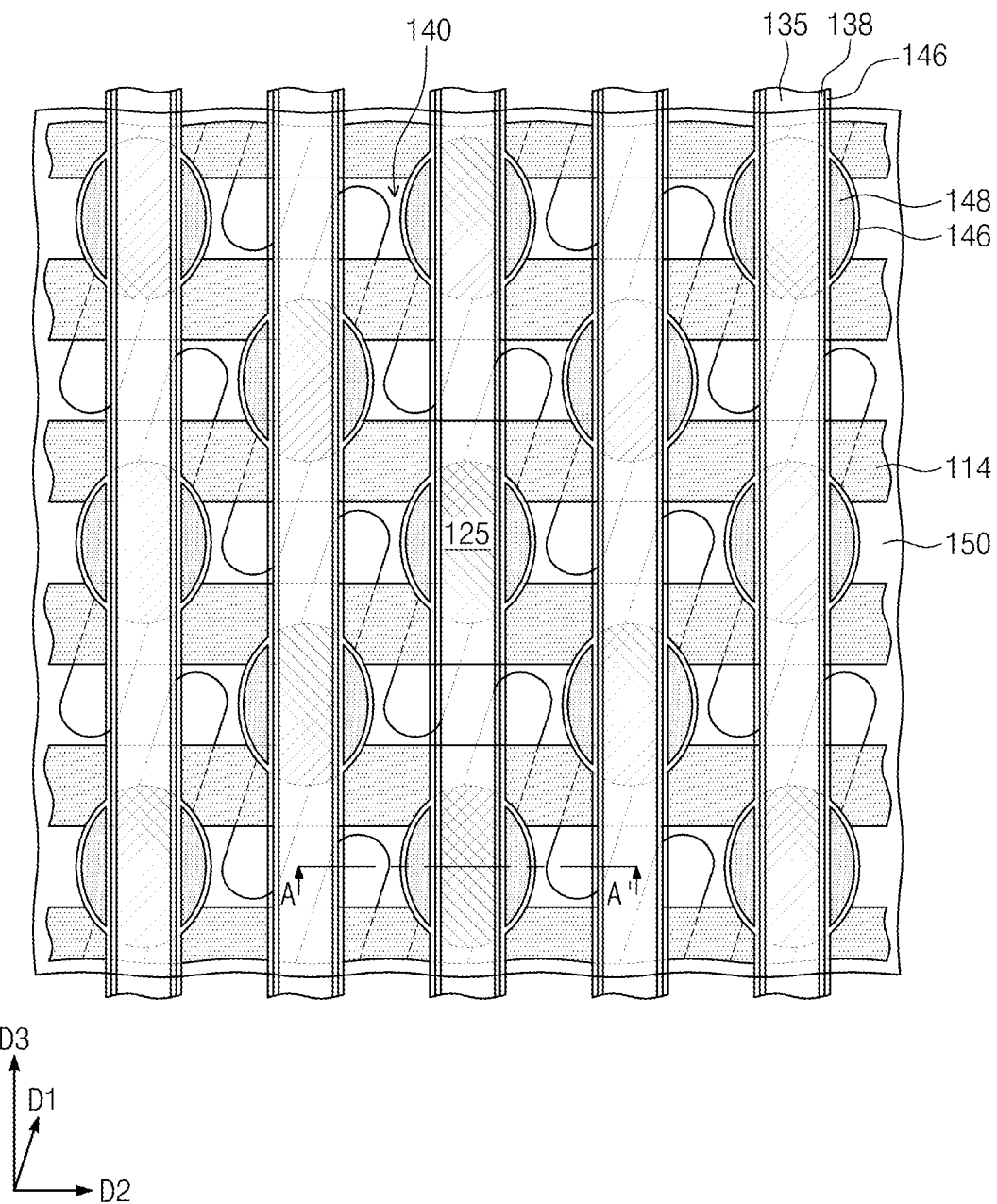
Figure 11B:
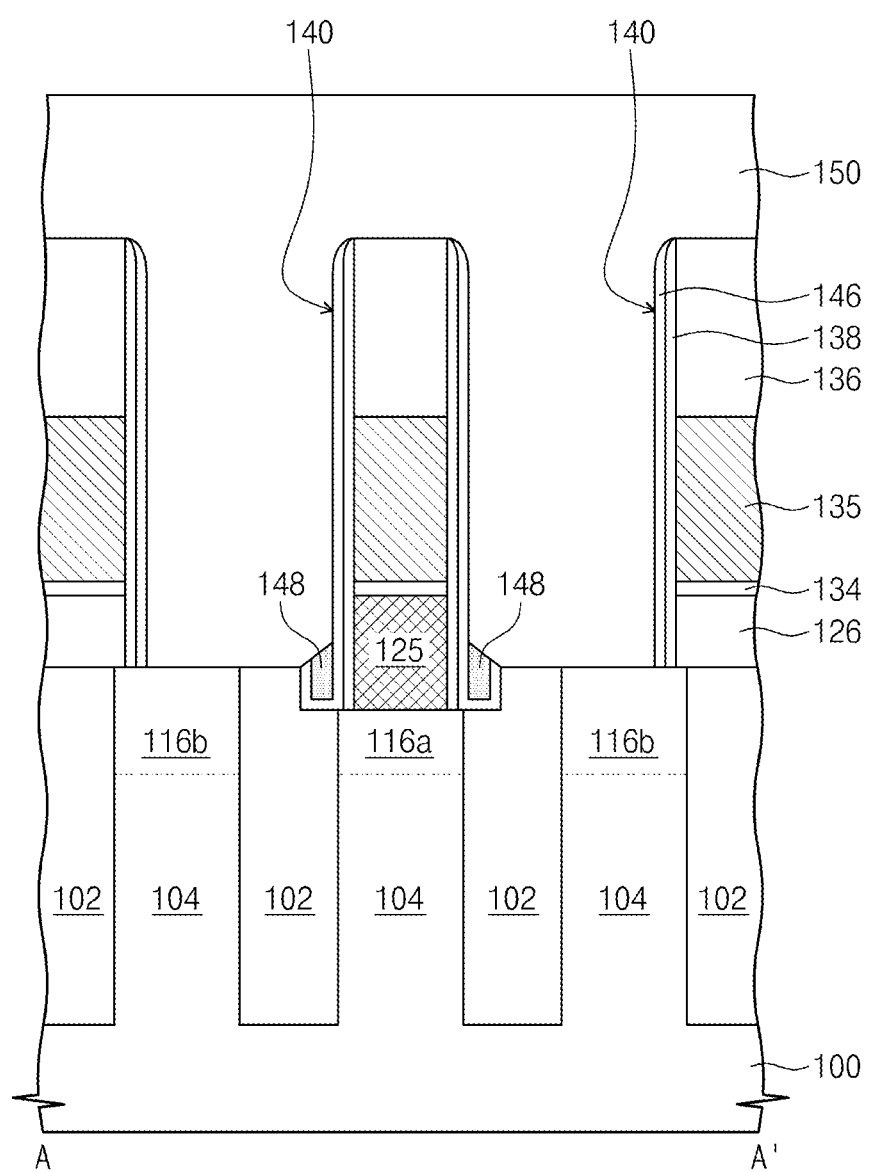

Referring to FIGS. 11A and 11B, a second interlayer insulating layer 150 may be formed to fill the opening 140 provided with the nitride pattern 148 and the second spacer 146. The second interlayer insulating layer 150 may include a material having etch selectivity with respect to the nitride pattern 148. In example embodiments, the second interlayer insulating layer 150 may include an oxide layer or an oxynitride layer.

Figure 12A:
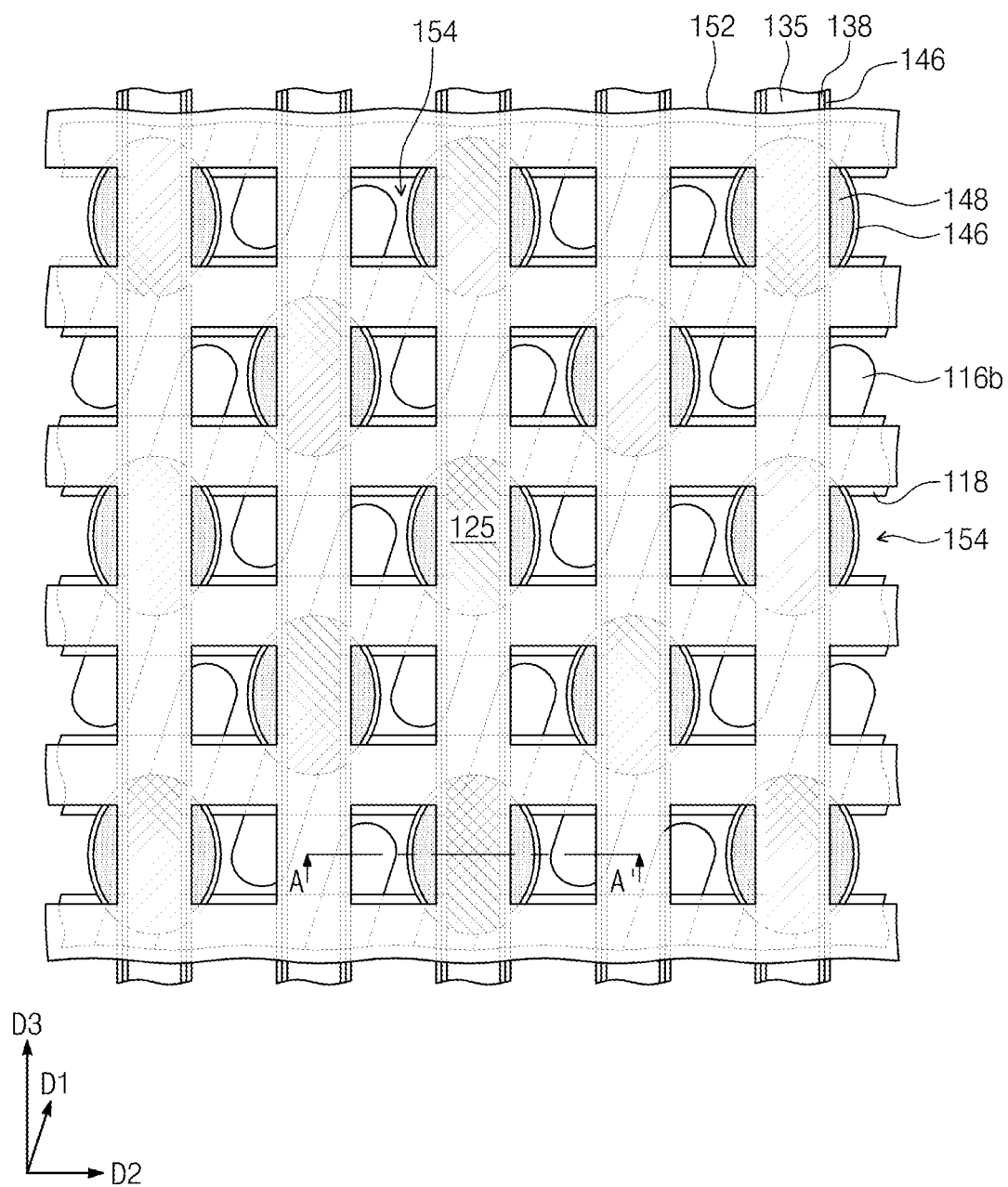
Figure 12B:
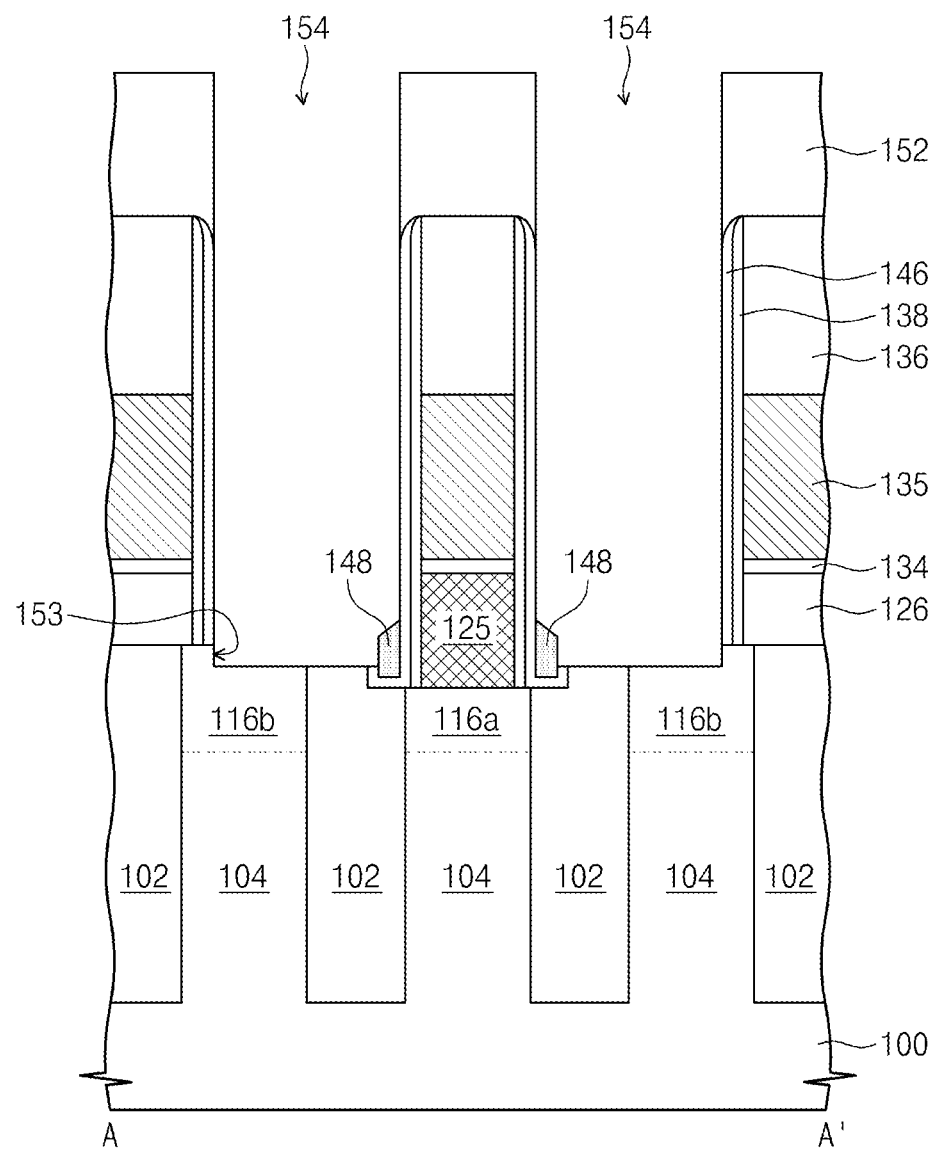

Referring to FIGS. 12A and 12B, the second interlayer insulating layer 150 may be etched to form a second contact hole 154 exposing the second impurity region 116b.

The second contact hole 154 may be formed to expose a portion of the second impurity region 116b and a portion of the device isolation pattern 102 adjacent to the second impurity region 116b. In example embodiments, the formation of the second contact hole 154 may be performed in an over-etch manner, and thus, the top surfaces of the second impurity region 116b and the device isolation pattern 102 exposed by the second contact hole 154 may be recessed to form the second recess 153. The second recess 153 may have a depth less than that of the first recess 121.

The second spacer 146 and the nitride pattern 148 may be exposed by the second contact hole 154. Due to the presence of the nitride pattern 148, it is possible to prevent or reduce the first impurity region 116a, a portion of the device isolation pattern 102 adjacent to the first impurity region 116a, and the first contact 125 from being unintentionally etched during the etching process for forming the second contact hole 154. In other words, the nitride pattern 148 may serve as an etch stop layer in the process of forming the second contact hole 154. In addition, the second spacer 146 and the nitride pattern 148 may separate electrically the bit line 135, the metal barrier pattern 134, and the first contact 125 from neighboring conductive patterns.

Referring back to FIGS. 1A through 1C, the second contact hole 154 and the second recess 153 may be filled with a conductive material to form the second contact 156.

The second contact 156 may be electrically connected to the second impurity region 116b. The second contact 156 may be electrically isolated from the first contact 125, the metal barrier pattern 134, and the bit line 135 by the second spacer 146 and the nitride pattern 148.

Since the nitride pattern 148 is formed in a localized region between the first contact 125 and the second contact 156, it is possible to suppress a parasitic capacitance between the first and second contacts 125 and 146 from increasing. In other words, as the result of the localization of the nitride pattern 148, the parasitic capacitance between the first and second contacts 125 and 146 can be reduced, compared with the case that the nitride pattern 148 is formed to cover the whole sidewall of the second spacer 146. In addition, as described above, the nitride pattern 148 may prevent or reduce the active pattern 104 provided with the first impurity region 116a from being unintentionally etched during the formation of the second contact hole 154.

Furthermore, the second contact 156 may be spaced apart from and electrically separated from the active pattern 104 provided with the first impurity region 116a by the nitride pattern 148, and this enables to improve refresh characteristics of the semiconductor device.

FIGS. 13A through 15A are plan views illustrating a method of fabricating a semiconductor device according to another example embodiment of the inventive concepts. FIGS. 13B through 15B are sectional views taken along lines A-A' of FIGS. 13A through 15A, respectively, and FIG. 13C is a sectional view taken along a line B-B' of FIG. 13A.

Figure 13A:
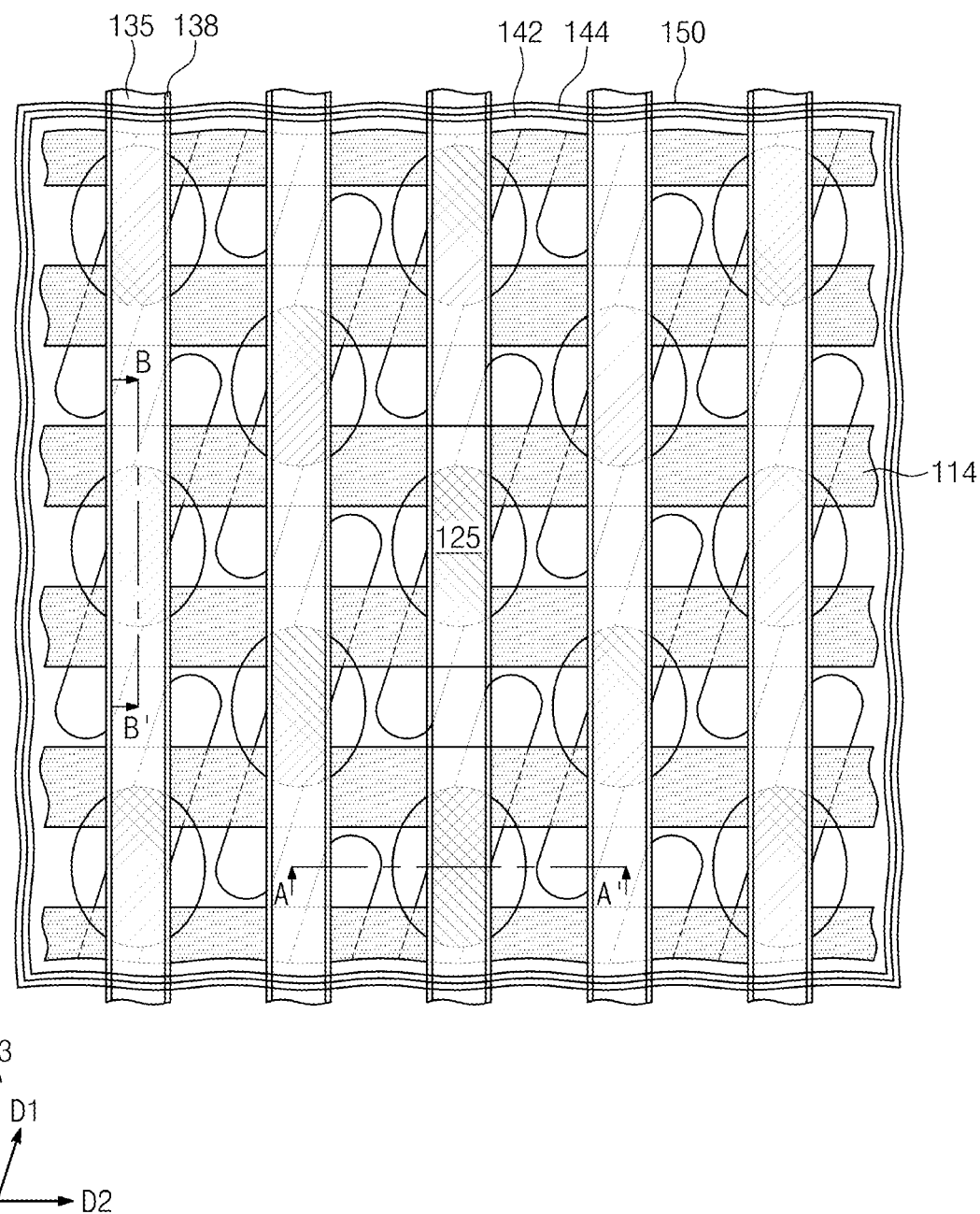
Figure 13B:
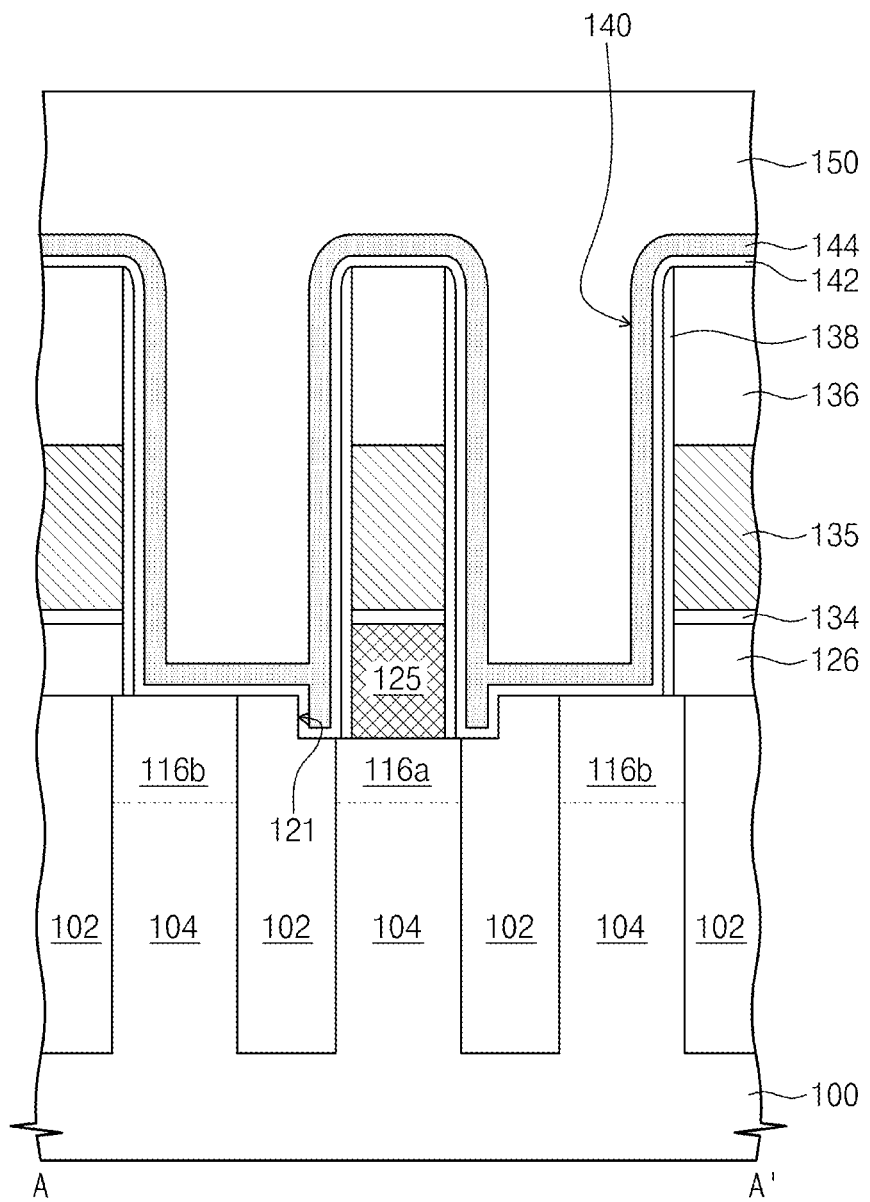
Figure 13C:
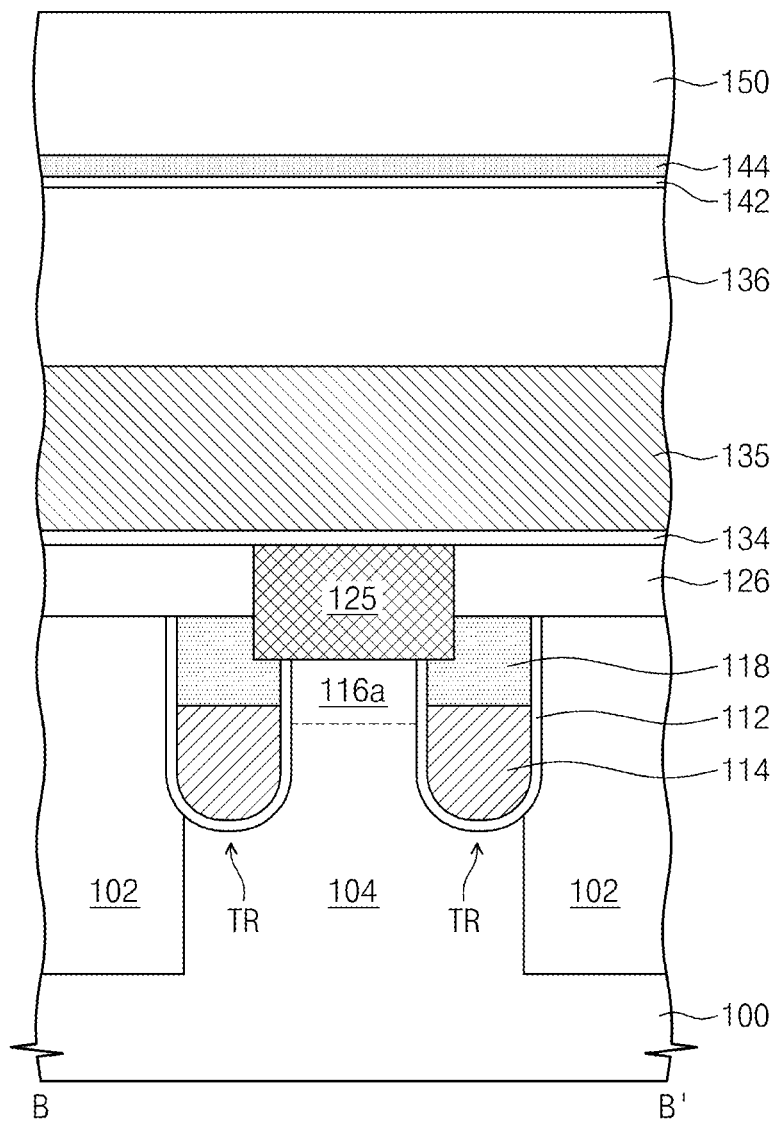
FIG. 13C is a sectional view taken along a line B-B' of FIG. 13A.

Referring to FIGS. 13A through 13C, the transistor TR, the first contact 125, the metal barrier pattern 134, the bit line 135, the second mask 136, the first spacer 138, the second spacer layer 142, and the nitride layer 144 may be formed on the substrate 100. This process may be performed by the substantially same process as that in the embodiments previously described with reference to FIGS. 4A through 9A, and thus, for the sake of brevity, the detailed description thereon will be omitted.

The second interlayer insulating layer 150 may be formed on the nitride layer 144 to fill the opening 140. In example embodiments, the second interlayer insulating layer 150 may be formed of an insulating material having a good gap-fill property, and thus, the openings 140 may be filled with the second interlayer insulating layer 150. For example, the second interlayer insulating layer 150 may include a silazane-based material, such as polysilazane (PSZ). The formation of the second interlayer insulating layer 150 may include forming a preliminary second interlayer insulating layer using a spin-on-glass (SOG) process or a chemical vapor deposition (CVD) process, and performing an oxidation process in a wet annealing manner. In example embodiments, $H_2O$ may be used in the oxidation process, and thus, a Si—N bond in the silazane may be converted into a Si—O bond constituting the second interlayer insulating layer 150.

Due to high diffusivity of $H_2O$, other material than the silazane may be unintentionally oxidized during the oxidation process. For example, a metal layer or a conductive layer may be vulnerable to the unintentional oxidation. However, according to an example embodiment of the inventive concepts, this unintentional oxidation can be prevented or reduced by the nitride layer 144, which is formed to cover the bit line 135, the metal barrier pattern 134, and the first contact 125 as shown in FIG. 13B.

Figure 14A:
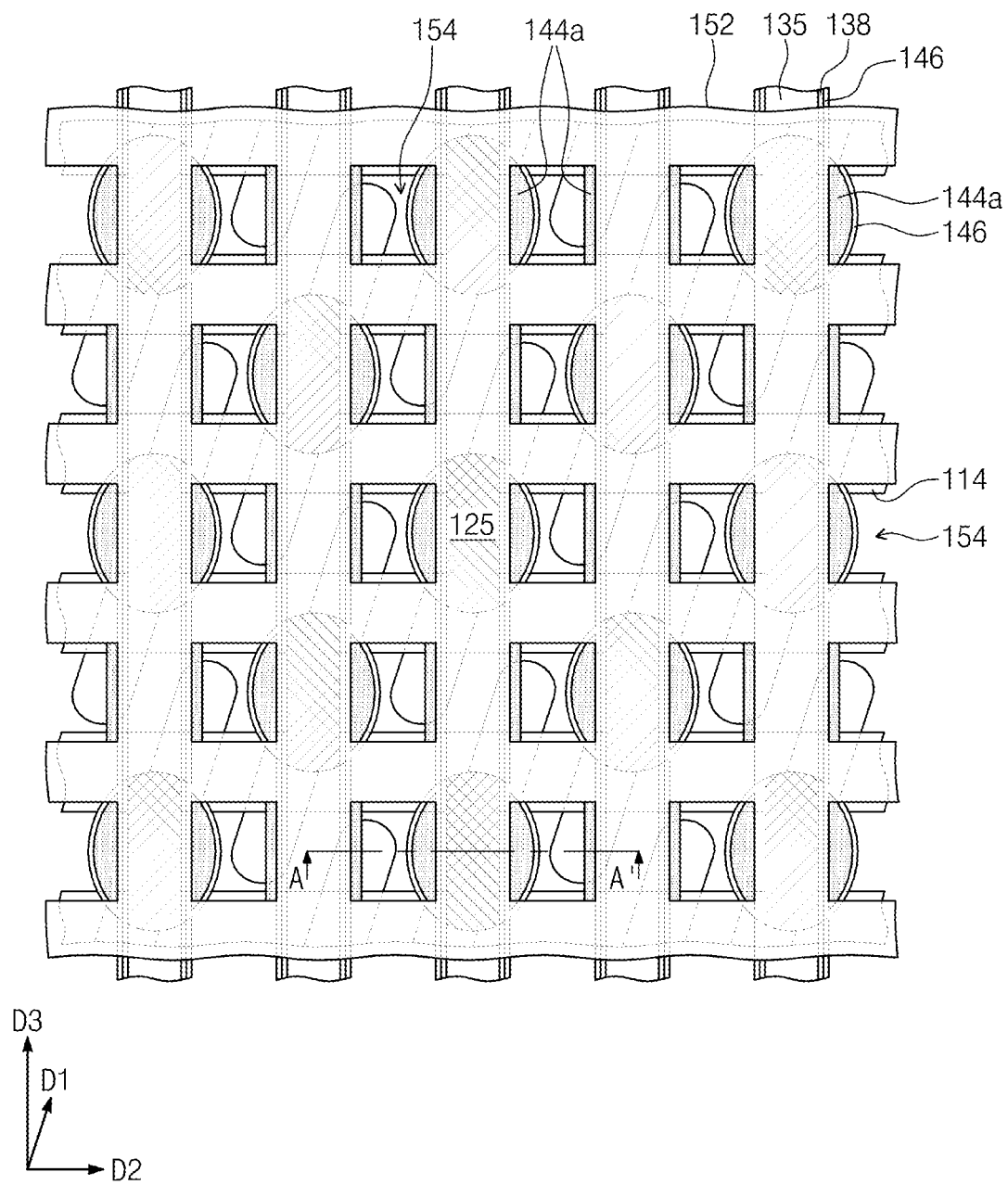
Figure 14B:
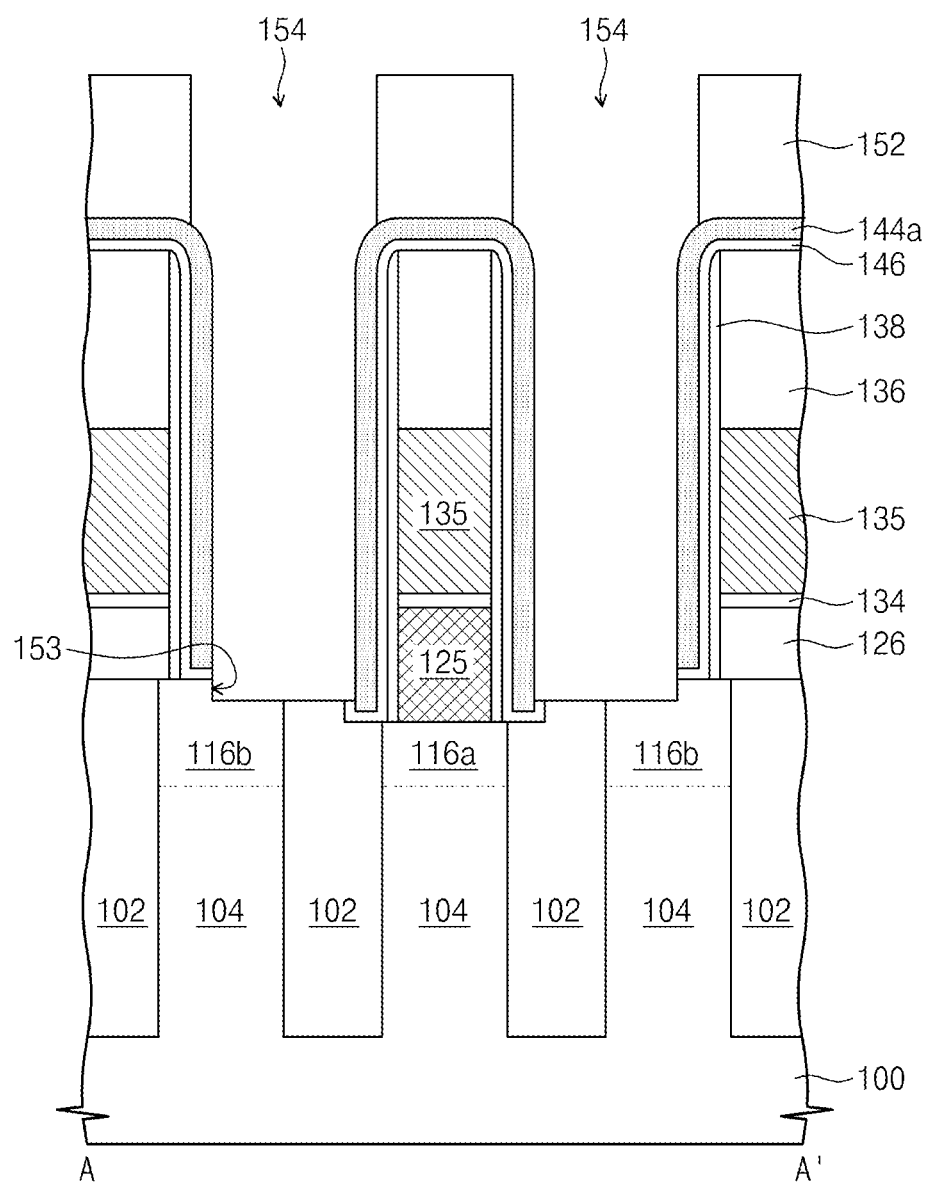

Referring to FIGS. 14A and 14B, the second interlayer insulating layer 150 may be etched to form a second interlayer insulating pattern 152. The second interlayer insulating pattern 152 may be formed to have the second contact hole 154 exposing the second impurity region 116b of the transistor TR. In addition, the nitride layer 144 and the second spacer layer 142 may be etched to form a preliminary nitride pattern 144a and the second spacer 146.

The formation of the second interlayer insulating pattern 152 may include forming an etch mask (not shown) on the second interlayer insulating layer 150, etching the second interlayer insulating layer 150 using the etch mask to form the second contact hole 154. In example embodiments, the second contact hole 154 may be formed to expose the second impurity region 116b. In other embodiments, the second contact hole 154 may be formed to expose the second impurity region 116b and a portion of the device isolation pattern 102 adjacent thereto.

The nitride layer 144 may be exposed by the second contact hole 154. The exposed portion of the nitride layer 144 may be anisotropically etched to form the preliminary nitride pattern 144a. In example embodiments, the preliminary nitride pattern 144a may include a portion interposed between the second spacer layer 142 and the second interlayer insulating pattern 152 and a portion covering a sidewall of the second contact hole 154.

As the result of the formation of the preliminary nitride pattern 144a, the second spacer layer 142 may be exposed by the second contact hole 154. A portion of the second spacer layer 142 exposed by the second contact hole 154 may be etched to form the second spacer 146 on the first spacer 138. The second spacer 146 may extend from a top surface of the second mask 136 along a sidewall of the first spacer 138 and surround a lower portion of the preliminary nitride pattern 144a.

As the result of the formation of the second spacer 146, the second contact hole 154 may expose the second impurity region 116b and a portion of the device isolation pattern 102 adjacent to the second impurity region 116b. In example embodiments, the steps of etching the preliminary nitride pattern 144a and the second spacer 146 may be performed in such a way that top surfaces of the second impurity region 116b and the device isolation pattern 102 exposed by the second contact hole 154 may be over-etched or recessed to form the second recess 153.

Figure 15A:
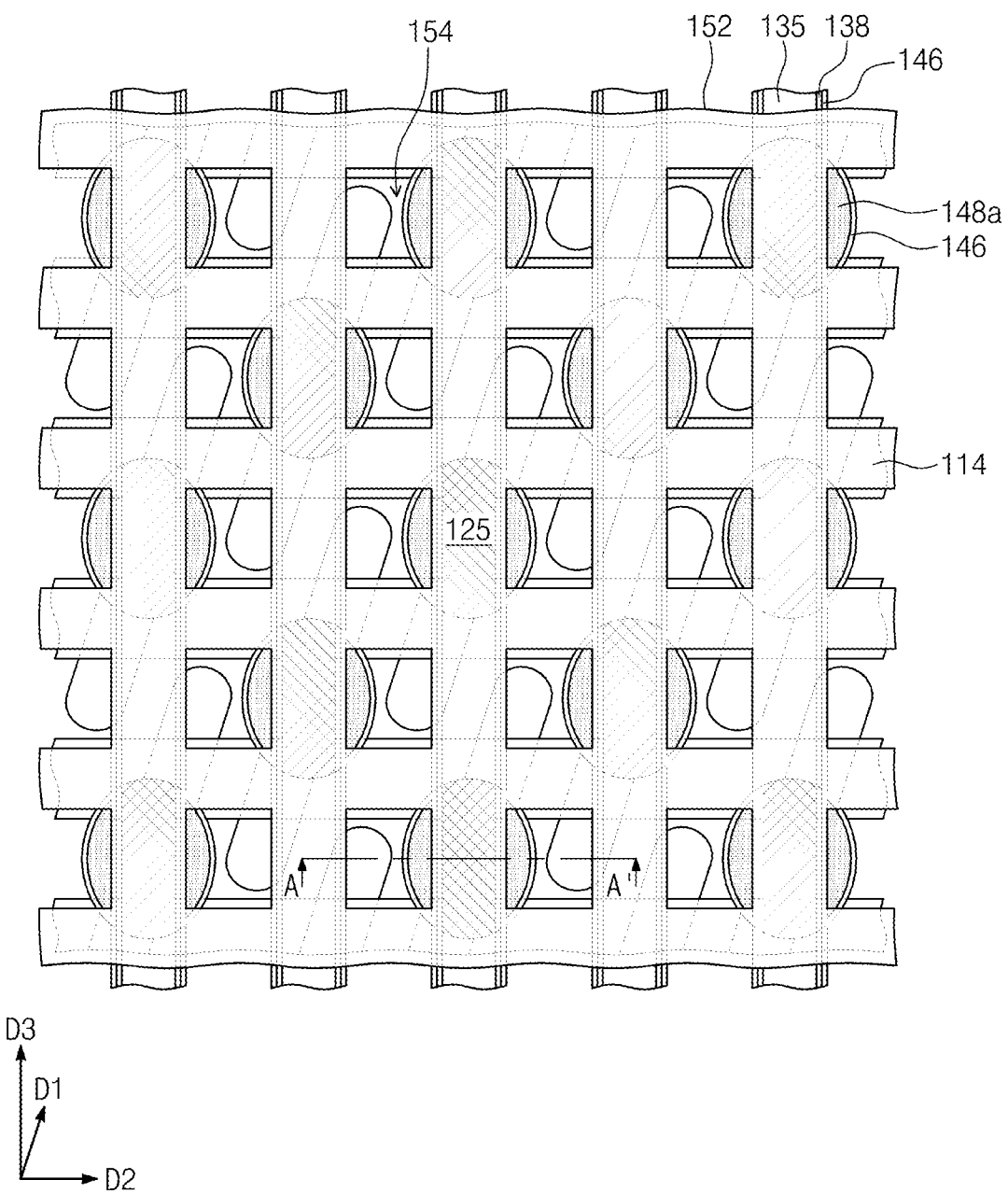
Figure 15B:
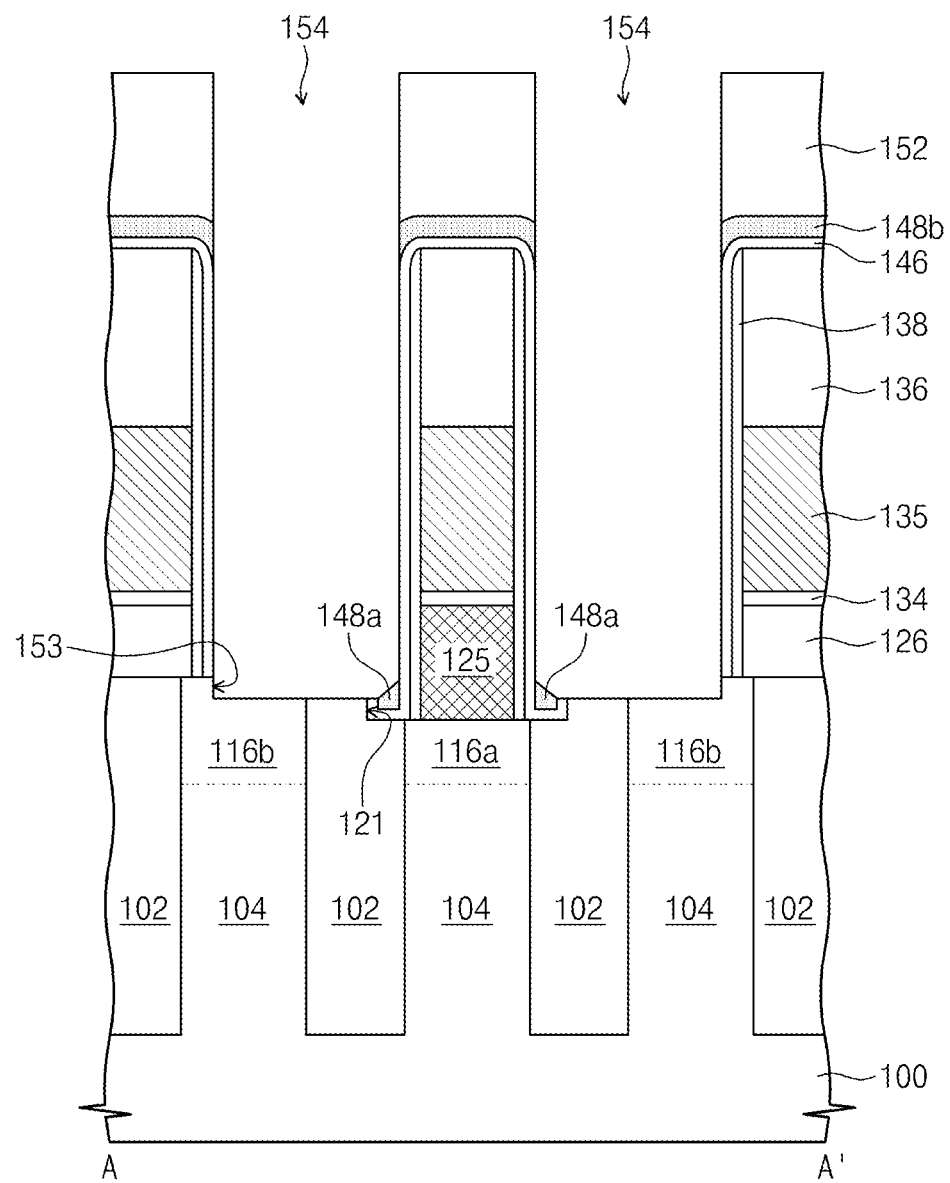

Referring to FIGS. 15A and 15B, the preliminary nitride pattern 144a may be etched to form the first nitride pattern 148a and the second nitride pattern 148b vertically spaced apart from each other.

In the case where the preliminary nitride pattern 144a is not etched, a parasitic capacitance between the first and second contacts 125 and 156 can be increased by the preliminary nitride pattern 144a interposed therebetween. By contrast, according to an example embodiment of the inventive concepts, the preliminary nitride pattern 144a may be etched in a wet etching manner using an etching solution. As the result of the wet etching process, the preliminary nitride pattern 144a may be removed from at least an upper sidewall of the first contact 125, thereby forming the first nitride pattern 148a and the second nitride pattern 148b. The etching solution to be used in the wet etching process may be selected to be able to etch the preliminary nitride pattern 144a with high etch selectivity. For example, the etching solution may be selected in such a way that the second spacer 146, the second impurity region 116b, and the device isolation pattern 102 can be prevented or reduced from being etched during the etching of the preliminary nitride pattern 144a. In the case where each of the second spacer 146 and the device isolation pattern 102 includes an oxide layer and the second impurity region 116b includes a silicon layer, the etching solution may be selected to etch the nitride layer with fast etch rate and prevent or reduce the oxide and silicon layers from being etched.

In the case where the etching process is performed in the wet etching manner, the preliminary nitride pattern 144a may be isotropically etched. In example embodiments, the preliminary nitride pattern 144a may be formed to fill the first recess 121, and thus, the etching process may be performed to remove the preliminary nitride pattern 144a from the opening 140, except for the first recess 121. In other words, after the etching process, the first nitride pattern 148a may remain in the first recess 121. In addition, a portion of the preliminary nitride pattern 144a covered with the second interlayer insulating pattern 152 may not be removed by the etching process, thereby forming the second nitride pattern 148b.

The etching solution may include a phosphoric acid, a sulfuric acid, a hydrofluoric acid, and dilute solutions thereof. The etching process may be performed using one or a mixture of the enumerated etching solutions. In addition, the etching process may be performed at a temperature of about 100° C. to about 250° C.

Referring back to FIGS. 2A through 2C, the second contact hole 154 and the second recess 153 may be filled with a conductive material to form the second contact 156. The second contact 156 may be electrically connected to the second impurity region 116b.

As described above, the first and second nitride patterns 148a and 148b can prevent or reduce an oxidizing agent (e.g., $H_2O$) from being diffused into a conductive pattern during a wet annealing process. In addition, since the first nitride pattern 148a is provided between the first and second contacts 125 and 156, it can separate electrically and spatially the second contact 156 from the first impurity region 116a and/or the first contact 125. Furthermore, since the first nitride pattern 148a is formed in a localized region including the first recess 121, it is possible to suppress a parasitic capacitance between the first and second contacts 125 and 146 from increasing.

FIGS. 16A through 20A are plan views illustrating a method of fabricating a semiconductor device according to another example embodiment of the inventive concepts. FIGS. 16B through 20B are sectional views taken along lines A-A' of FIGS. 16A through 20A, respectively, and FIGS. 16C through 19C are sectional views taken along lines B-B' of FIGS. 16A through 19A, respectively.

Figure 16A:
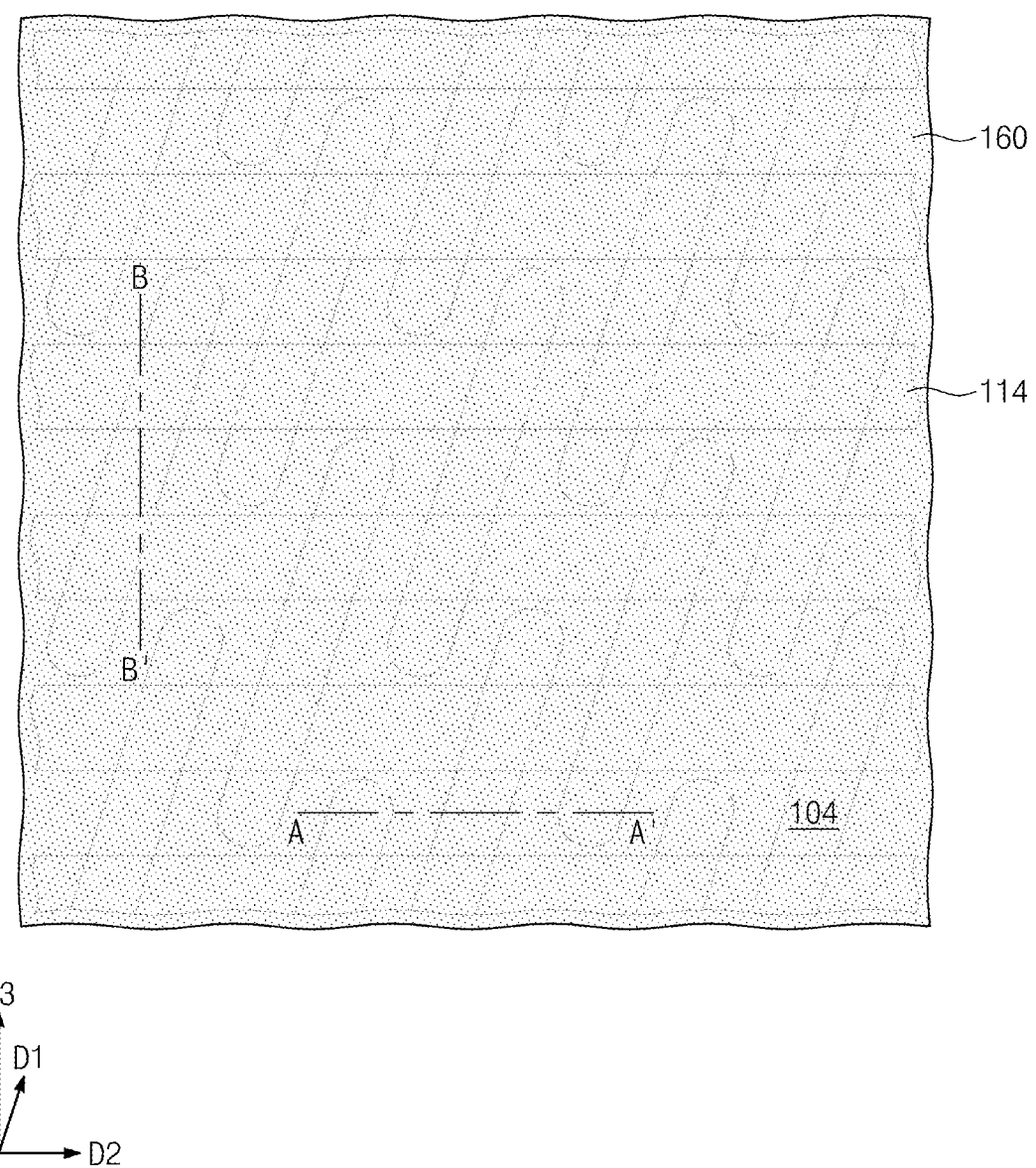
Figure 16B:
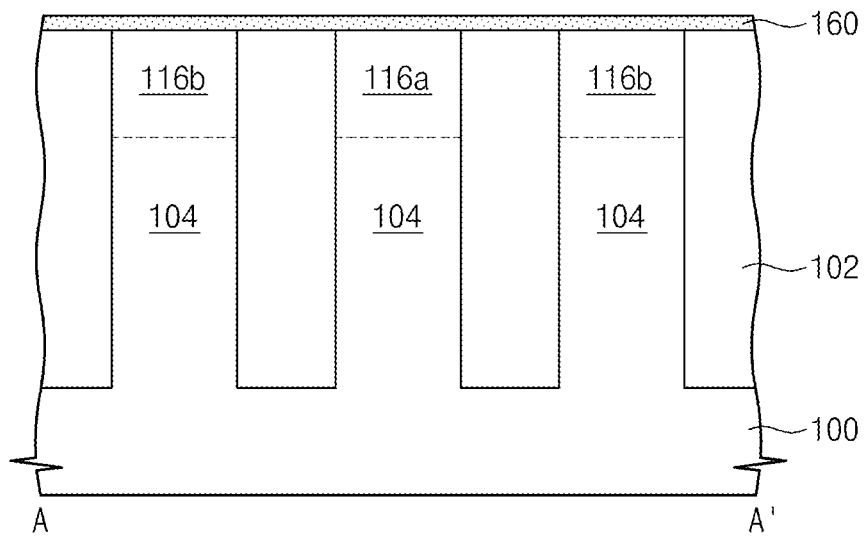
Figure 16C:
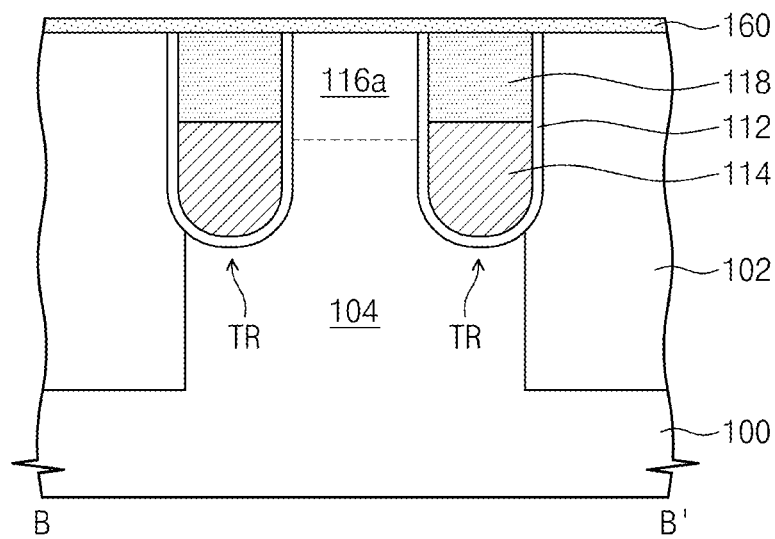

Referring to FIGS. 16A through 16C, an etch stop layer 160 may be formed on the substrate 100 provided with the device isolation pattern 102 and the transistor TR.

The formation of the device isolation pattern 102 and the transistor TR may be performed by the substantially same process as that in the embodiments previously described with reference to FIGS. 4A through 4C and 5A through 5C, and thus, for the sake of brevity, the detailed description thereon will be omitted. In example embodiments, the transistor TR may be a buried channel array transistor including the gate insulating layer 112, the gate electrode 114, the first and second impurity regions 116a and 116b, and the first mask 118.

By forming the etch stop layer 160, the substrate 100 can be protected against an etching damage, which may be caused by a subsequent etching process. In example embodiments, the etch stop layer 160 may include a material having etch selectivity with respect to the substrate 100 and the device isolation pattern 102. For example, the etch stop layer 160 may include a nitride layer.

Figure 17A:
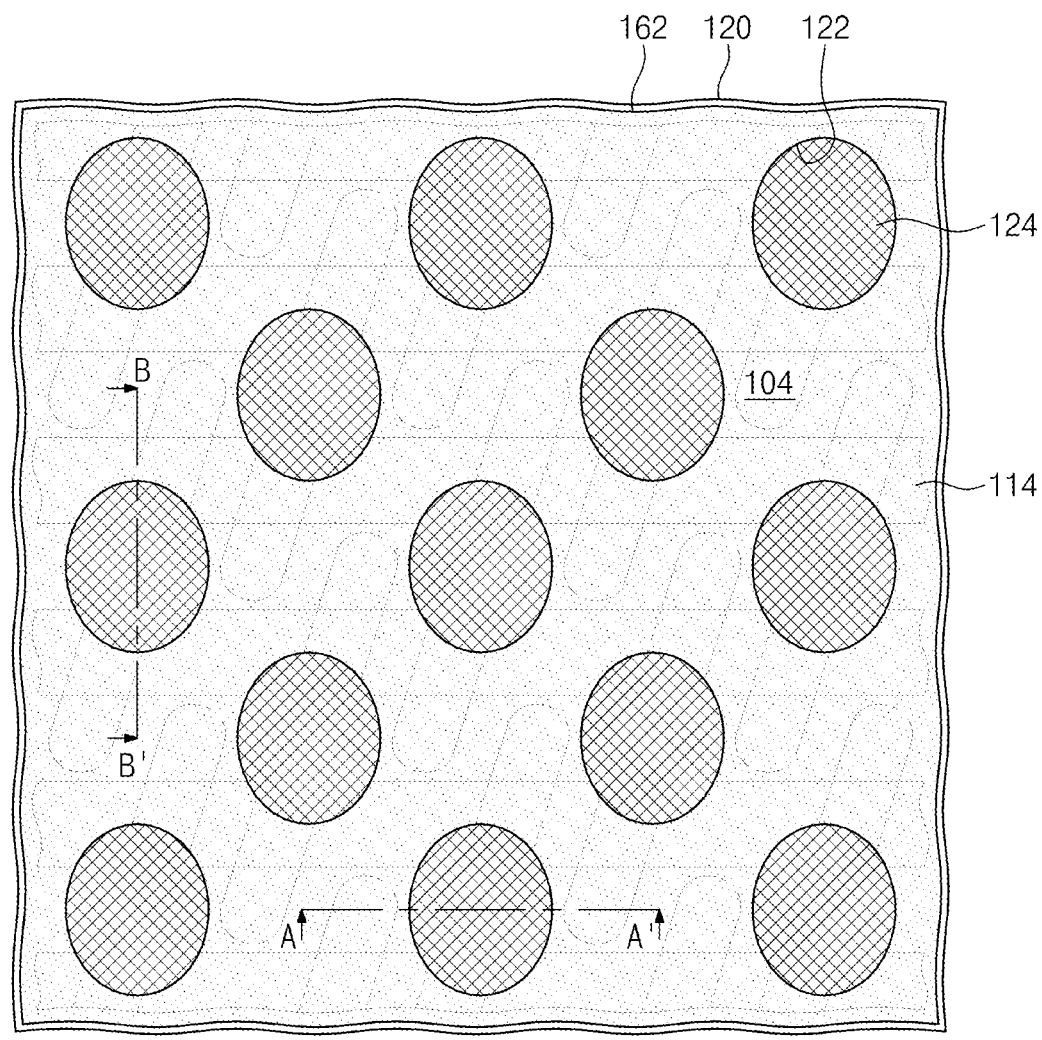
Figure 17B:
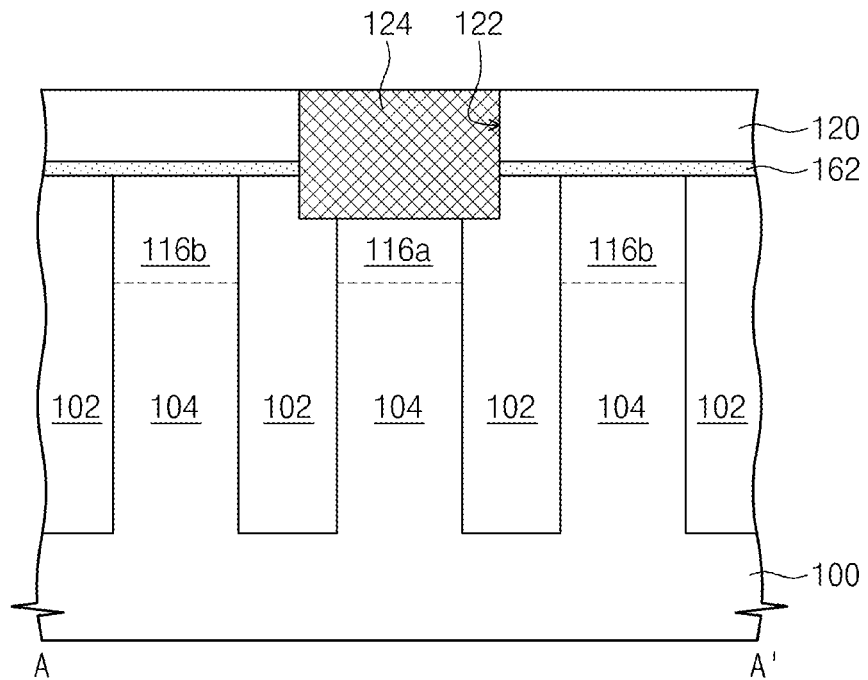
Figure 17C:
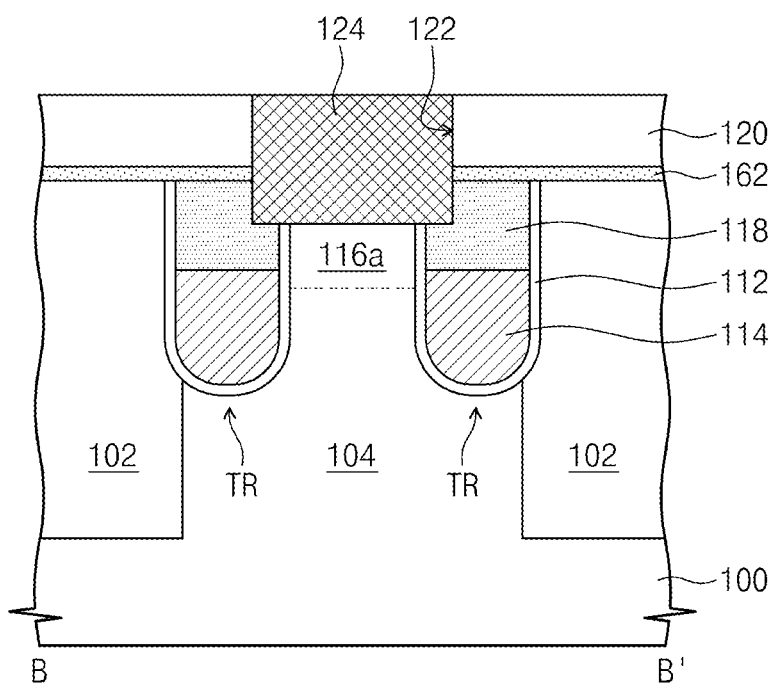

Referring to FIGS. 17A through 17C, the preliminary first contact 124 may be formed on the substrate 100 and be electrically connected to the first impurity region 116a.

In example embodiments, the process described with reference to FIGS. 5A through 5C and 6A through 6C may be performed or modified to form the preliminary first contact 124. For example, the first interlayer insulating layer 120 may be formed on the etch stop layer 160, and the first interlayer insulating layer 120 and the etch stop layer 160 may be etched to form the first contact hole 122 and a preliminary etch stop pattern 162, respectively. In example embodiments, the first contact hole 122 may be formed to expose the first impurity region 116a. The etching process may be performed in an over-etching manner, and thus, the first impurity region 116a and a portion of the device isolation pattern 102 adjacent to the first impurity region 116a may be recessed to form the first recess 121.

Figure 18A:
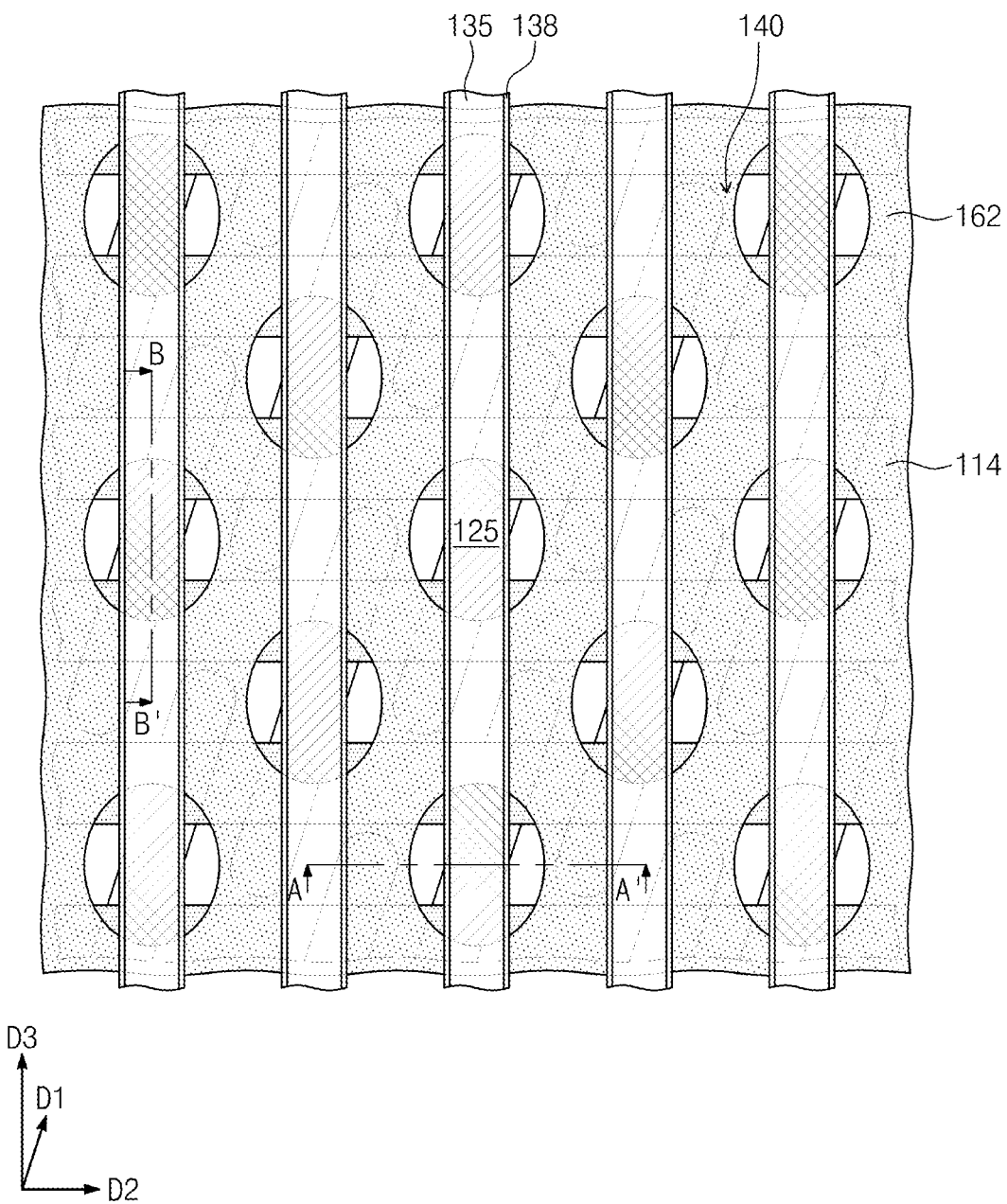
Figure 18B:
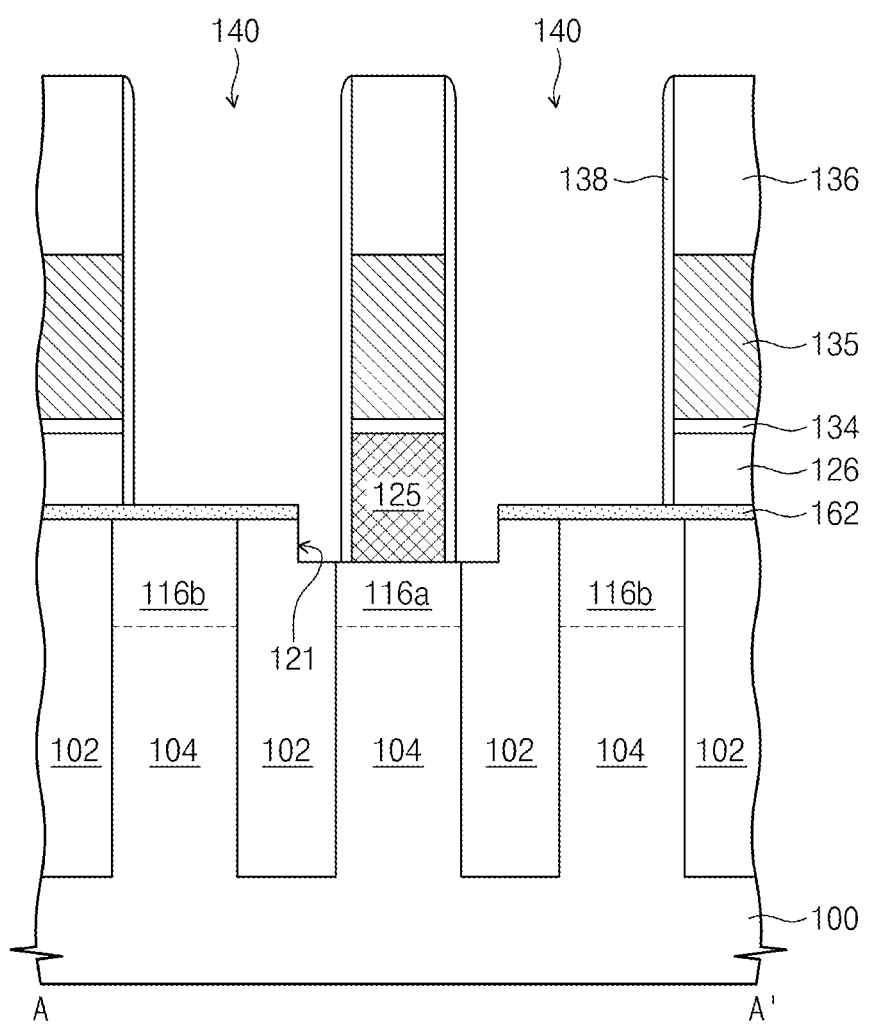
Figure 18C:
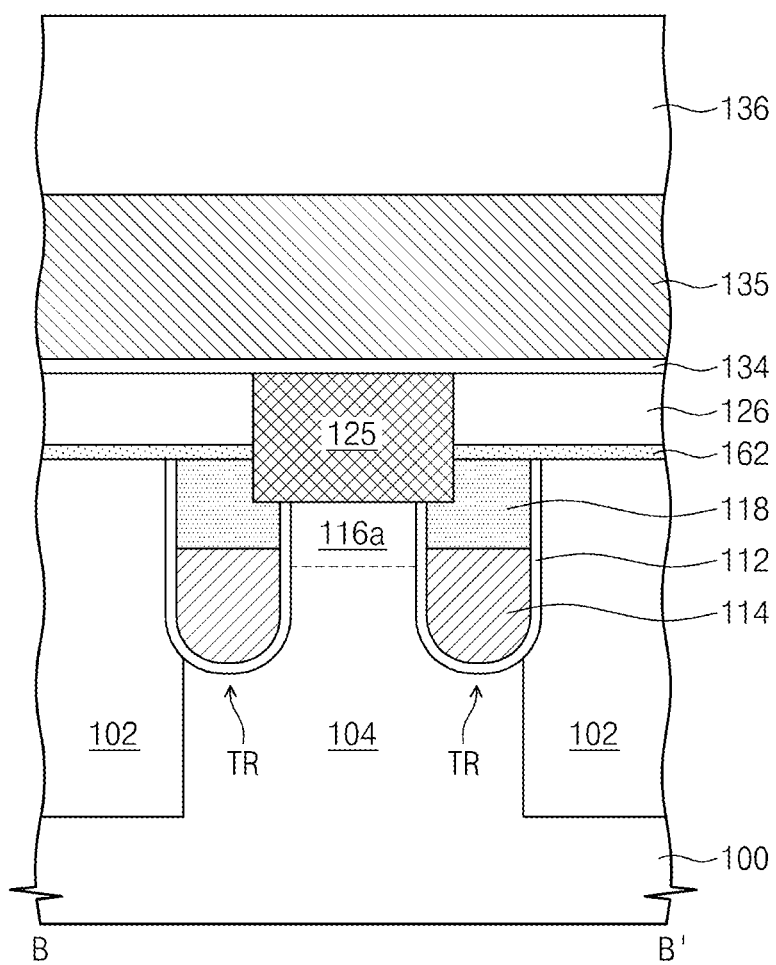

Referring to FIGS. 18A through 18C, the first contact 125, the metal barrier pattern 134, the bit line 135, the second mask 136, and the first spacer 138 may be formed on the first recess 121.

The process described with reference to FIGS. 7A through 7C and 8A through 8C may be performed or modified to form the first contact 125, the metal barrier pattern 134, the bit line 135, the second mask 136, and the first spacer 138. However, in the present embodiments, the preliminary etch stop pattern 162 may be formed to cover the substrate 100, and thus, it is possible to protect the substrate 100 located below the preliminary etch stop pattern 162 against an etch damage, which may occur during an etching process to form the openings 140.

Figure 19A:
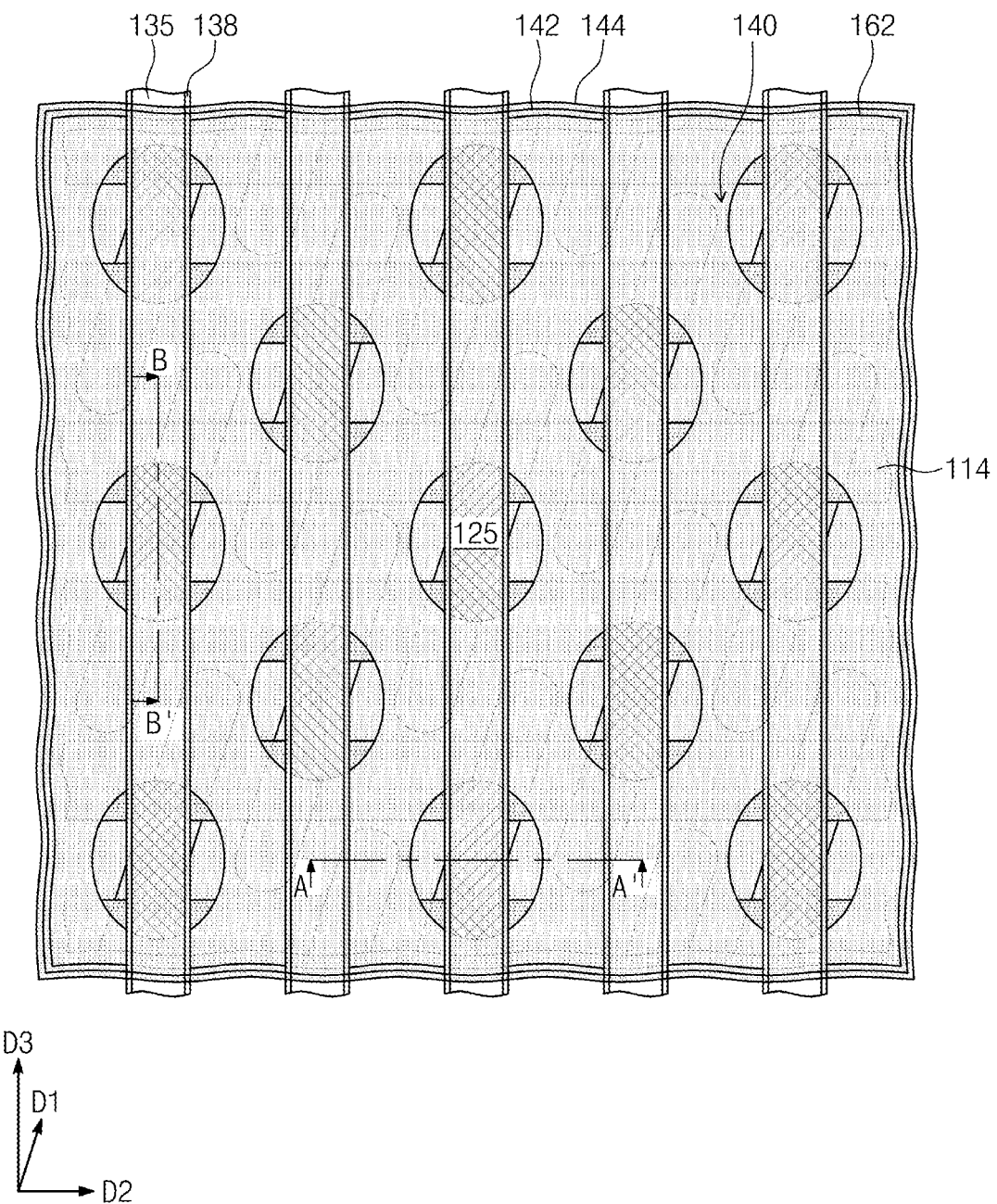
Figure 19B:
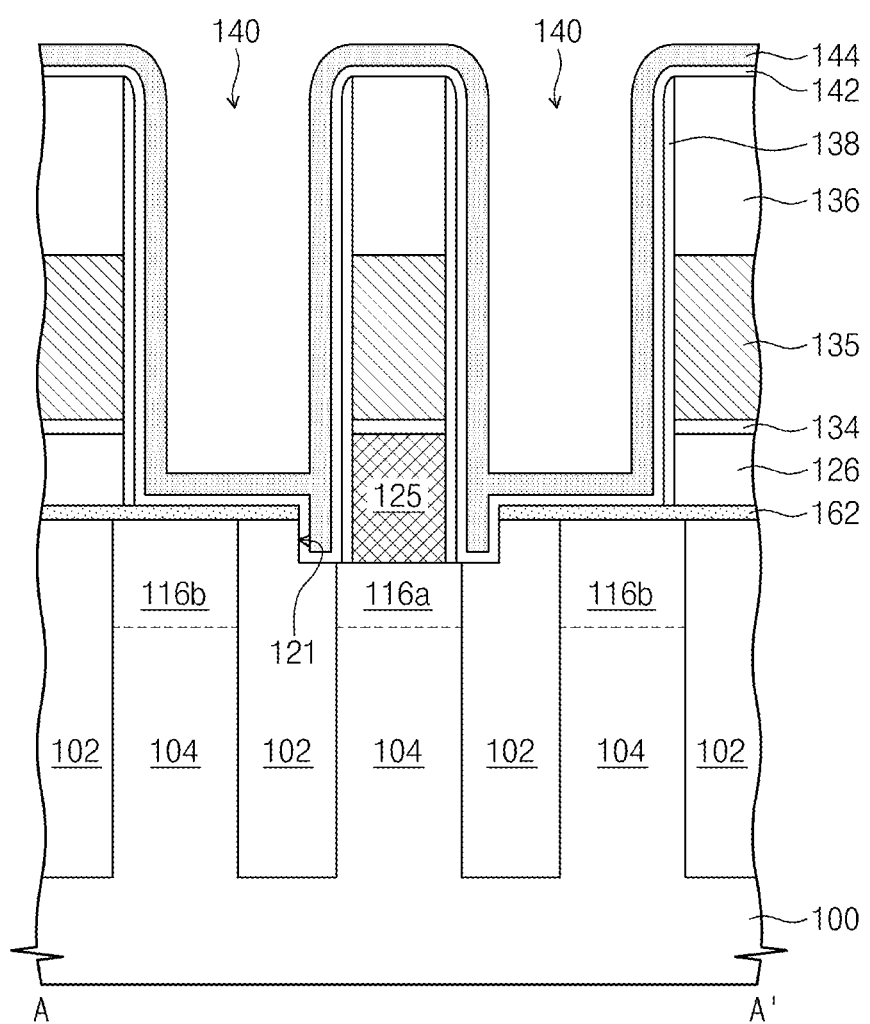
Figure 19C:
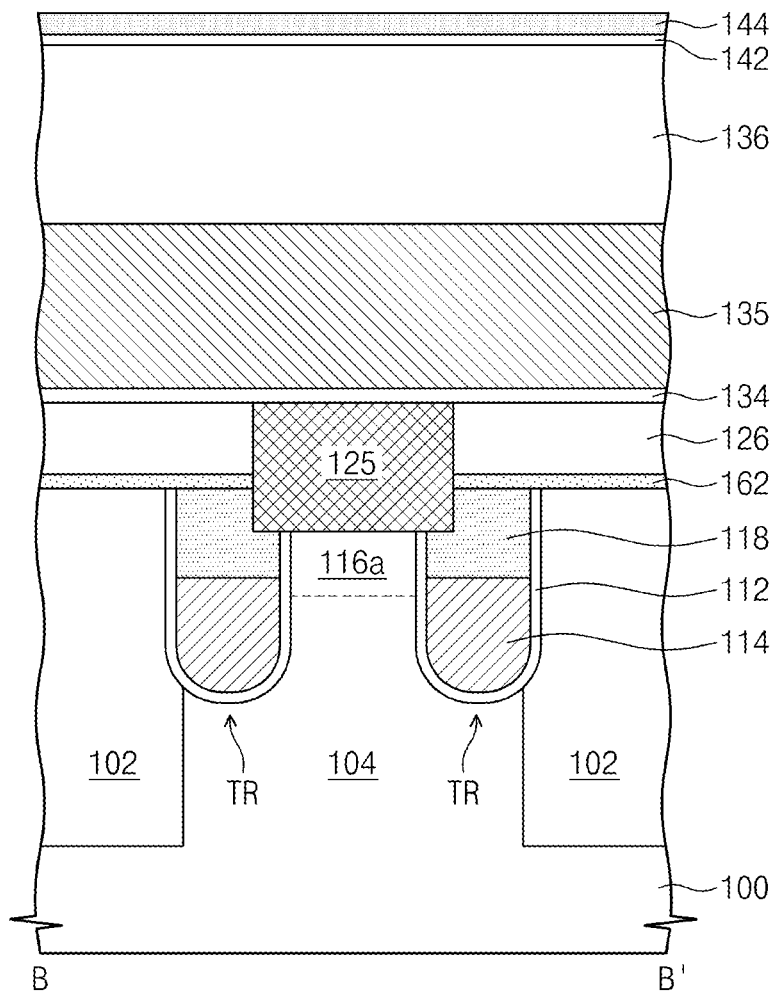

Referring to FIGS. 19A through 19C, the second spacer layer 142 and the nitride layer 144 may be formed to conformally cover the structure provided with the openings 140 and to sequentially fill the first recess 121. In example embodiments, the process described with reference to FIGS. 9A through 9C may be performed to form the second spacer layer 142 and the nitride layer 144, and thus, for the sake of brevity, the detailed description thereon will be omitted.

Figure 20A:
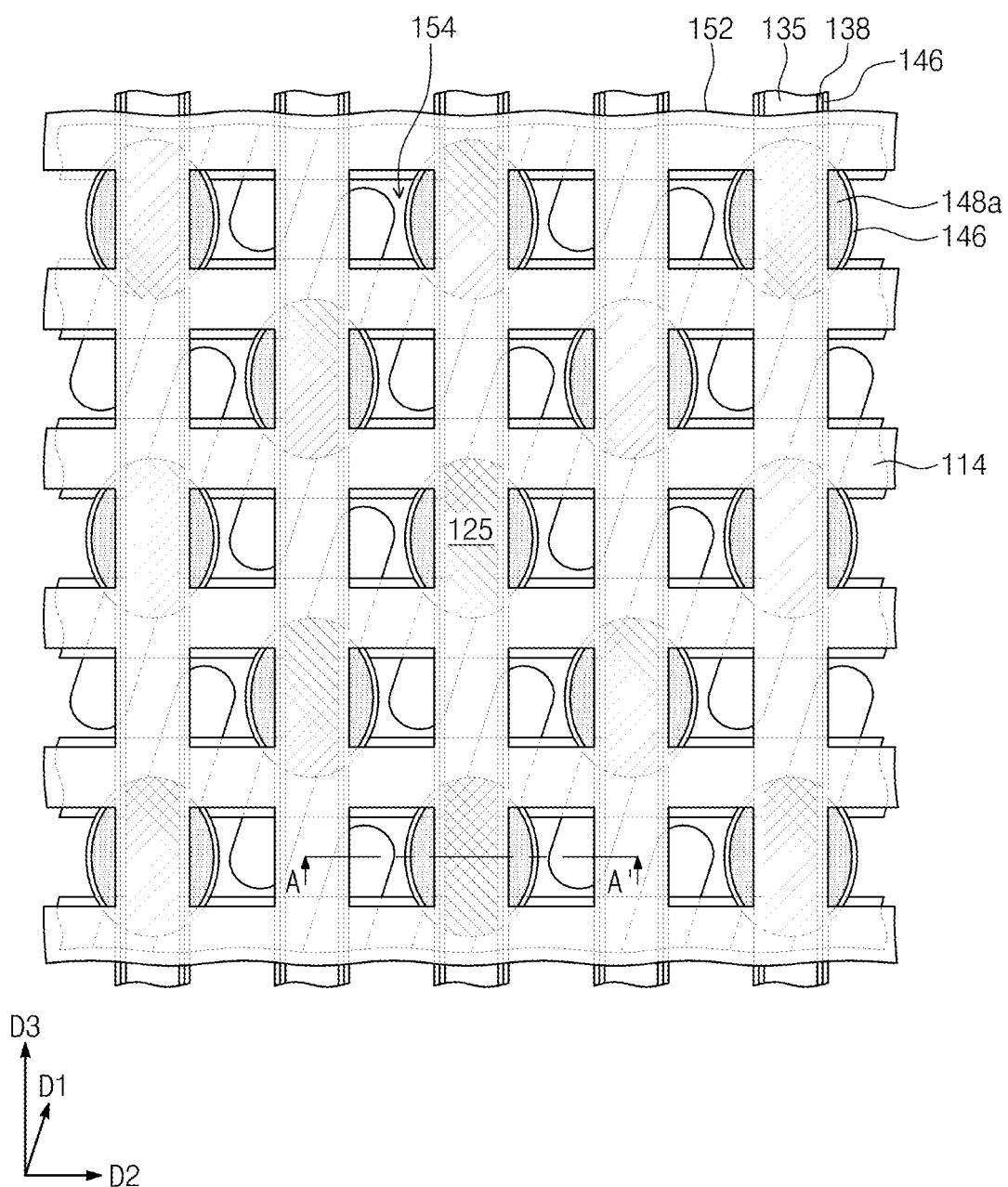
Figure 20B:
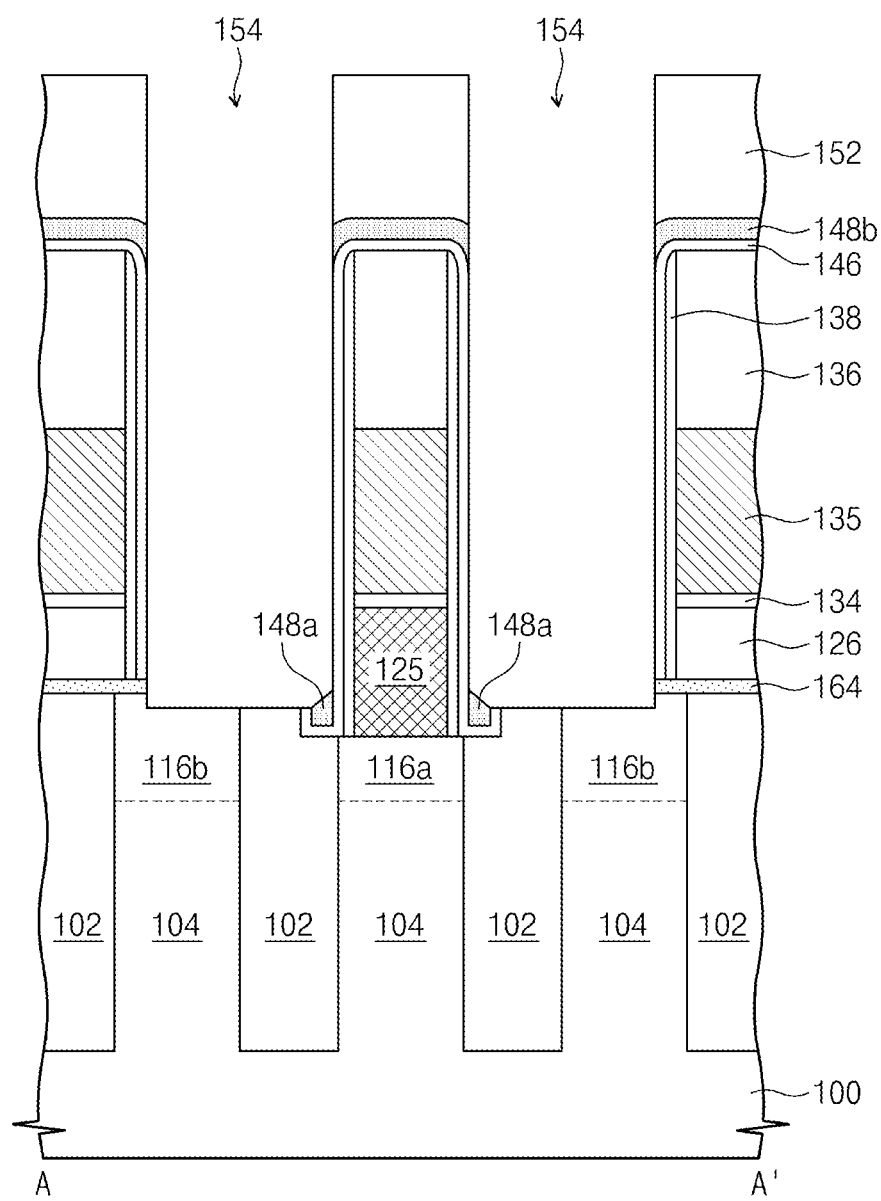

Referring to FIGS. 20A and 20B, the second interlayer insulating pattern 152 may be formed on the second mask 136, the second spacer 146 may be formed on the first spacer 138, the first nitride pattern 148a may be formed to fill the first recess 121, and the second nitride pattern 148b may be formed between the second mask 136 and the second interlayer insulating pattern 152. In addition, the second contact hole 154 may be formed to expose the second impurity region 116b.

The process described with reference to FIGS. 14A through 14C and 15A through 15C may be performed to form the second interlayer insulating pattern 152, the second spacer 146, the first and second nitride patterns 148a and 148b, and the second contact hole 154. However, the process of the present embodiments may be different from that of the previous embodiments, in that the formation of the second contact hole 154 may further include etching the preliminary etch stop pattern 162 to form the etch stop pattern 164. The etch stop pattern 164 may be formed between the substrate 100 and the first interlayer insulating pattern 126.

Referring back to FIGS. 3A through 3C, the second contact hole 154 may be filled with a conductive material to form the second contact 156. The second contact 156 may be electrically connected to the second impurity region 116b.

Figure 21A:
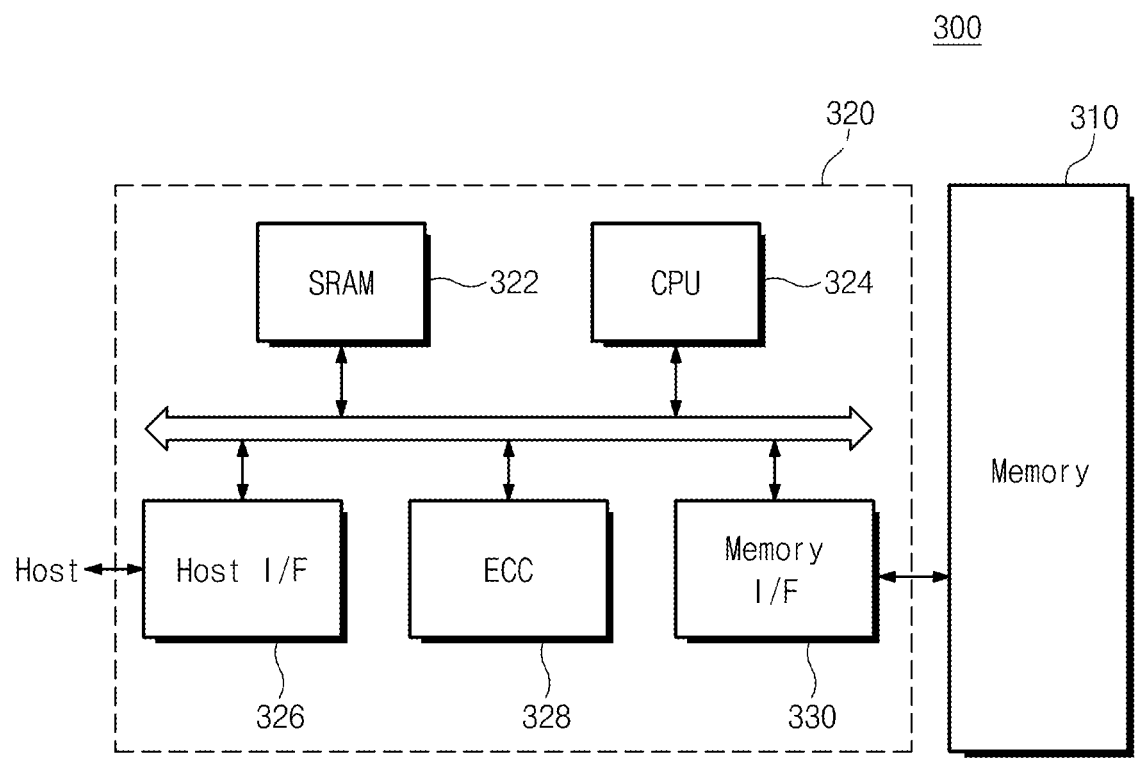
FIG. 21A is a block diagram illustrating a memory card including a semiconductor device according to an example embodiment of the inventive concepts.

FIG. 21A is a block diagram illustrating a memory card including a semiconductor device according to an example embodiment of the inventive concepts. Referring to FIG. 21A, a semiconductor device according to an example embodiment of the inventive concepts may be applied to form a memory card 300. The memory card 300 may include a memory controller 320 to control a data exchange between a host and a memory device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

The memory device 310 in the memory card 300 may be the semiconductor device according to an example embodiment of the inventive concepts. Accordingly, it is possible to reduce parasitic capacitance between conductive patterns and improve refresh characteristics of the semiconductor device.

Figure 21B:
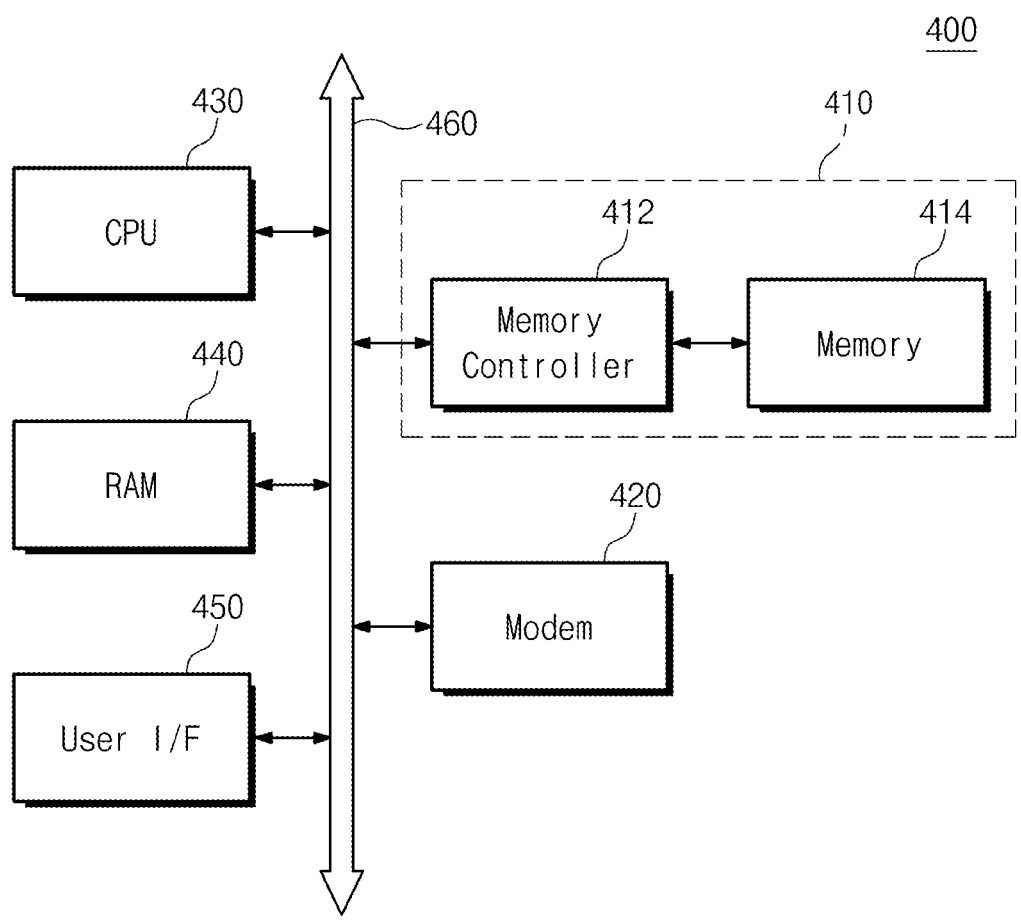
FIG. 21B is a block diagram illustrating an information processing system including a semiconductor device according to an example embodiment of the inventive concepts.

FIG. 21B is a block diagram illustrating an information processing system including a semiconductor device according to an example embodiment of the inventive concepts.

Referring to FIG. 21B, an information processing system 400 may include a semiconductor device according to an example embodiment of the inventive concepts. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 21A. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to example embodiments of the inventive concepts, a nitride pattern is provided to prevent or reduce an unintentional oxidation of a conductive material and reduce parasitic capacitance of a semiconductor device. In addition, the nitride pattern prevents or reduces unintentional etching of a conductive pattern or a substrate.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising: a substrate including an active pattern delimited by a device isolation pattern; a gate electrode crossing the active pattern; a first impurity region and a second impurity region in the active pattern on both sides of the gate electrode; a bit line crossing the gate electrode; a first contact electrically connecting the first impurity region with the bit line; a second contact electrically connecting the second impurity region; a plurality of spacers adjacent to a sidewall of the first contact; and a first nitride pattern disposed on a lower side surface of the first contact and spaced apart from the first contact by the plurality of spacers, wherein a portion of the first impurity region and a portion of the device isolation pattern adjacent thereto are recessed to define a recess region, the recess region having a bottom surface lower than a top surface of the substrate.

2. The device of claim 1, wherein the first contact includes a portion partially filling the recess region, and the first nitride pattern fills a remaining space of the recess region that is not occupied by the first contact.

3. The device of claim 1, further comprising:
at least one second contact electrically connected to the second impurity region,
wherein the at least one second contact is electrically isolated from the first contact and the first impurity region by the first nitride pattern.

4. The device of claim 3,
wherein the at least one second contact is a plurality of second contacts, and
the device further includes,
an interlayer insulating pattern on the bit line to electrically separate the plurality of second contacts from each other, and
a second nitride pattern on the bit line.

5. The device of claim 1, further comprising:
an etch stop pattern between the bit line and the substrate.

6. The device of claim 1, wherein the first impurity region includes a first recess having a first depth from an upper surface of the substrate, the second impurity region includes a second recess having a second depth from an upper surface of the substrate, and the first depth is greater than the second depth.

7. The device of claim 1, wherein a top surface of the active pattern has a portion below a bottom of the second contact, and one of the plurality of spacers extends to the portion of the active pattern.

8. The device of claim 7, wherein one of the plurality of spacers surrounds a bottom surface of the nitride pattern.

9. The device of claim 1, further comprising a mask on the bit line, and wherein the top surfaces of the plurality of spacers are the same level as a top surface of the mask.

10. The device of claim 1, further comprising a mask on the bit line, and
wherein the top surface of the first spacer is the same level as a top surface of the mask, and
the second spacer extends the top surface of the mask.

11. The device of claim 1, further comprising a metal barrier pattern provided between the first contact and the bit line.

12. A semiconductor device comprising: a substrate including an active pattern delimited by a device isolation pattern, a gate electrode crossing the active pattern; a first impurity region on one side of a gate electrode and a second impurity region on another side of the gate electrode; a bit line crossing the gate electrode; a first contact electrically connecting the first impurity region with the bit line; a first nitride pattern on a lower side surface of the first contact; at least one second contact electrically connected to the second impurity region, the at least one second contact being electrically isolated from the first contact and the first impurity region by the first nitride pattern; and a first spacer adjacent to a sidewall of the first contact, wherein the first contact is does not contact with the first nitride pattern by the first spacer.

13. The device of claim 12, wherein the at least one second contact is a plurality of second contacts, and
the device further includes,
an interlayer insulating pattern on the bit line to electrically separate the plurality of second contacts from each other; and
a second nitride pattern on the bit line.

14. The device of claim 12, further comprising:
a substrate including an active pattern delimited by a device isolation pattern,
wherein the gate electrode crosses the active pattern.

15. The device of claim 14, wherein the first impurity region includes a first recess having a first depth from an upper surface of the substrate, the second impurity region includes a second recess having a second depth from an upper surface of the substrate, and the first depth is greater than the second depth.

16. The device of claim 14, further comprising:
an etch stop pattern between the bit line and the substrate.

17. The device of claim 12, further comprising a metal barrier pattern provided between the first contact and the bit line.

18. A method of fabricating a semiconductor device, comprising: forming a gate electrode extending parallel to a first direction in a substrate, the substrate including an active pattern delimited by a device isolation pattern;
forming a first impurity region and a second impurity region in portions of the active pattern on both sides of the gate electrode;
forming a preliminary first contact on the gate electrode and the first and second impurity regions, the preliminary first contact being connected to the first impurity region; forming a conductive layer on the preliminary first contact;
forming a bit line and a first contact by etching the conductive layer and the preliminary first contact along a second direction;
forming a nitride pattern on a lower side surface of the first contact; electrically connecting a second contact to the second impurity region; and forming a plurality of spacers adjacent to a sidewall of the first contact,
wherein the first preliminary contact does not contact with the first nitride pattern by the plurality of spacers, and
wherein a portion of the first impurity region and a portion of the device isolation pattern adjacent thereto are recessed to define a recess region, the recess region having a bottom surface lower than a top surface of the substrate.

19. The method of claim 18, wherein the forming a preliminary first contact comprises:
forming a first interlayer insulating layer on the substrate with the first and second impurity regions;
etching the first interlayer insulating layer to form a first contact hole exposing portions of the first impurity region and the device isolation pattern adjacent thereto;
etching the exposed portions of the first impurity region and the device isolation pattern to form a recess connected to the first contact hole; and
filling the first contact hole with a conductive material.

20. The method of claim 19, wherein the forming a bit line and a first contact comprises:
forming a mask on the conductive layer;
etching the conductive layer using the mask to form the bit line; and
etching the preliminary first contact using the mask and the bit line to form the first contact.

21. The method of claim 20, wherein the forming a nitride pattern comprises:
forming a nitride layer on side surfaces of the first contact and the bit line to fill the recess; and
etching the nitride layer by a wet etching process to form a nitride pattern in the recess.

22. The method of claim 21, wherein the etching the nitride layer includes using an etching solution including at least one of a phosphoric acid, a sulfuric acid, a hydrofluoric acid, and dilute solutions thereof at a temperature of about 100° C. to about 250° C.

23. The method of claim 19, wherein the forming a nitride pattern comprises:
forming a nitride layer to fill the recess and conformally cover exposed surfaces of the first contact, the bit line, and the substrate;
forming a second interlayer insulating layer on the nitride layer;

etching the second interlayer insulating layer to form a second contact hole exposing the second impurity region; and etching the nitride layer on side surfaces of the first contact and the bit line to form the nitride pattern including portions localized on the bit line and in the recess.

24. The method of claim 23, wherein the forming a second interlayer insulating layer comprises:

forming a preliminary layer on the nitride layer, the preliminary layer containing silazane; and oxidizing the preliminary layer in a wet annealing process.

25. The method of claim 18, further comprising:

forming an etch stop layer on the substrate with the first and second impurity regions after the forming a first impurity region and a second impurity region.

26. The method of claim 19, further comprising:

forming a second interlayer insulating layer to cover the bit line;

etching the second interlayer insulating layer to form a second contact hole exposing the second impurity region; and filling the second contact hole with a conductive material to form the second contact.

* * * * *